United States Patent
Kim et al.

(10) Patent No.: US 9,799,402 B2
(45) Date of Patent: Oct. 24, 2017

(54) NONVOLATILE MEMORY DEVICE AND PROGRAM METHOD THEREOF

(71) Applicant: SAMSUNG ELECTRONICS CO., LTD., Suwon-si, Gyeonggi-do (KR)

(72) Inventors: Jinwoo Kim, Seoul (KR); Seong Yeon Kim, Hwaseong-si (KR); Jaegeun Park, Suwon-si (KR); Hyo-Deok Shin, Seoul (KR); Younggeun Lee, Seoul (KR); Youngjin Cho, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/083,834

(22) Filed: Mar. 29, 2016

(65) Prior Publication Data
US 2016/0358657 A1 Dec. 8, 2016

(30) Foreign Application Priority Data

Jun. 8, 2015 (KR) .................... 10-2015-0080638
Jun. 8, 2015 (KR) .................... 10-2015-0080641
Jul. 2, 2015 (KR) .................... 10-2015-0094804

(51) Int. Cl.
*G11C 16/10* (2006.01)
*G11C 7/10* (2006.01)

(52) U.S. Cl.
CPC ............ *G11C 16/10* (2013.01); *G11C 7/1063* (2013.01)

(58) Field of Classification Search
CPC .................................... G11C 16/10
USPC ........................................ 711/154
See application file for complete search history.

(56) References Cited

U.S. PATENT DOCUMENTS

| 5,787,039 | A  | * | 7/1998  | Chen ................ G11C 16/10 |
|           |    |   |         | 365/185.11 |
| 6,430,580 | B1 |   | 8/2002  | Azagury et al. |
| 6,977,845 | B2 |   | 12/2005 | Kawai et al. |
| 7,174,432 | B2 |   | 2/2007  | Howard et al. |
| 7,577,799 | B1 |   | 8/2009  | Howard et al. |
| 7,679,133 | B2 |   | 3/2010  | Son et al. |
| 7,840,752 | B2 |   | 11/2010 | Hu et al. |
| 8,433,844 | B2 |   | 4/2013  | Lin |
| 8,553,466 | B2 |   | 10/2013 | Han et al. |
| 8,559,235 | B2 |   | 10/2013 | Yoon et al. |
| 8,654,587 | B2 |   | 2/2014  | Yoon et al. |
| 8,812,933 | B2 |   | 8/2014  | Joo et al. |

(Continued)

FOREIGN PATENT DOCUMENTS

| KR | 10-0547062 B1 B1 | 1/2006 |
| KR | 10-0590388 B1 B1 | 6/2006 |

(Continued)

*Primary Examiner* — Min Huang
(74) *Attorney, Agent, or Firm* — Volentine & Whitt, PLLC

(57) ABSTRACT

A nonvolatile memory system includes first and second nonvolatile memory devices and a memory controller configured to control the first and second nonvolatile memory devices through one channel. During a program operation, the memory controller transmits first signals, for setting first page data up in the first nonvolatile memory device, to the first nonvolatile memory device through the channel. While the first nonvolatile memory device sets up the first page data in response to the first signals, the memory controller transmits second signals, for setting second page data up in the second nonvolatile memory device, to the second nonvolatile memory device.

15 Claims, 56 Drawing Sheets

(56) References Cited

U.S. PATENT DOCUMENTS

| | | |
|---|---|---|
| 8,874,831 B2 | 10/2014 | Lee et al. |
| 8,904,142 B2 | 12/2014 | Tanaka |
| 8,949,502 B2 | 2/2015 | McKnight et al. |
| 9,087,614 B2 | 7/2015 | Son et al. |
| 9,093,132 B2 | 7/2015 | Kim et al. |
| 2006/0143370 A1 | 6/2006 | Matsushita et al. |
| 2006/0181928 A1* | 8/2006 | Lee .................... G11C 16/0483 365/185.22 |
| 2006/0203548 A1 | 9/2006 | You |
| 2007/0288688 A1* | 12/2007 | Kang .................. G06F 12/0246 711/103 |
| 2009/0150751 A1* | 6/2009 | Jo ....................... G06F 11/1068 714/763 |
| 2011/0222342 A1* | 9/2011 | Yoon ........................ G11C 11/56 365/185.03 |
| 2011/0233648 A1 | 9/2011 | Seol et al. |
| 2013/0166825 A1* | 6/2013 | Kim .................... G06F 12/0246 711/103 |
| 2014/0095769 A1 | 4/2014 | Borkenhagen |
| 2014/0237157 A1 | 8/2014 | Takefman et al. |
| 2014/0237176 A1 | 8/2014 | Takefman et al. |
| 2014/0325134 A1 | 10/2014 | Carpenter et al. |
| 2015/0003175 A1 | 1/2015 | Ramanujan |
| 2015/0058525 A1 | 2/2015 | Venkata |
| 2015/0095008 A1 | 4/2015 | Wang et al. |
| 2015/0213895 A1* | 7/2015 | Kwak .................... G11C 16/10 711/103 |

FOREIGN PATENT DOCUMENTS

| | | |
|---|---|---|
| KR | 10-2013-0056004 A | 5/2013 |
| KR | 10-2013-0060701 A | 6/2013 |
| KR | 10-2013-0075135 A | 7/2013 |

\* cited by examiner

NONVOLATILE MEMORY DEVICE AND PROGRAM METHOD THEREOF

CROSS-REFERENCE TO RELATED APPLICATIONS

A claim for priority under 35 U.S.C. §119 is made to Korean Patent Applications No. 10-2015-0094804 filed Jul. 2, 2015, No. 10-2015-0080641 filed Jun. 8, 2015, and No. 10-2015-0080638 filed Jun. 8, 2015, in the Korean Intellectual Property Office, the entire contents of which are hereby incorporated by reference.

BACKGROUND

Embodiments of the disclosure described herein relate to a semiconductor memory, and more particularly, relate to a nonvolatile memory system and a program method thereof.

A semiconductor memory refers to a memory device that is implemented using a semiconductor such as silicon (Si), germanium (Ge), gallium arsenide (GaAs), indium phosphide (InP), or the like. A semiconductor memory device is roughly divided into a volatile memory device and a nonvolatile memory device.

As a kind of nonvolatile memory device, a flash memory is widely used as a mass storage medium by virtue of advantages such as large capacity, low noise, and the like. An operating speed of one flash memory is slow compared with any other storage medium, but the operating speed thereof becomes fast by using a plurality of flash memories in parallel. For example, a solid state drive (SSD) communicates with flash memory devices through one channel. Each of the flash memories is called a "WAY". The program or read performance of the SSD may be improved through a plurality of channels each of which is the same as the above-described channel. As an interface speed and a data processing speed of a processor increase, various techniques are being developed to improve the performance of the flash memory.

SUMMARY

Embodiments of the disclosure provide a nonvolatile memory system with improved performance and a program method thereof.

According to an embodiment of the disclosure, a nonvolatile memory system may include first and second nonvolatile memory devices, and a memory controller configured to control the first and second nonvolatile memory devices through one channel. During a program operation, the memory controller may transmit first signals, for setting first page data up in the first nonvolatile memory device, to the first nonvolatile memory device through the channel. While the first nonvolatile memory device sets up the first page data in response to the first signals, the memory controller may transmit second signals, for setting second page data up in the second nonvolatile memory device, to the second nonvolatile memory device.

The memory controller may transmit a first chip enable signal to the first nonvolatile memory device, a second chip enable signal to the second nonvolatile memory device, and data signals and control signals to the first and second nonvolatile memory devices. The first nonvolatile memory device may transmit a first ready/busy signal to the memory controller, and the second nonvolatile memory device may transmit a second ready/busy signal to the memory controller.

According to an embodiment of the disclosure, a program method of a nonvolatile memory system, which includes first and second nonvolatile memory devices and a memory controller controlling the first and second nonvolatile memory devices through a first channel, may be provided. The method may include setting first page data up in the first nonvolatile memory device, setting second page data up in the second nonvolatile memory device, setting third page data up in the first nonvolatile memory device, setting fourth page data up in the second nonvolatile memory device, setting fifth page data up in the first nonvolatile memory device, performing a program operation of the first nonvolatile memory device after the fifth page data is set up in the first nonvolatile memory device, setting sixth page data up in the second nonvolatile memory device, and performing a program operation of the second nonvolatile memory device after the sixth page data is set up in the second nonvolatile memory device.

According to an embodiment of the disclosure, a nonvolatile memory system may include first and second nonvolatile memory devices and a memory controller configured to control the first and second nonvolatile memory devices through one channel. The memory controller may activate a first chip enable signal to transmit signals to the first nonvolatile memory device and may activate a second chip enable signal to transmit signals to the second nonvolatile memory device. During a program operation, the memory controller may alternately set a plurality of page data up in the first and second nonvolatile memory devices.

According to an embodiment of the disclosure, a storage device may include nonvolatile memories and a device controller configured to receive write data, having a first stream identifier, from an external device and store the received write data in a stream buffer together with the first stream identifier. The device controller may be configured to program a first data group at the nonvolatile memories if a capacity of the first data group with the first stream identifier stored in the stream buffer reaches a threshold capacity. If a free capacity of the stream buffer is smaller than a size of the write data when the write data having the first stream identifier is received, the device controller may be configured to program second data group at the nonvolatile memories even though a capacity of the second data group with a second stream identifier stored in the stream buffer is smaller than the threshold capacity.

According to an embodiment of the disclosure, a storage device may include nonvolatile memories and a device controller including a stream buffer and configured to receive write data having a first stream identifier from an external device and store the received write data in the stream buffer together with the first stream identifier. The device controller may be configured to program a first data group at the nonvolatile memories if a capacity of the first data group with the first stream identifier stored in the stream buffer reaches a threshold capacity. If a free capacity of the stream buffer is smaller than a size of the write data when the write data having the first stream identifier is received, the device controller may be configured to combine two or more data groups corresponding to two or more stream identifiers stored in the stream buffer to program the combined result at the nonvolatile memories.

According to an embodiment of the disclosure, an operating method of a storage device, which includes nonvolatile memories and a device controller controlling the nonvolatile memories, may include receiving, by the device controller, write data having a first stream identifier from an external device, storing the write data in a stream buffer of the device controller if a free capacity of the stream buffer is greater than or equal to a capacity of the write data, combining, if a free capacity of the stream buffer is smaller than a capacity of the write data, two or more data groups corresponding to two or more stream identifiers stored in the stream buffer to program the combined result at the nonvolatile memories, and programming the data group at the nonvolatile memories if a capacity of a data group having the first stream identifier stored in the stream buffer reaches a threshold capacity.

According to an embodiment of the disclosure, a storage device may include nonvolatile memories and a device controller configured to store write data received from an external device in a stream buffer. If a free capacity of the stream buffer is smaller than a size of data to be read through a read operation when the read operation is performed with respect to a first nonvolatile memory selected from the nonvolatile memories, the device controller may be configured to perform a write operation with a second nonvolatile memory selected from the nonvolatile memories using data stored in the stream buffer and to perform the read operation. When the first nonvolatile memory and the second nonvolatile memory are equal to each other, the device controller may cancel the read operation, may perform the write operation, and may again perform the read operation.

According to an embodiment of the disclosure, a storage device may include nonvolatile memories and a device controller configured to store write data received from an external device in a stream buffer. If a free capacity of the stream buffer does not exist when a garbage collection, including a read operation and write data, is performed, the device controller may flush data stored in the stream buffer onto the nonvolatile memories. If in the nonvolatile memories, a target of the garbage collection is equal to a target of the flush, the device controller may cancel the garbage collection, may perform the flush, and may then perform the garbage collection.

According to an embodiment of the disclosure, a nonvolatile memory system includes first and second nonvolatile memory devices, the first nonvolatile memory device having a first memory cell array, a first control circuit, and a first page buffer and the second nonvolatile memory device having a second memory cell array, a second control circuit, and a second page buffer. A memory controller communicates through a communication channel: first page data, a first address where the first page data is to be stored, and a first program command to the first control circuit of the first nonvolatile memory device, and second page data, a second address where the second page data is to be stored, and a second program command to the second control circuit of the second nonvolatile memory device while the first control circuit of the first nonvolatile memory device stores the first page data in the first page buffer.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Below, embodiments of the disclosure will be described with reference to the accompanying drawings in order to describe the embodiments of the disclosure in detail to the extent that one skilled in the art can easily implement the scope and spirit of the disclosure.

A nonvolatile memory system according to the disclosure may include a memory controller and a plurality of nonvolatile memory devices. At a program operation, the memory controller may sequentially transmit page data to a plurality of nonvolatile memory devices which communicate with the memory controller through the same channel. Thus, a time delay of a time (e.g., a dummy busy time) needed for a nonvolatile memory device to dump page data may be shortened. This may mean that the performance of the nonvolatile memory system is improved.

Figure 1:
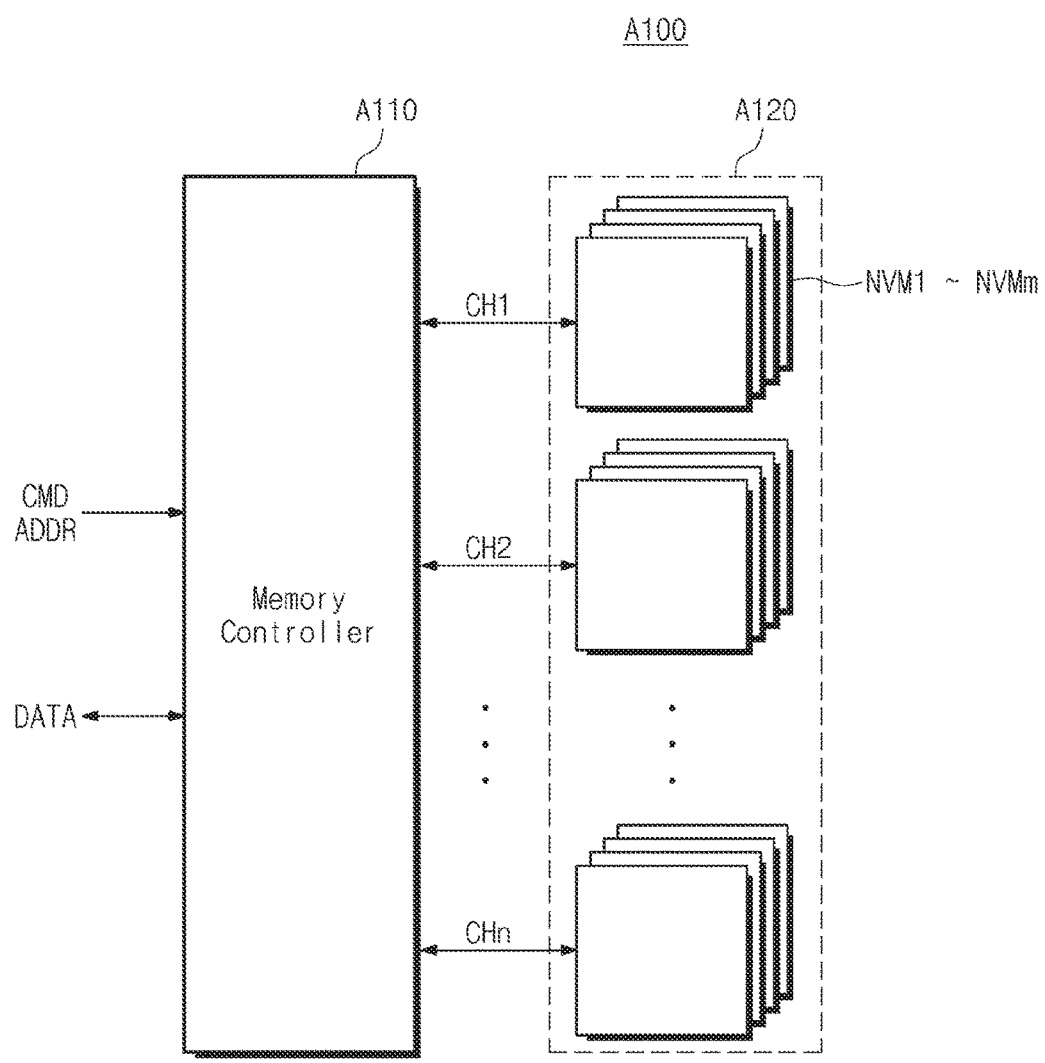
FIG. 1 is a block diagram schematically illustrating a nonvolatile memory system according to an embodiment of the disclosure.

FIG. 1 is a block diagram schematically illustrating a nonvolatile memory system according to an embodiment of the disclosure. A nonvolatile memory system A100 may include a memory controller A110 and a plurality of nonvolatile memory devices A120. The memory controller A110 may receive a command CMD and an address ADDR from an external device (e.g., a host, a processor, an application processor, or the like) and may control the nonvolatile memory devices A120, respectively. For example, the memory controller A110 may read or store data from or in the nonvolatile memory devices A120 in response to signals received from the external device.

In example embodiments, the memory controller A110 and the external device may communicate with each other based on a predetermined interface. The predetermined interface may include at least one of double data rate (DDR), DDR2, DDR3, DDR4, low power DDR (LPDDR), universal serial bus (USB), multimedia card (MMC), embedded MMC, peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), firewire, universal flash storage (UFS), nonvolatile memory express (NVMe), or the like.

Each of the nonvolatile memory devices A120 may communicate with the memory controller A110 through a plurality of channels CH1 to CHn. Each of the nonvolatile memory devices A120 may store or read data under control of the memory controller A110. For example, each of nonvolatile memory devices NVM1 to NVMm may communicate with the memory controller A110 through a first channel CH1. In this case, each of the nonvolatile memory devices NVM1 to NVMm may be implemented with a semiconductor chip or a die, and the nonvolatile memory devices NVM1 to NVMm may be included in one semiconductor package or may be included in corresponding semi packages, respectively. In example embodiments, each of the nonvolatile memory devices NVM1 to NVMm may be called a "way" and may operate in response to a plurality of chip enable signals received through the first channel CH1, respectively.

Each of the nonvolatile memory devices 120 may be implemented with nonvolatile memory elements such as electrically erasable and programmable ROM (EEPROM), NAND flash memory, NOR flash memory, phase-change RAM (PRAM), resistive RAM (ReRAM), ferroelectric RAM (FRAM), spin transfer torque magnetic RAM (STT-MRAM), and the like. For descriptive convenience, it may be assumed that each of the nonvolatile memory devices NVM1 to NVMm is a NAND flash memory. However, the scope and spirit of the disclosure may not be limited thereto.

Figure 2:
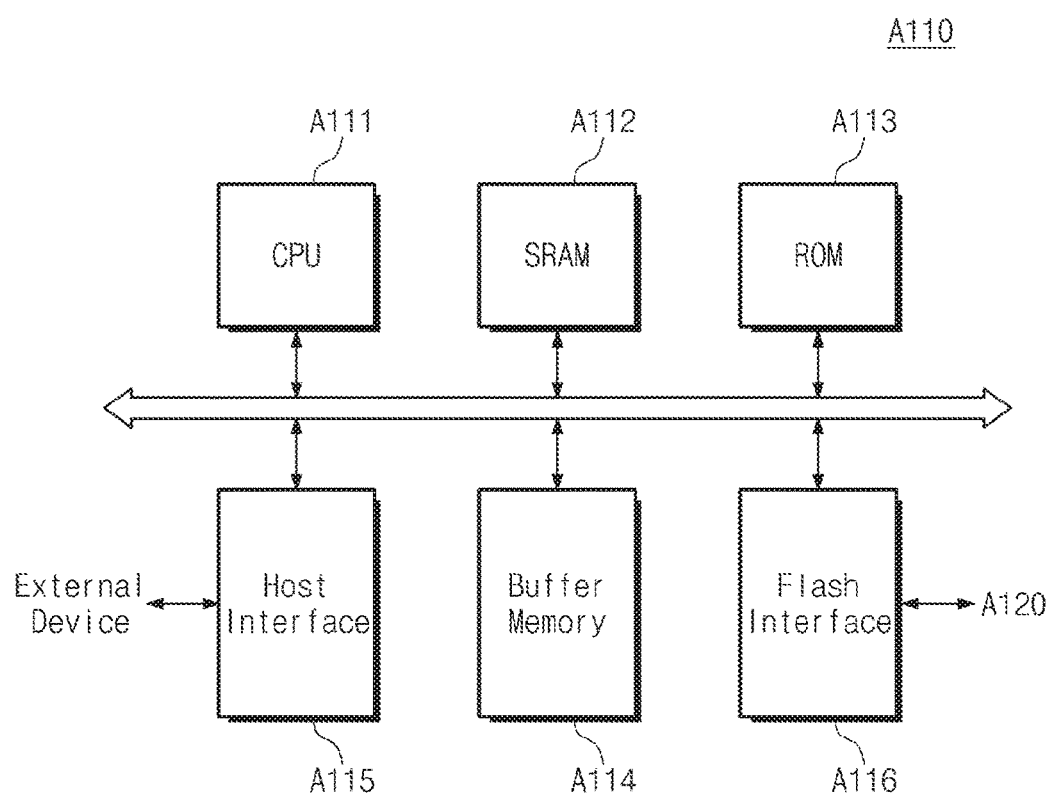
FIG. 2 is a block diagram illustrating a memory controller of FIG. 1.

FIG. 2 is a block diagram illustrating a memory controller of FIG. 1. Referring to FIGS. 1 and 2, the memory controller A110 may include a central processing unit (CPU) A111, a static RAM (SRAM) A112, a ROM A113, a buffer memory A114, a host interface A115, and a flash interface A116.

The CPU A111 may control an overall operation of the memory controller A110. The SRAM A112 may be used as a cache memory, a working memory, and the like of the memory controller A110. The ROM A113 may store a variety of information, required for the memory controller A110 to operate, in the form of firmware. In example embodiments, information or firmware stored in the SRAM A112 or the ROM A113 may be driven or managed by the CPU A111.

The buffer memory A114 may temporarily store data received from the external device or may temporarily store data read from the nonvolatile memory devices A120. Data stored in the buffer memory A114 may be managed by a page unit under control of the CPU A111. In example embodiments, the page unit may be a read or write unit of the nonvolatile memory devices A120.

The memory controller A110 may communicate with the external device through the host interface A115. In example embodiments, the host interface A115 may include a physical layer needed for the external device to communicate with the nonvolatile memory system A100. The memory controller A110 may communicate with the nonvolatile memory devices A120 through the flash interface A116.

Figure 3:
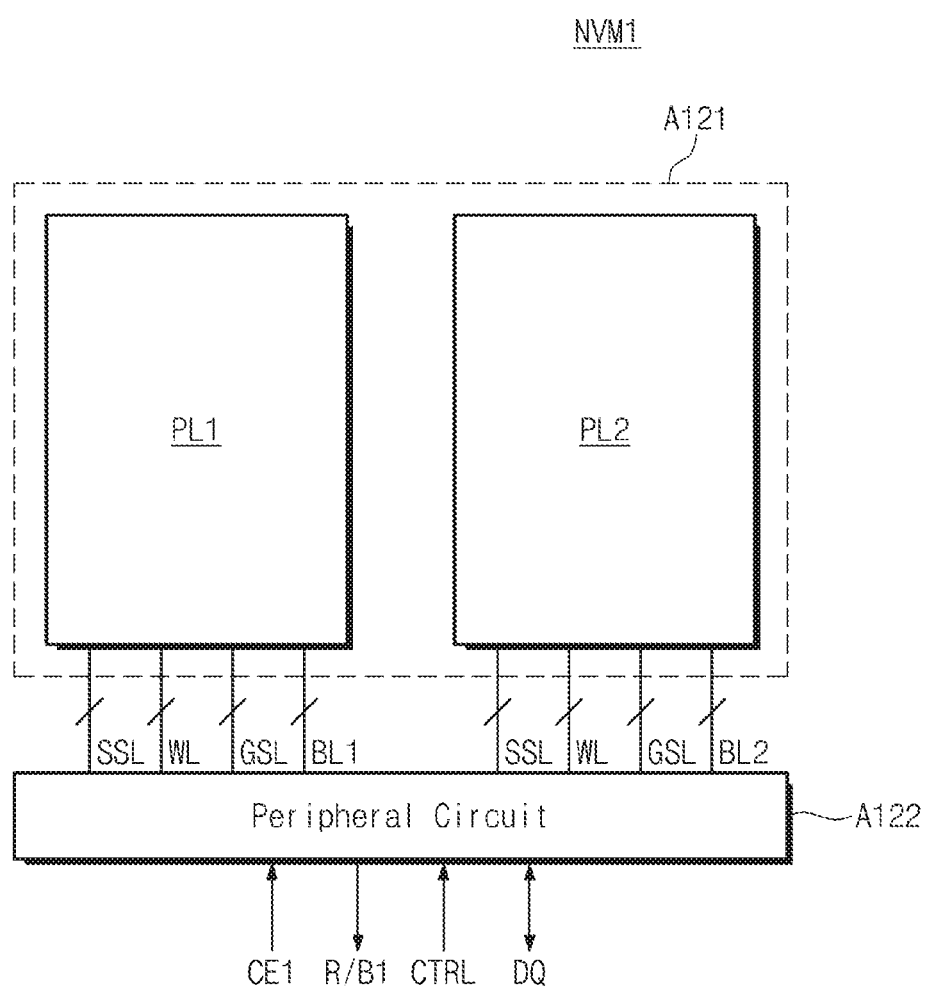
FIG. 3 is a block diagram schematically illustrating a first nonvolatile memory device of a plurality of nonvolatile memory devices of FIG. 1.
Figure 4:
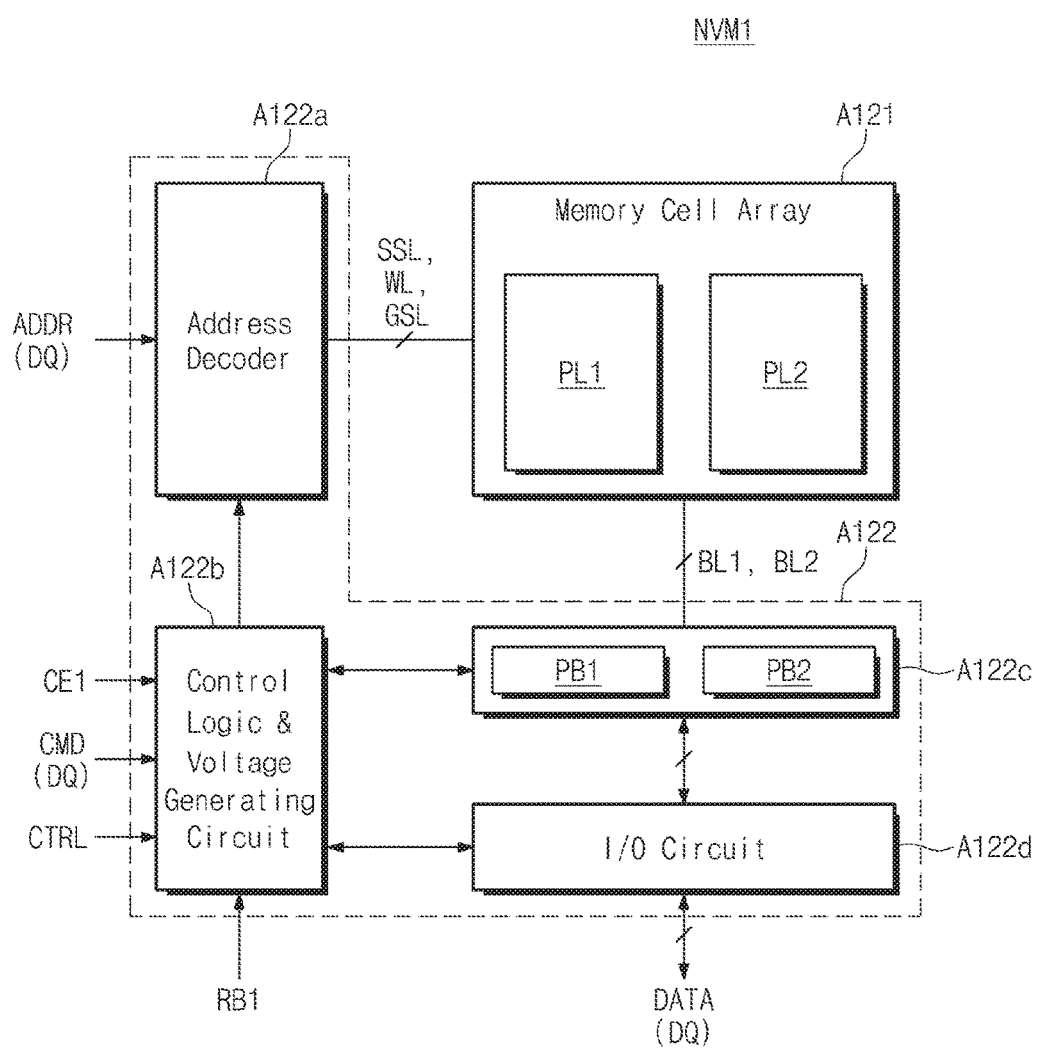
FIG. 4 is a block diagram illustrating, in detail, a first nonvolatile memory device of FIG. 3.

FIG. 3 is a block diagram schematically illustrating a first nonvolatile memory device of a plurality of nonvolatile memory devices of FIG. 1. FIG. 4 is a block diagram illustrating, in detail, a first nonvolatile memory device of FIG. 3. Referring to FIGS. 1 and 3, a first nonvolatile memory device NVM1 may include a memory cell array A121 and a peripheral circuit A122.

The memory cell array A121 may be connected with the peripheral circuit A122 through word lines WL, string selection lines SSL, ground selection lines GSL, and bit lines BL1 and BL2. The memory cell array A121 may include first and second planes PL1 and PL2. Each of the first and second planes PL1 and PL2 may include a plurality of memory blocks. Each of the memory blocks may include a plurality of memory cells, which are connected with the word lines WL. Each memory cell may be a single level cell (SLC) storing one bit or a multi-level cell (MLC) storing at least two bits.

In example embodiments, memory blocks included in the first plane PL1 may share a plurality of first bit lines BL1. Memory blocks included in the second plane PL2 may share a plurality of first bit lines BL2 different from the first bit lines BL1. That is, the first plane PL1 and the second plane PL2 may be separated by bit lines.

The peripheral circuit A122 may receive a first chip enable signal CE1, a control signal CTRL, and a data signal DQ from the memory controller A110. In response to the received signals, the peripheral circuit A122 may program data, received through the data signal DQ, at the memory cell array A121 or may read data programmed at the memory cell array A121, and the peripheral circuit A122 may transmit the read data to the memory controller A110 through the data signal DQ. In example embodiments, the peripheral circuit A122 may activate a first ready/busy signal R/B1 while the first nonvolatile memory device NVM1 operates. In example embodiments, when the first ready/busy signal R/B1 is activated, the memory controller A110 may not transmit a command or data to the first nonvolatile memory device NVM1 separately.

In example embodiments, the control signal CTRL may include control signals such as a command latch enable signal (CLE), an address latch enable signal (ALE), a write enable signal (WEB), a read enable signal (REB), a data strobe signal (DQS), and the like. Information included in the data signal DQ may be determined to be a command, an address, or data, based on the control signal CTRL.

Referring to FIGS. 1, 3, and 4, the first nonvolatile memory device NVM1 may include the memory cell array A121 and the peripheral circuit A122. The peripheral circuit A122 may include an address decoder A122a, a control logic and voltage generator circuit A122b, a page buffer A122c, and an input/output circuit A122d.

Since the memory cell array A121 is described with reference to FIG. 3, a detailed description thereof is thus omitted.

The address decoder A122a may receive and decode an address ADDR from the memory controller A110. The address decoder A122a may select at least one of the word lines WL based on the decoded address ADDR and may drive the at least one word line thus selected.

The control logic and voltage generator circuit A122b may control the address decoder A122a, the page buffer circuit A122c, and the input/output circuit A122d in response to a first chip enable signal CE1, a command CMD, and a control signal CTRL from the memory controller A110. For example, the control logic and voltage generator circuit A122b may control the address decoder A122a, the page buffer circuit A122c, and the input/output circuit A122d in response to signals from the memory controller A110 such that data from the memory controller A110 is written at the memory controller A121. Alternatively, the control logic and voltage generator circuit A122b may control the address decoder A122a, the page buffer circuit A122c, and the input/output circuit A122d in response to signals from the memory controller A110 such that data stored in the memory cell array A121 is transferred to the memory controller A110.

The control logic and voltage generator circuit A122b may generate various voltages required for the first nonvolatile memory device NVM1 to operate. For example, the control logic and voltage generator circuit A122b may generate a plurality of program voltages, a plurality of pass voltages, a plurality of verification voltages, a plurality of selection read voltages, a plurality of non-selection read voltages, a plurality of erase voltages, and the like. In example embodiments, the voltages generated by the control logic and voltage generator circuit A122b may be provided to the word lines WL. In example embodiments, a voltage to be supplied to each word line WL may be variable according to the size of each of memory cells included in the memory cell array A121 or a physical characteristic thereof.

The page buffer circuit A122c may be connected to the memory cell array A121 through the bit lines BL1 and BL2. The page buffer circuit A122c may receive data from the input/output circuit A122d and may control the bit lines BL1 and BL2 such that the received data is programmed at the memory cell array A121. Alternatively, the page buffer circuit A122c may control the bit lines BL1 and BL2 such that data stored in the memory cell array A121 is read out.

In example embodiments, the page buffer circuit A122c may include a first page buffer PB1 connected with the first plane PL1 through the first bit lines BL1 and a second page buffer PB2 connected with the second plane PL2 through the second bit lines BL2.

The first page buffer PB1 may receive and temporarily store data to be written in the first plane PL1 from the input/output circuit A122d or may read data written in the first plane PL1 to temporarily store the read data. The second page buffer PB2 may receive and temporarily store data to be written in the second plane PL2 from the input/output circuit A122d or may read data written in the second plane PL2 to temporarily store the read data.

The input/output circuit A122d may receive data from the page buffer circuit A122c and may transmit the received data to the memory controller A110 in synchronization with the control signal CTRL. Alternatively, the input/output circuit A122d may receive data from the memory controller A110 and may transmit the received data to the page buffer circuit A122c. In example embodiments, the input/output circuit A122d may transmit data to the first page buffer PB1 or the second page buffer PB2 under control of the control logic and voltage generator circuit A122b. In example embodiments, the data may be transmitted or received to or from the memory controller A110 through the data signal DQ.

In example embodiments, the command CMD, the address ADDR, and data may be received from the memory controller A110 through the data signal DQ, and the control logic and voltage generator circuit A122b may identify the command CMD, the address ADDR, and data, which are received through the data signal DQ, based on the control signal CTRL. The identified signals may be transferred to the address decoder A122a, the control logic and voltage generator circuit A122b, or the page buffer circuit A122c under control of the control logic and voltage generator circuit A122b.

In example embodiments of the disclosure, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In example embodiments of the disclosure, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure as the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 5:
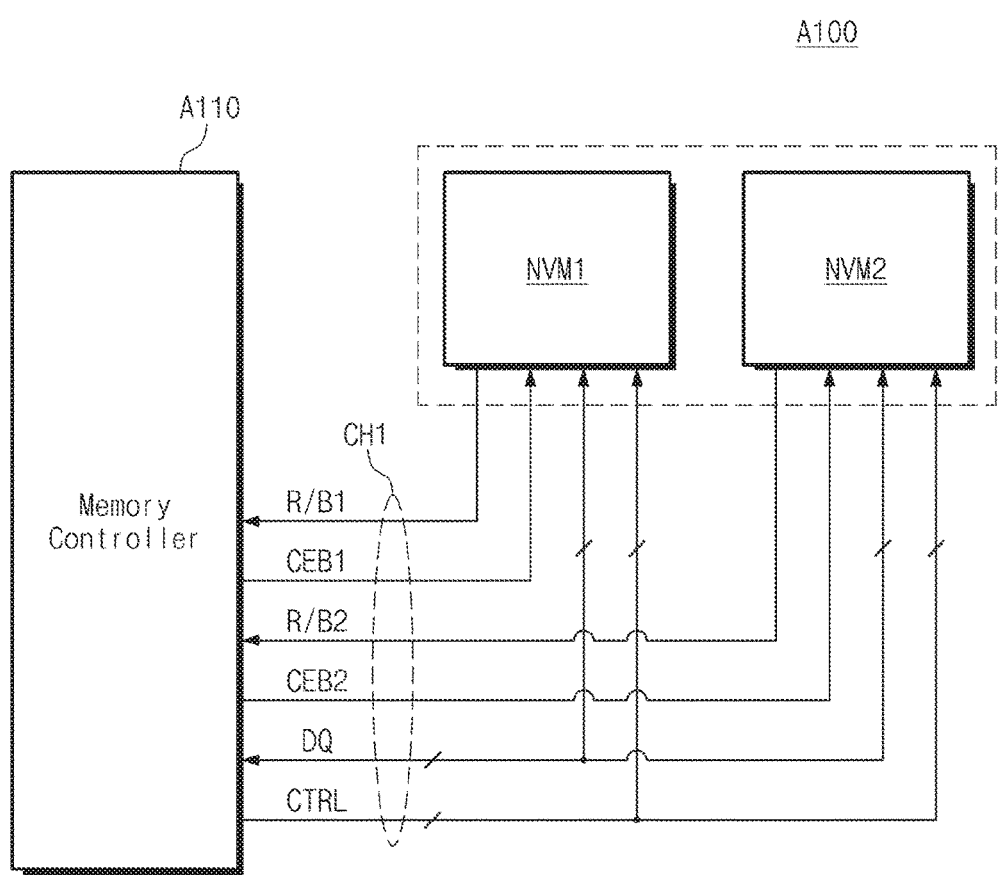
FIG. 5 is a block diagram for describing a nonvolatile memory system of FIG. 1 in detail.

FIG. 5 is a block diagram for describing a nonvolatile memory system of FIG. 1 in detail. For ease of illustration and for descriptive convenience, first and second nonvolatile memory devices NVM1 and NVM2 connected through the first channel CH1 are illustrated in FIG. 5, and other components are omitted. However, the scope and spirit of the disclosure may not be limited thereto.

A nonvolatile memory system A100 may include a memory controller A110 and a plurality of nonvolatile memory devices NVM1 and NVM2. The memory controller A110 may communicate with the nonvolatile memory devices NVM1 and NVM2 through the first interface CH1.

For example, the memory controller A110 and each of the first and second nonvolatile memory devices NVM1 and NVM2 may transact first and second ready/busy signals R/B1 and R/B2, first and second chip enable signals CEB1 and CEB2, a data signal DQ, and a control signal CTRL with each other through the first channel CH1.

In detail, the memory controller A110 may transmit the control signal CTRL to the first and second nonvolatile memory devices NVM1 and NVM2. The memory controller A110 may transact the data signal DQ with the nonvolatile memory devices NVM1 and NMV2. The memory controller A110 may transmit the first chip enable signal CEB1 to the first nonvolatile memory devices NVM1. The memory controller A110 may transmit the second chip enable signal CEB2 to the second nonvolatile memory devices NVM2. The first nonvolatile memory device NVM1 may transmit the first ready/busy signal R/B1 to the memory controller A110. The second nonvolatile memory device NVM2 may transmit the second ready/busy signal R/B2 to the memory controller A110. As described above, the memory controller A110 may exchange various signals with the nonvolatile memory devices NVM1 and NVM2 through the first interface CH1.

In example embodiments, the memory controller A110 may provide the data signal DQ and the control signal CTRL to each of the first and second nonvolatile memory devices NVM1 and NVM2 using each of the first and second chip enable signals CEB1 and CEB2, respectively. For example, the memory controller A110 may provide a command, an address, and data to the first nonvolatile memory device NVM1 or the second nonvolatile memory device NVM2 using the data signal DQ and the control signal CTRL. When the first chip enable signal CEB1 is activated by the memory controller A110, the data signal DQ and the control signal CTRL may be provided to the first nonvolatile memory device NVM1, and the first nonvolatile memory device NVM1 may operate in response to the received data signal DQ and control signal CTRL.

Likewise, when the second chip enable signal CEB2 is activated by the memory controller A110, the data signal DQ and the control signal CTRL may be provided to the second nonvolatile memory device NVM2, and the second nonvolatile memory device NVM2 may operate in response to the received data signal DQ and control signal CTRL. In other words, the memory controller A110 may select the first nonvolatile memory device NVM1 or the second nonvolatile memory device NVM2 using the first and second chip enable signals CEB1 and CEB2.

In example embodiments, the first nonvolatile memory device NVM1 may activate the first ready/busy signal R/B1 while operating under control of the memory controller A110. When the first ready/busy signal R/B1 is activated, the memory controller A110 may recognize the first nonvolatile memory device NVM1 as operating. The second nonvolatile memory device NVM2 may activate the second ready/busy signal R/B2 while operating under control of the memory controller A110. When the second ready/busy signal R/B2 is activated, the memory controller A110 may recognize the second nonvolatile memory device NVM2 as operating.

When the first ready/busy signal R/B1 has a busy state (i.e., an active state), the memory controller A110 may not transmit the data signal DQ and the control signal CTRL to the first nonvolatile memory device NVM1. Likewise, when the second ready/busy signal R/B2 has a busy state (i.e., an active state), the memory controller A110 may not transmit the data signal DQ and the control signal CTRL to the second nonvolatile memory device NVM2.

Figure 6:
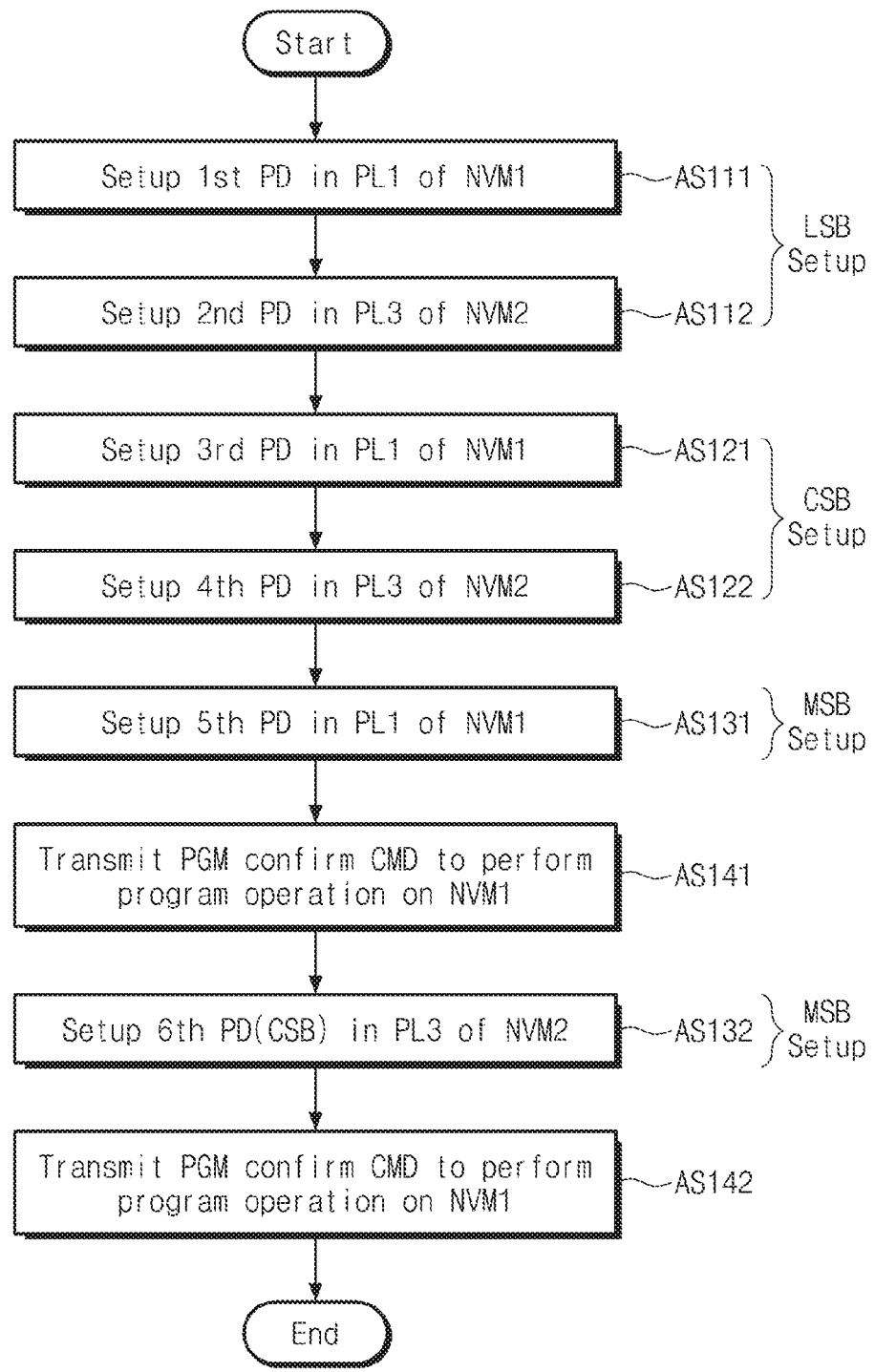
FIG. 6 is a flow chart illustrating a program operation of a memory system illustrated in FIG. 4.
Figure 7:
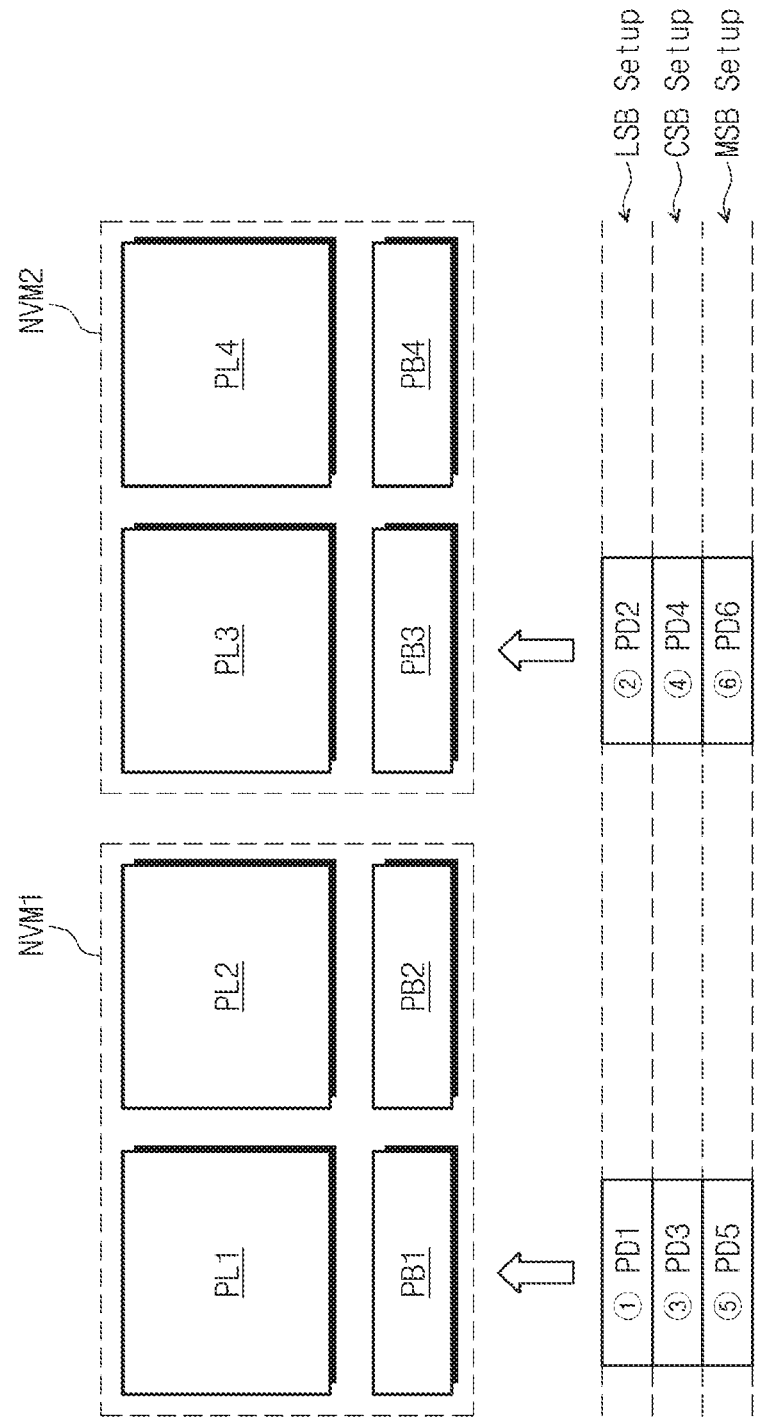
FIG. 7 is a diagram for describing a program operation illustrated in FIG. 6.

FIG. 6 is a flow chart illustrating a program operation of the nonvolatile memory system of FIG. 2. FIG. 7 is a diagram for describing a program operation of FIG. 6. For descriptive convenience, below, a program operation will be described with reference to the first and second nonvolatile memory devices NVM1 and NVM2 which communicate with the memory controller A110 through the first channel CH1. Furthermore, it may be assumed that the first nonvolatile memory device NVM1 includes first and second planes PL1 and PL2, the second nonvolatile memory device NVM2 includes third and fourth planes PL3 and PL4, and each of memory cells included in each of the first and second nonvolatile memory devices NVM1 and NVM2 is a triple level cell.

For descriptive convenience, an operation in which page data is dumped or loaded onto a specific page buffer connected with a specific plane may be called a "page data setup". That is, "that page data is set up in a specific plane" may mean that page data is dumped or loaded onto a specific page buffer corresponding to a specific plane. However, the scope and spirit of the disclosure may not be limited thereto. For example, a specific page buffer may include a cache latch and a data latch. In this case, the cache latch may temporarily store data received from the memory controller A110, and the data in the cache latch may be dumped onto the data latch when a dump command is received from the memory controller A110. In this case, the page data setup may indicate that data is temporarily stored in the cache latch or data in the cache latch is dumped onto the data latch.

For descriptive convenience, it may be assumed that the first and second nonvolatile memory devices NVM1 and NVM2 perform a program operation based on a TLC program manner. However, the scope and spirit of the disclosure may not be limited thereto. For example, the first and second nonvolatile memory devices NVM1 and NVM2 may perform a program operation based on various program manners such as a one-shot program manner, a shadow program manner, a reprogram manner, and the like.

Referring to FIGS. 5 to 7, in step AS111, the memory controller A110 may set first page data PD1 up in the first plane PL1 of the first nonvolatile memory device NVM1 (①of FIG. 7). For example, to allow the first page data PD1 to be set up in the first plane PL1 of the first nonvolatile memory device NVM1, the memory controller A110 may activate the first chip enable signal CEB1 and may transmit the data signal DQ and the control signal CTRL to the first nonvolatile memory device NVM1. The first nonvolatile memory device NVM1 may dump the first page data PD1 onto the first page buffer PB1 in response to received signals.

In step AS112, the memory controller A110 may set second page data PD2 up in the third plane PL3 of the second memory device NVM1 (② of FIG. 7). For example, to allow the second page data PD2 to be set up in the third plane PL3 of the second nonvolatile memory device NVM2, the memory controller A110 may activate the second chip enable signal CEB2 and may transmit the data signal DQ and the control signal CTRL to the second nonvolatile memory device NVM2. The second nonvolatile memory device NVM2 may dump the second page data PD2 onto the third page buffer PB3 in response to received signals.

In example embodiments, in step AS112, the first ready/busy signal R/B1 may remain at a busy state during a time (i.e., a dummy busy time) while the first nonvolatile memory device NVM1 dumps the first page data PD1 onto the first page buffer PB1. In this case, after the dummy busy time elapses, the memory controller A110 may transmit signals for setting remaining page data up to the first nonvolatile memory device NVM1.

A conventional memory controller may transmit signals for setting first page data up to a first nonvolatile memory device, and after the dummy busy time elapses, the conventional memory controller may transmit signals for setting remaining page data up to the first nonvolatile memory device. That is, the first nonvolatile memory device may dump first page data during the dummy busy time, and the memory controller may not perform another operation during the dummy busy time. In this case, the dummy busy time may lead to a time delay at the page data setup.

However, according to the disclosure, while the first nonvolatile memory device NVM1 dumps the first page data PD1, (i.e., during dummy busy time) the memory controller A110 may transmit signals, for setting the second page data PD2 up in the third plane PL3 of the second nonvolatile memory device NVM2, to the second nonvolatile memory device NVM2. That is, in the case where two pieces of page data are set up according to the disclosure, a time delay due to the dummy busy time may decrease. In other words, while an operation of step AS112 is performed, the first nonvolatile memory device NVM1 may dump the first page data PD1 onto the first page buffer PB1.

In step AS121, the memory controller A110 may set third page data PD3 up in the first plane PL1 of the first memory device NVM1 (③ of FIG. 7). In other words, while an operation of step AS121 is performed, the second nonvolatile memory device NVM2 may dump the second page data PD2 onto the third page buffer PB3.

In step AS122, the memory controller A110 may set fourth page data PD4 up in the third plane PL3 of the second memory device NVM2 (④ of FIG. 7). Likewise, while an operation of step AS122 is performed, the first nonvolatile memory device NVM1 may dump the third page data PD3 onto the first page buffer PB1.

In step AS131, the memory controller A110 may set fifth page data PD5 up in the first plane PL1 of the first memory device NVM1 (⑤ of FIG. 7). In example embodiments, when the fifth page data PD5 is set up in the first plane PL1, three pieces of page data (i.e., first, third, and fifth page data) may be previously set up in the first page buffer PB1 corresponding to the first plane PL1. This may mean that page data needed for a program operation is set up in the first plane PL1 of the first nonvolatile memory device NVM1.

In step AS141, the memory controller A110 may transmit a program confirm command to the first nonvolatile memory device NVM1 such that the first nonvolatile memory device NVM1 performs a program operation. In example embodiments, the first nonvolatile memory device NVM1 may program the program thus set up at the first plane PL1 in response to the program confirm command.

In step AS132, the memory controller A110 may set sixth page data PD6 up in the second plane PL2 of the second memory device NVM2 (⑥ of FIG. 7). An operation of step AS132 may be performed while the first nonvolatile memory device NVM1 performs the program operation.

When the sixth page data PD6 is set up in the third plane PL3, three pieces of page data (i.e., second, fourth, and sixth page data) may be previously set up in the third page buffer PB3 corresponding to the third plane PL3. In step AS142, the memory controller A110 may transmit a program confirm command to the second nonvolatile memory device NVM2 such that the second nonvolatile memory device NVM2 performs a program operation. The second nonvolatile memory device NVM2 may perform the program operation in response to the program confirm command.

In example embodiments, each of operations of steps AS111 and AS112 may be an operation of setting least significant bit (LSB) page data of each of the first and third planes PL1 and PL3 up, each of operations of steps AS121 and AS122 may be an operation of setting central significant bit (CSB) page data of each of the first and third planes PL1 and PL3 up, and each of operations of steps AS131 and AS132 may be an operation of setting most significant bit (MSB) page data of each of the first and third planes PL1 and PL3 up.

As described above, the memory controller A110 according to the disclosure may alternately set page data up in the first and second nonvolatile memory devices NVM1 and NVM2 communicating therewith through the first channel CH1 at a program operation. This may mean that the performance of the nonvolatile memory system is improved.

Figure 8:
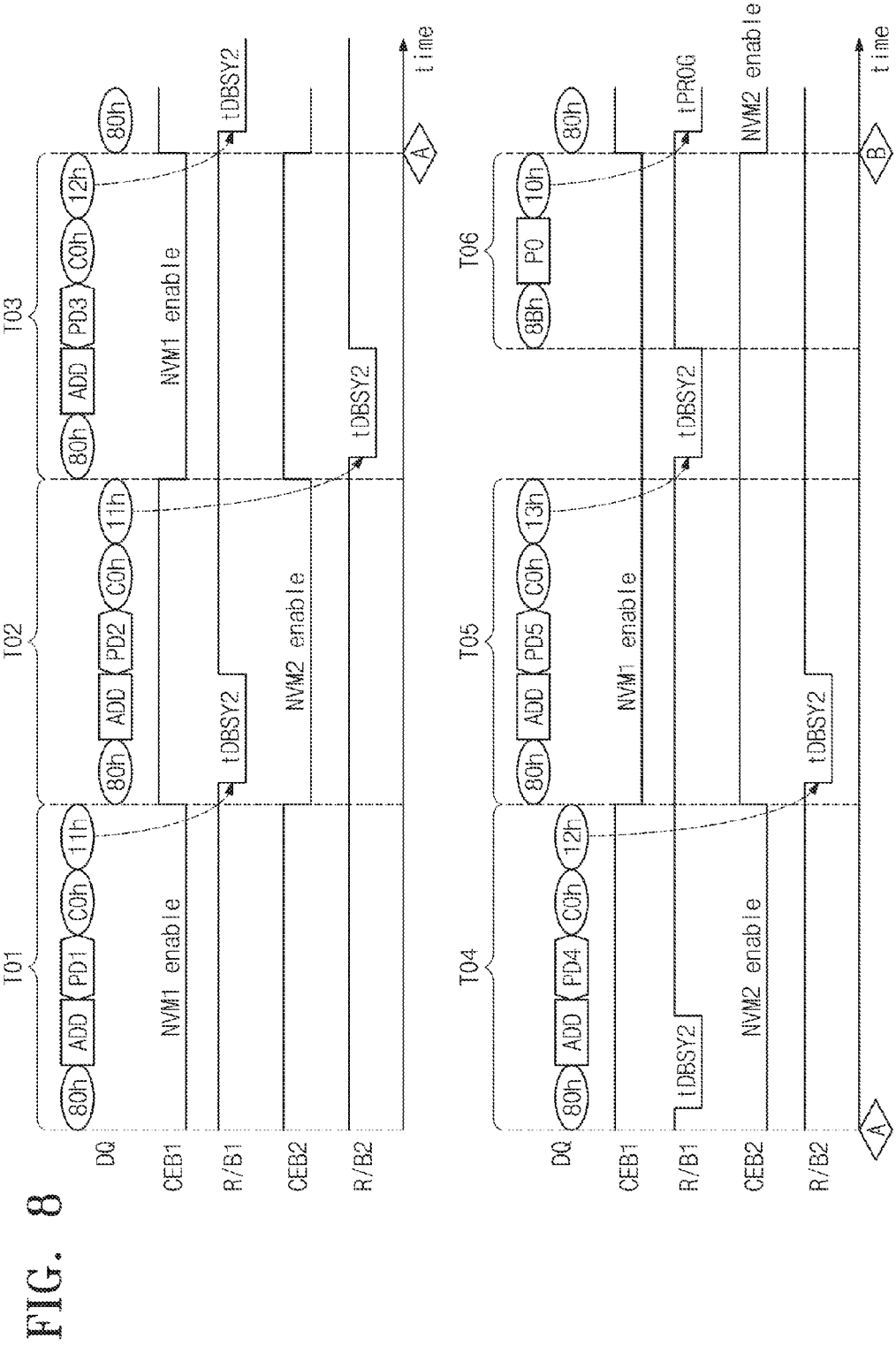
FIGS. 8 and 9 are timing diagrams illustrating a program operation of FIG. 6 in more detail.
Figure 9:
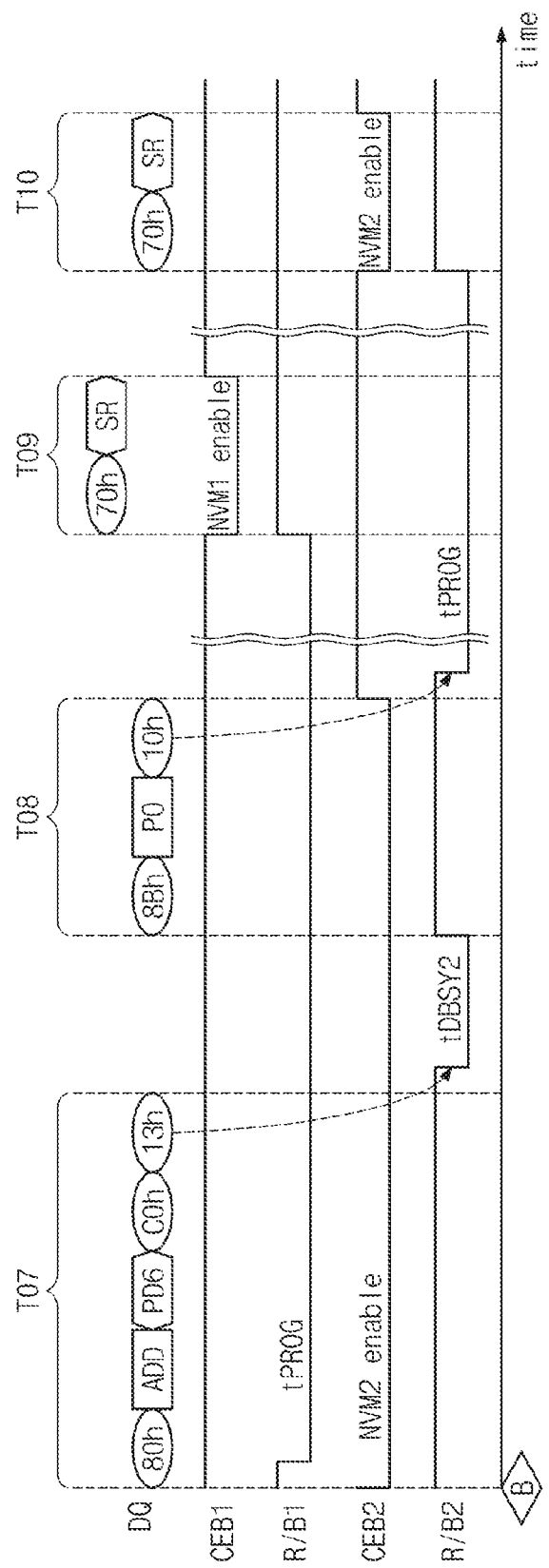

FIGS. 8 and 9 are timing diagrams illustrating a program operation of FIG. 6 in more detail. For descriptive convenience, as described above, it may be assumed that the first nonvolatile memory device NVM1 includes the first and second planes PL1 and PL2 and the second nonvolatile memory device NVM2 includes the third and fourth planes PL3 and PL4.

Furthermore, it may be assumed that the first and second nonvolatile memory devices NVM1 and NVM2 include triple level cells each storing three bits and perform triple-level cell (TLC) programming under control of the memory controller A110. However, the scope and spirit of the disclosure may not be limited thereto. For example, the first and second nonvolatile memory devices NVM1 and NVM2 may perform a program operation based on various program manners such as a shadow program manner, a reprogram manner, and the like.

Furthermore, it may be assumed that the first and second chip enable signals CEB1 and CEB2 and the first and second ready/busy signals R/B1 and R/B2 are low-level active signals. That is, the first and second nonvolatile memory devices NVM1 and NVM2 may operate in response to the first and second chip enable signals CEB1 and CEB2 each having a low level, and a low level of each of the first and second ready/busy signals R/B1 and R/B2 may indicate a busy state of each of the first and second nonvolatile memory devices NVM1 and NVM2.

Furthermore, the memory controller A110 may transmit a command, an address, and page data to the first and second nonvolatile memory devices NVM1 and NVM2 through the data signal DQ, and the command, the address, and the page data may be identified or discriminated by various control signals CTRL.

Reference numerals of the command, the address, and the page data illustrated in drawings may be an example, but are not limited thereto. Thus, the scope and spirit of the disclosure may not be limited thereto. In addition, the command, the address, and the page data illustrated in drawings are marked by the same reference numerals, but it may be understood that they have different meanings according to each operating section and a target device (e.g., first and second nonvolatile memory devices NVM1 and NVM2).

For ease of illustration, components not needed to describe a technical feature of the disclosure, for example, an address data loading time tADL, a write enable signal busy time tWB, and the like are omitted from the timing diagrams. Furthermore, addresses in respective sections may indicate physical locations at which page data to be set up in the respective sections is stored and may be different from each other.

Below, for descriptive convenience, it may be assumed that each of the first and second nonvolatile memory devices NVM1 and NVM2 dumps received page data PD onto each of corresponding page buffer circuits in response to a dump command C0h and dump appointment commands 11h, 12h, and 13h. However, the scope and spirit of the disclosure may not be limited thereto.

Furthermore, for descriptive convenience, it may be assumed that the memory controller A110 transmits a command, an address, and page data to each of the first and second nonvolatile memory devices NVM1 and NVM2 based on a page program manner. However, the scope and spirit of the disclosure may not be limited thereto.

Referring to FIGS. 6 to 9, in a first section T01, the memory controller A110 may sequentially transmit a first command 80h, an address ADD, first page data PD1, a second command C0h, and a third command 11h to the first nonvolatile memory device NVM1. For example, the memory controller A110 may activate the first chip enable signal CEB1 and may transmit the first command 80h, the address ADD, the first page data PD1, the second command C0h, and the third command 11h to the first nonvolatile memory device NVM1 through the data signal DQ.

In example embodiments, the first command 80h may be a program start command, the address ADD may be an address indicating a physical location at which the first page data PD1 is to be stored, the second command C0h may be a dump command, and the third command 11h may be a dump appointment command. In example embodiments, the third command 11h may be a page buffer address indicating an LSB page of the first page buffer PB1 corresponding to the first plane PL1. During a dummy busy time tDBSY2, the first nonvolatile memory device NVM1 may dump the first page data PD1 onto the first page buffer PB1 corresponding to the first plane PL1 in response to the second and third commands C0h and 11h.

In a second section T02, the memory controller A110 may sequentially transmit the first command 80h, the address ADD, second page data PD2, the second command C0h, and the third command 11h to the second nonvolatile memory device NVM2. For example, the memory controller A110 may activate the second chip enable signal CEB2 and may transmit the first command 80h, the address ADD, the first page data PD1, the second command C0h, and the third command 11h to the second nonvolatile memory device NVM2 through the data signal DQ. In example embodiments, the address ADD of the second section T02 may be a page buffer address indicating an LSB page of the third page buffer PB3 corresponding to the third plane PL3.

In example embodiments, as illustrated in FIG. 8, the second section T02 may include a section of a dummy busy time tDBSY2 when the first ready/busy signal R/B1 remains at a busy state. That is, the first nonvolatile memory device NVM1 may dump the first page data PD1 onto the first page buffer PB1 while the memory controller A110 sequentially transmits the first command 80h, the address ADD, the second page data PD2, the second command C0h, and the third command 11h to the second nonvolatile memory device NVM2. In other words, even though the first ready/busy signal R/B1 remains at a busy state, the memory controller A110 may transmit to the second nonvolatile memory device NVM2 signals for setting the second page data PD2 up in the second nonvolatile memory device NVM2. That is, since a time delay due to the dummy busy time tDBSY2 is reduced, a page data setup time may be shortened.

In a third section T03, the memory controller A110 may activate the first chip enable signal CEB1 and may sequentially transmit the first command 80h, the address ADD, third page data PD3, the second command C0h, and a fourth command 12h to the first nonvolatile memory device NVM1 through the data signal DQ. As described above, the third section T03 may include a section corresponding to the dummy busy time tDBSY2 when the second nonvolatile memory device NVM2 dumps the second page data PD2 onto the third page buffer PB3. The second ready/busy signal R/B2 may remain at a busy state during the dummy busy time tDBY2. That is, the second nonvolatile memory device NVM2 may dump the second page data PD2 onto the third page buffer PB3 while the memory controller A110 sequentially transmits the first command 80h, the address ADD, the third page data PD3, the second command C0h, and the fourth command 12h to the first nonvolatile memory device NVM1. In example embodiments, the address ADD of the third section T03 may be a page buffer address indicating a CSB page of the first page buffer PB1.

In a fourth section T04, the memory controller A110 may activate the second chip enable signal CEB2 and may sequentially transmit the first command 80h, the address ADD, fourth page data PD4, the second command C0h, and the fourth command 12h to the second nonvolatile memory device NVM2 through the data signal DQ. As described above, the fourth section T04 may include a section corresponding to the dummy busy time tDBSY2 when the first nonvolatile memory device NVM1 dumps the third page data PD3 onto the first page buffer PB1. In example embodiments, a fourth command 12h of the fourth section T04 may be a page buffer address indicating a CSB page of the first page buffer PB3.

In a fifth section T05, the memory controller A110 may activate the first chip enable signal CEB1 and may sequentially transmit the first command 80h, the address ADD, fifth page data PD5, the second command C0h, and a fifth command 13h to the first nonvolatile memory device NVM1 through the data signal DQ. As described above, the fifth section T05 may include a section corresponding to the dummy busy time tDBSY2 when the second nonvolatile memory device NVM2 dumps the fourth page data PD4 onto the third page buffer PB3. In example embodiments, a fifth command 13h of the fifth section T05 may be a page buffer address indicating an MSB page of the first page buffer PB1 corresponding to the third plane PL1.

Before a sixth section T06, the first nonvolatile memory device NVM1 may dump the fifth page data PD5 onto the first page buffer PB1 during the dummy busy time tDBSY2. In the sixth section T06, the memory controller A110 may transmit a sixth command 8Bh, a program order address PO, and a seventh command 10h to the first nonvolatile memory device NVM1. In example embodiments, the first chip enable signal CEB1 may remain at an active state from T05 to T06. In example embodiments, the sixth command 8Bh and the seventh command 10h may compose a TLC program command set. The program order address PO may indicate a program order of page data thus set up.

The first nonvolatile memory device NVM1 may perform a program operation of the page data PD1, PD3, and PD5 in response to signals received in the sixth section T06. For example, the first nonvolatile memory device NVM1 may perform the program operation during a program time tPROG. At this time, the first ready/busy signal R/B1 may remain at a busy state during the program time tPROG.

During the program operation of the first nonvolatile memory device NVM1, in a seventh section T07, the memory controller A110 may activate the second chip enable signal CEB2 and may sequentially transmit the first command 80h, the address ADD, sixth page data PD6, the second command C0h, and the fifth command 13h to the second nonvolatile memory device NVM2 through the data signal DQ. After the seventh section T07, the second nonvolatile memory device NVM2 may dump the sixth page data PD6 onto the third page buffer PB3 during the dummy busy time tDBSY2.

In the eighth section T08, the memory controller A110 may transmit the sixth command 8Bh, the program order address PO, and the seventh command 10h to the second nonvolatile memory device NVM2. In example embodiments, the second chip enable signal CEB2 may remain at an active state from T07 to T08. In example embodiments, the sixth command 8Bh and the seventh command 10h may compose the TLC program command set. The program order address PO may indicate a program order of page data thus set up.

The second nonvolatile memory device NVM2 may perform a program operation of the page data thus set up, in response to signals received in the eighth section T08.

In ninth section T09, after the program operation of the first nonvolatile memory device NVM1 is completed (i.e., after the first ready/busy signal R/B1 is changed from a busy state to a ready state after T06), the memory controller A110 may activate the first chip enable signal CEB1 to transmit an eighth command 70h to the first nonvolatile memory device NVM1. The first nonvolatile memory device NVM1 may transmit status information SR to the memory controller A110 through the data signal DQ in response to the eighth command 70h. In example embodiments, the eighth command 70h may be a status register read command, and the status information SR may be information about whether or not an indication of a program pass is stored in a status register.

In tenth section T10, after the program operation of the second nonvolatile memory device NVM2 is completed (i.e., after the second ready/busy signal R/B2 is changed from a busy state to a ready state after T08), the memory controller A110 may activate the second chip enable signal CEB2 to transmit the eighth command 70h to the second nonvolatile memory device NVM2. The second nonvolatile memory device NVM2 may transmit status information SR to the memory controller A110 through the data signal DQ in response to the eighth command 70h. In example embodiments, the eighth command 70h may be a status register read command, and the status information SR may be information about whether or not an indication of a program pass is stored in a status register.

As described above, the memory controller A110 according to the disclosure may alternately set page data up in the first and second nonvolatile memory devices NVM1 and NVM2 communicating therewith through the first channel CH1, thereby reducing a time delay due to the dummy busy time. That is, since the page data setup time is shortened, the performance of the nonvolatile memory system may be improved.

Figure 10:
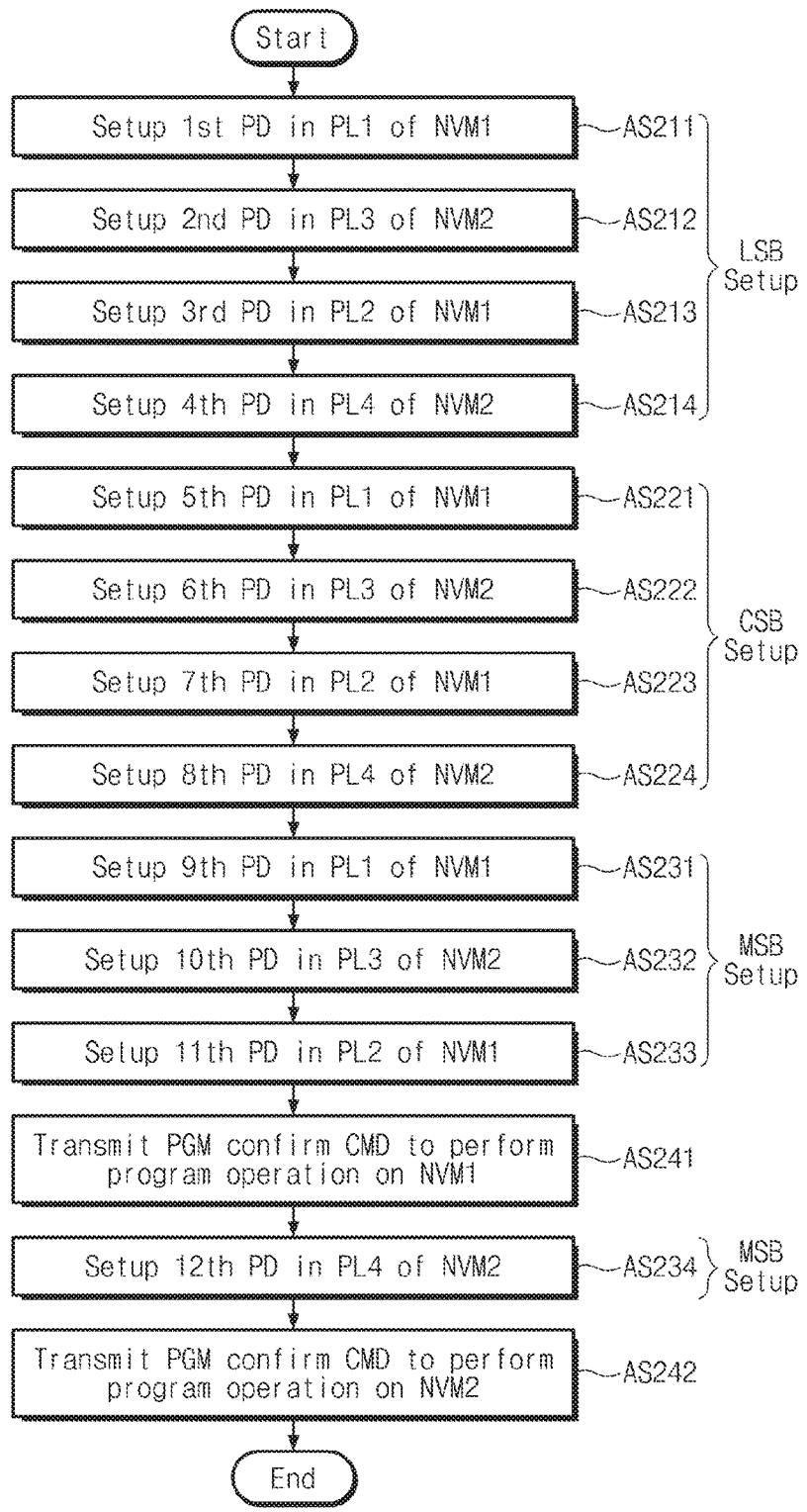
FIG. 10 is a flow chart illustrating another program operation of the nonvolatile memory system of FIG. 5.
Figure 11:
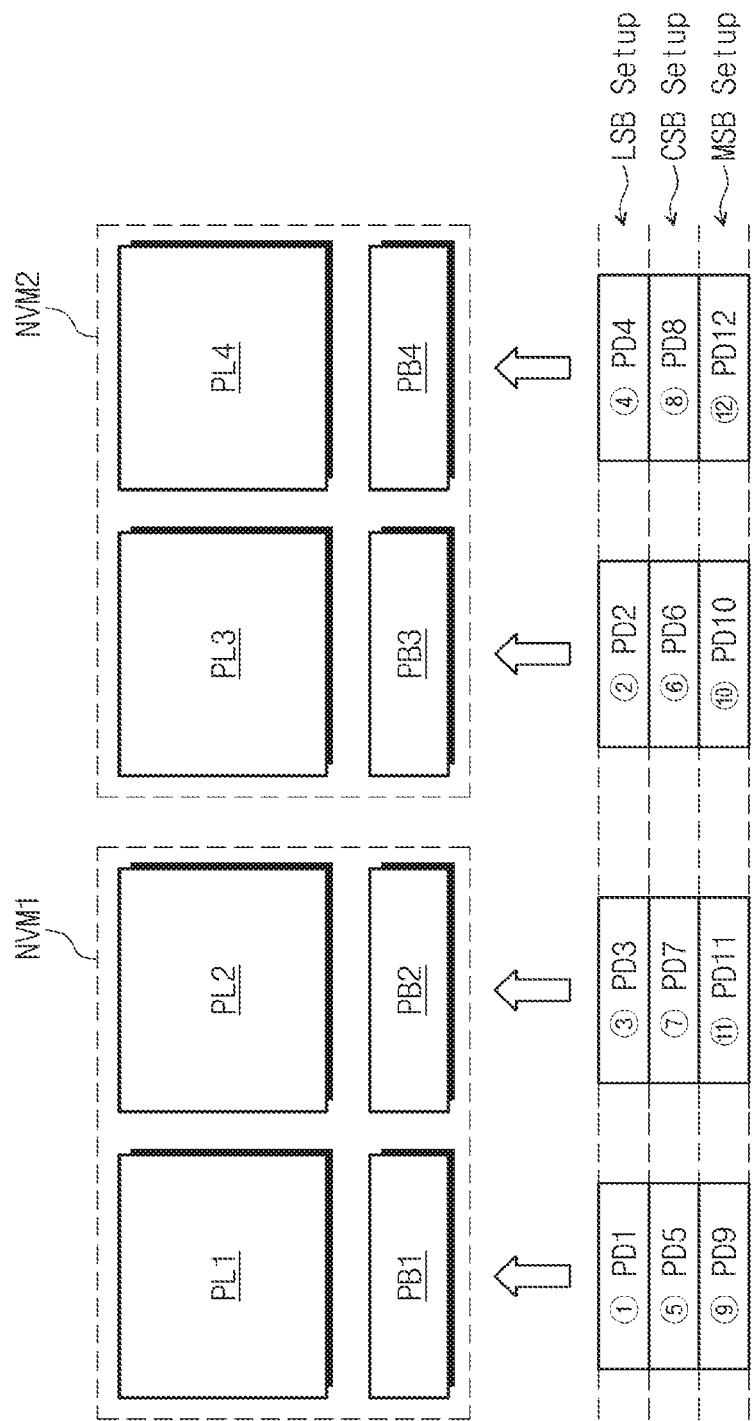
FIG. 11 is a diagram for describing a program operation of FIG. 10.

FIG. 10 is a flow chart illustrating a program operation of the nonvolatile memory system of FIG. 5. FIG. 11 is a diagram for describing a program operation of FIG. 10. A program manner where page data is set up in one plane of each of the first and second nonvolatile memory devices NVM1 and NVM2 is described with reference to FIGS. 6 to 9.

Below, a program operation which is based on a multi-plane program manner will be described with reference to FIGS. 10 and 11. The multi-plane program manner may indicate a program manner in which page data is set up in at least two planes included in one nonvolatile memory device and a program operation is performed on at least two planes at the same time. For descriptive convenience, a detailed description about above-described or duplicated components may be omitted.

Furthermore, it may be assumed that each of the first and second nonvolatile memory devices NVM1 and NVM2 communicates with the memory controller A110 through a first channel CH1 and includes triple level cells TLC. It may be also assumed that the first nonvolatile memory device NVM1 operates in response to the first chip enable signal CEB1 and includes first and second planes PL1 and PL2. It may be further assumed that the first plane PL1 and the second plane PL2 are respectively connected with the first page buffer circuit PB1 and the second page buffer circuit PB2. In example embodiments, the first and second page buffer circuits PB1 and PB2 may be included in the page buffer circuit A122c described with reference to FIG. 4. Likewise, it may be assumed that the second nonvolatile memory device NVM2 operates in response to the second chip enable signal CEB2 and includes third and fourth planes PL3 and PL4 and that the third plane PL3 and the fourth plane PL4 are respectively connected with the third page buffer circuit PB3 and the fourth page buffer circuit PB4. However, the scope and spirit of the disclosure may not be limited thereto.

Referring to FIGS. 5, 10, and 11, in step AS211, the memory controller A110 may set first page data PD1 up in the first plane PL1 of the first nonvolatile memory device NVM1 (① of FIG. 11). For example, to allow the first page data PD1 to be set up in the first plane PL1 of the first nonvolatile memory device NVM1, the memory controller A110 may activate the first chip enable signal CEB1 and may transmit the data signal DQ and the control signal CTRL to the first nonvolatile memory device NVM1. In example embodiments, unlike step AS111 of FIG. 6, the first nonvolatile memory device NVM1 may load the first page data PD1 onto a cache latch (not shown) of the first page buffer PB1.

In step AS212, the memory controller A110 may set second page data PD2 up in the third plane PL3 of the second memory device NVM2 (② of FIG. 11). For example, to allow the second page data PD2 to be set up in the third plane PL3 of the second nonvolatile memory device NVM2, the memory controller A110 may activate the second chip enable signal CEB2 and may transmit the data signal DQ and the control signal CTRL to the second nonvolatile memory device NVM2. In example embodiments, the second nonvolatile memory device NVM2 may load the second page data PD2 onto a cache latch of the third page buffer PB3 in response to received signals.

In example embodiments, in the multi-plane program manner, after the first page data PD1 is set up in the first plan PL1 of the first nonvolatile memory device NVM1, the first ready/busy signal R/B1 of the first nonvolatile memory device NVM1 may have a busy state during a first dummy busy time tDBSY. In example embodiments, the first dummy busy time tDBSY may indicate a time for a plane change at page data setup in the multi-plane program manner.

That is, after the first page data PD1 is set up and the first dummy busy time tDBSY elapses, the memory controller A110 may set page data up in the second plane PL2. For setting page data up in two planes included in a nonvolatile memory device NVM1, a conventional memory controller may set page data up in another plane after page data is set up in one plane and the first dummy busy time tDBSY elapses. In this case, time delay due to the first dummy busy time tDBSY may occur.

However, the memory controller A110 according to the disclosure may set first page data PD1 up in the first plane PL1 of the first nonvolatile memory device NVM1 and may set the second page data PL2 up in the third plane PL3 of the second nonvolatile memory device NVM2 without a time wait corresponding to the first dummy busy time tDBSY, and thus a time delay due to the first dummy busy time tDBSY may not occur.

In step AS213, the memory controller A110 may set third page data PD3 up in the second plane PL2 of the first memory device NVM1 (③ of FIG. 11). While an operation of step AS213 is performed, the second ready/busy signal R/B2 may remain at a busy state during the first dummy busy time tDBSY. For example, to allow the third page data PD3 to be set up in the second plane PL2 of the first nonvolatile memory device NVM1, the memory controller A110 may activate the first chip enable signal CEB1 and may transmit the data signal DQ and the control signal CTRL to the first nonvolatile memory device NVM1. In example embodiments, in response to received signals, the first nonvolatile memory device NVM1 may dump the first page data PD1, loaded onto the cache latch in step AS211, onto the data latch of the first page buffer PB1 and the third data onto a data latch of the second page buffer PB2. In example embodiments, the data dump operation of the first nonvolatile memory device NVM1 may be performed during a second dummy busy time tDBSY2. At this time, the first ready/busy signal R/B1 may remain at a busy state during the second dummy busy time tDBSY2. In example embodiments, the second dummy busy time tDBSY2 may be longer than the first dummy busy time tDBSY.

In step AS214, the memory controller A110 may set fourth page data PD4 up in the fourth plane PL4 of the second memory device NVM2 (④ of FIG. 11). While an operation of step AS214 is performed, the first ready/busy signal R/B1 may remain at a busy state during the second dummy busy time tDBSY2. For example, to allow the fourth page data PD4 to be set up in the fourth plane PL4 of the second nonvolatile memory device NVM2, the memory controller A110 may activate the second chip enable signal CEB2 and may transmit the data signal DQ and the control signal CTRL to the second nonvolatile memory device NVM2. In example embodiments, in response to received signals, the second nonvolatile memory device NVM2 may dump the second page data PD2, loaded onto the cache latch in step AS212, onto the data latch of the third page buffer PB3 and the fourth page data PD4 onto a data latch of a fourth page buffer PB4. In example embodiments, the data dump operation of the second nonvolatile memory device NVM2 may be performed during the second dummy busy time tDBSY2. At this time, the second ready/busy signal R/B2 may remain at a busy state during the second dummy busy time tDBSY2.

In step AS221, the memory controller A110 may set the fifth page data PD5 up in the first plane PL1 of the first memory device NVM1 (⑤ of FIG. 11). In step AS222, the memory controller A110 may set sixth page data PD6 up in the third plane PL3 of the second memory device NVM2 (⑥ of FIG. 11). In step AS223, the memory controller A110 may set seventh page data PD7 up in the second plane PL2 of the first memory device NVM1 (⑦ of FIG. 11). In step AS224, the memory controller A110 may set eighth page data PD8 up in the fourth plane PL4 of the second memory device NVM2 (⑧ of FIG. 11). In example embodiments, operations of steps AS221 to AS224 may be similar to those of steps AS211 to AS214, and a detailed description thereof is thus omitted.

In step AS231, the memory controller A110 may set ninth page data PD9 up in the first plane PL1 of the first memory device NVM1 (⑨ of FIG. 11). In step AS232, the memory controller A110 may set tenth page data PD10 up in the third plane PL3 of the second memory device NVM2 (⑩ of FIG. 11). In step AS233, the memory controller A110 may set eleventh page data PD11 up in the second plane PL2 of the first memory device NVM1 (⑪ of FIG. 11). Operations of steps AS231 to AS233 may be similar to those of steps AS211 to AS213, and a detailed description thereof is thus omitted.

After an operation of step AS233 is completed, the first, fifth, and ninth page data PD1, PD5, and PD9 and the third, seventh, and eleventh page data PD3, PD7, and PD11 may be set up in the first plane PL1 and the second plane PL2 of the first nonvolatile memory device NVM1, respectively. In step AS241, the memory controller A110 may transmit a program confirm command to the first nonvolatile memory device NVM1 such that the first nonvolatile memory device NVM1 performs a program operation. In example embodiments, the first nonvolatile memory device NVM1 may program the program thus set up at the first and second planes PL1 and PL2 in response to the program confirm command.

While the first nonvolatile memory device NVM1 performs a program operation, in step AS234, the memory controller A110 may set twelfth page data PD12 up in the fourth plane PL4 of the second nonvolatile memory device NVM2 (⑫ of FIG. 11). An operation of step AS234 may be similar to that of step AS214, and a detailed description thereof is thus omitted.

After an operation of step AS234 is completed, the second, sixth, and tenth page data PD2, PD6, and PD10 and the fourth, eighth, and twelfth page data PD4, PD8, and PD12 may be set up in the third plane PL3 and the fourth plane PL4 of the second nonvolatile memory device NVM2, respectively. In step AS242, the memory controller A110 may transmit a program confirm command to the second nonvolatile memory device NVM2 such that the second nonvolatile memory device NVM2 performs a program operation. In example embodiments, the second nonvolatile memory device NVM2 may program the program thus set up at the third and fourth planes PL3 and PL4 in response to the program confirm command.

In example embodiments, operations of steps AS211 to AS214 may be operations for setting LSB page data of the first and second nonvolatile memory devices NVM1 and NVM2, operations of steps AS221 to AS224 may be operations for setting CSB page data of the first and second nonvolatile memory devices NVM1 and NVM2, and operations of steps AS231 to AS234 may be operations for setting MSB page data of the first and second nonvolatile memory devices NVM1 and NVM2.

As described above, in the multi-plane program manner, the memory controller A110 may alternately set program data up in the first and second nonvolatile memory devices NVM1 and NVM2, thereby reducing a time delay due to the first and second dummy busy times tDBSY and tDBSY2. That is, since the page data setup time is shortened, the performance of the nonvolatile memory system may be improved.

Figure 12:
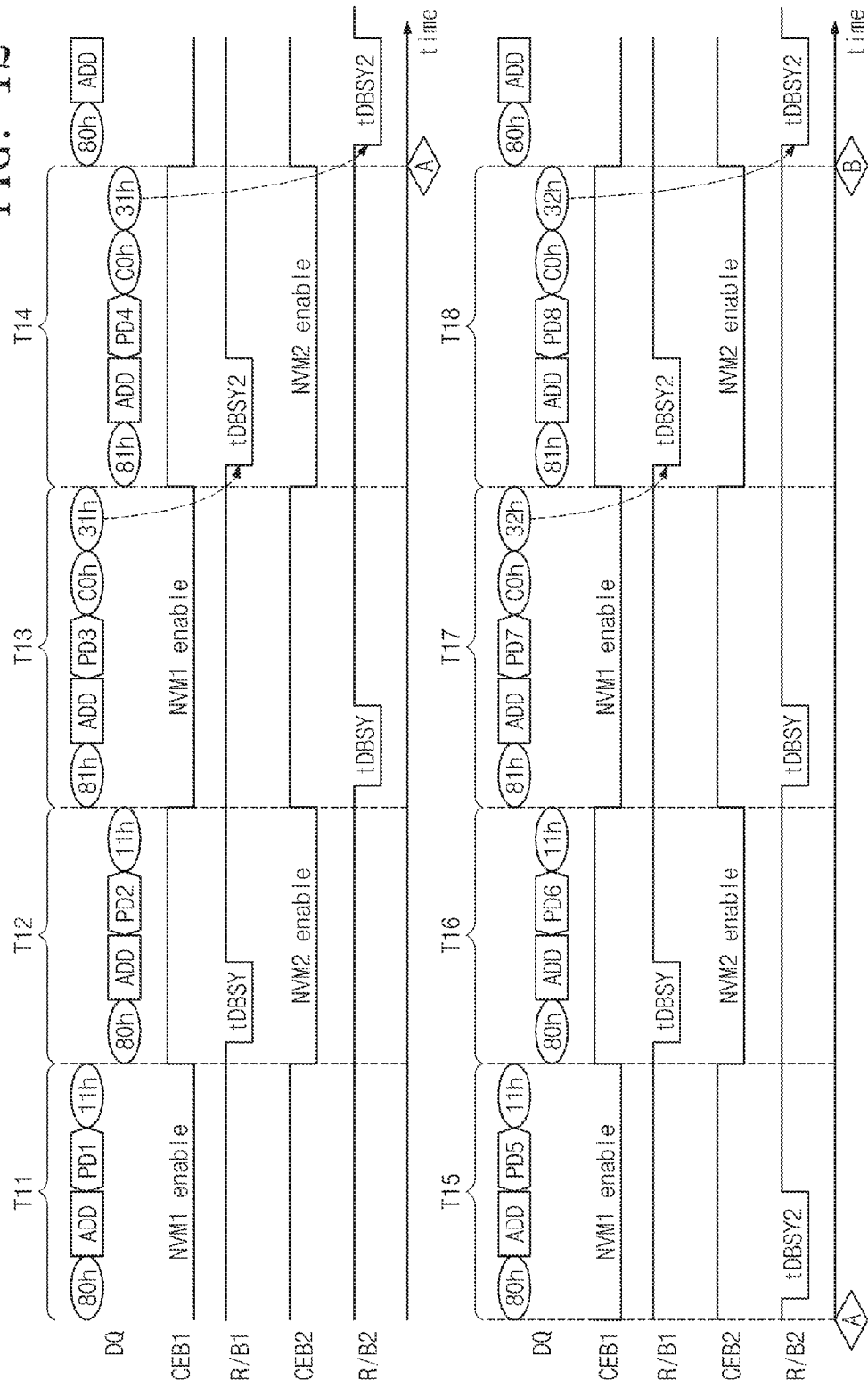
FIGS. 12 to 14 are timing diagrams illustrating a program operation of FIG. 10 in more detail.
Figure 13:
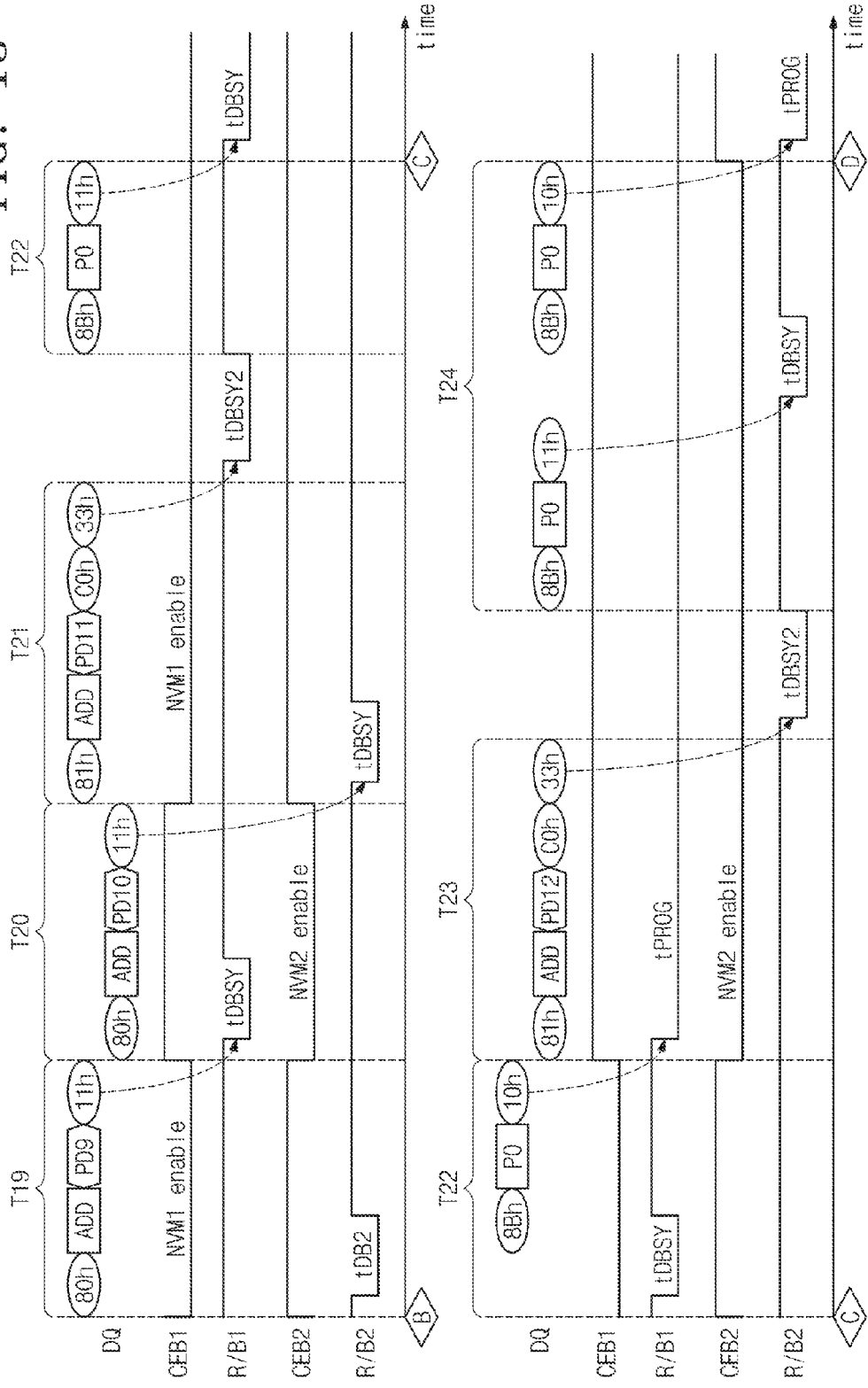
Figure 14:
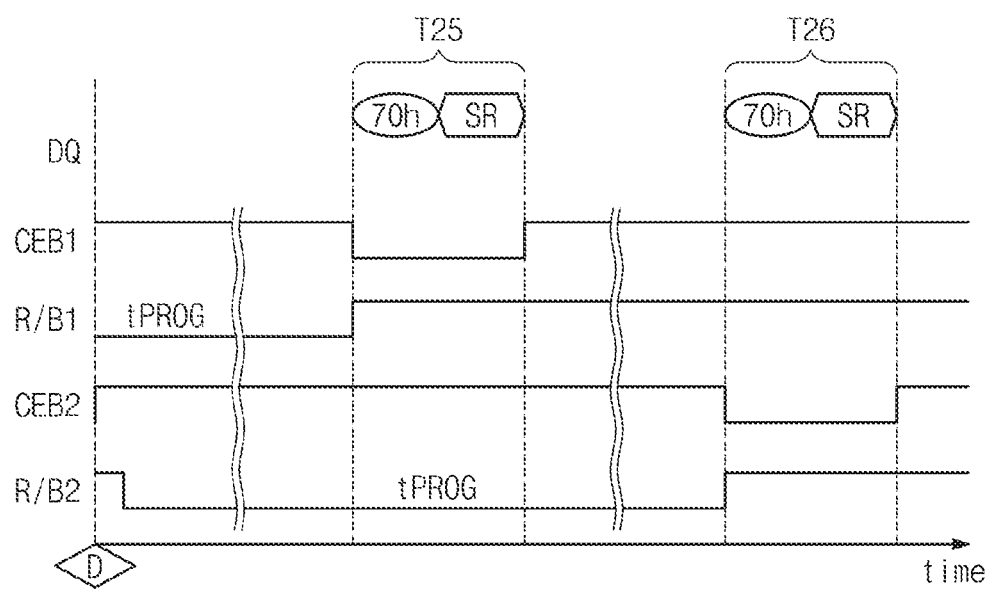

FIGS. 12 to 14 are timing diagrams illustrating a program operation of FIG. 10 in more detail. For descriptive convenience, a detailed description about above-described components will be omitted. Reference numerals of the command, the address, and the page data illustrated in drawings may be an example, but are not limited thereto. Thus, the scope and spirit of the disclosure may not be limited thereto. In addition, the command, the address, and the page data illustrated in drawings are marked by the same reference numerals, but it may be understood that they have different meanings according to each operating section and a target device (e.g., first and second nonvolatile memory devices NVM1 and NVM2).

For ease of illustration, components not needed to describe a technical feature of the disclosure, for example, an address data loading time tADL, a write enable signal busy time tWB, and the like are omitted from the timing diagrams. Furthermore, addresses in respective sections may indicate physical locations at which page data to be set up in the respective sections is stored and may be different from each other.

Also, for descriptive convenience, it may be assumed that each of the first and second nonvolatile memory devices NVM1 and NVM2 loads received page data PD onto a cache latch (not shown) of a corresponding page buffer PB in response to a command set 80h-11h and dumps the received page data PD onto a data latch (not shown) of the corresponding page buffer PB in response to a dump command C0h. However, the scope and spirit of the disclosure may not be limited thereto. For example, a change or modification about dumping or loading of the command set or page data may be variously changed.

Referring to FIGS. 11 to 14, in an eleventh section T11, the memory controller A110 may activate the first chip enable signal CEB1 and may sequentially transmit the first command 80h, the address ADD, first page data PD1, and a second command 11h to the first nonvolatile memory device NVM1 through the data signal DQ. In example embodiments, the first and second commands 80h and 11h may compose a command set for setting page data up in a first plane PL of the first nonvolatile memory device NVM1 for multi-plane programming. In example embodiments, the first nonvolatile memory device NVM1 may load the first page data PD1 onto a first page buffer PB1 in response to signals received in the eleventh section.

In a twelfth section T12, the memory controller A110 may activate the second chip enable signal CEB2 and may sequentially transmit the first command 80h, the address ADD, second page data PD2, and the second command 11h to the second nonvolatile memory device NVM2. The first and second commands 80h and 11h of the twelfth section T12 may compose a command set for setting the second page data PD2 up in a third plane PL3 of the second nonvolatile memory device NVM2.

In example embodiments, as described above, the first ready/busy signal R/B1 may remain at a busy state during a first dummy busy time tDBSY while signals for setting the second page data PD2 up in the third plane PL3 in the twelfth section T12 are communicated. The first dummy busy time tDBSY may be a time for a plane change of a page data setup in the multi-plane program manner. In example embodiments, even though the first ready/busy signal R/B1 remains at a busy state during the first dummy busy time tDBSY, the memory controller A110 may set the second page data PD2 up in the third plane PL3 of the second memory device NVM2.

Likewise, in a thirteenth section T13, the memory controller A110 may activate the first chip enable signal CEB1 and may sequentially transmit the third command 81h, the address ADD, third page data PD3, the fourth command C0h, and a fifth command 31h to the first nonvolatile memory device NVM1. In example embodiments, the third command 81h may be a multi-plane program start command. The fourth and fifth commands C0h and 31h may compose a dump command. In example embodiments, the fifth command 31h may be a page buffer address indicating an LSB page of the first and second page buffers PB1 and PB2 corresponding to the first and second planes PL1 and PL2. The first nonvolatile memory device NVM1 may dump the first page data PD1 onto the first page buffer PB1 and the third page data PD3 onto the second page buffer PB2 in response to signals received in the thirteenth section T13. In example embodiments, the dump operation may be performed during the second dummy busy time tDBSY2 of a fourteenth section T14. The first ready/busy signal R/B1 may remain at a busy state during the dump operation of the first nonvolatile memory device NVM1.

As described above, in the thirteenth section T13, the second ready/busy signal R/B2 may remain at a busy state during the first dummy busy time tDBSY. However, since transmitting signals to the first nonvolatile memory device NVM1 in the thirteenth section T13, the memory controller A110 according to the disclosure may transmit signals regardless of the second ready/busy signal R/B2.

In the fourteenth section T14, the memory controller A110 may activate the second chip enable signal CEB2 and may sequentially transmit the third command 81$h$, the address ADD, fourth page data PD4, the fourth command C0$h$, and the fifth command 31$h$ to the second nonvolatile memory device NVM2. The third to fifth commands 81$h$, C0$h$, and 31$h$ may be similar those described above, and a detailed description thereof is thus omitted. In example embodiments, the fifth command 31$h$ of the fourteenth section T14 may be a page buffer address indicating an LSB page of the third and fourth page buffers PB3 and PB4 corresponding to the third and fourth planes PL3 and PL4 of the second nonvolatile memory device NVM2. The second nonvolatile memory device NVM2 may dump the second page data PD2 onto the third page buffer PB3 and the fourth page data PD4 onto the fourth page buffer PB4 in response to signals received in the fourteenth section T14. In example embodiments, the dump operation may be performed during the second ready/busy signal R/B2 of the fifteenth section T15, and the second ready/busy signal R/B2 may remain at a busy state during the dump operation of the first nonvolatile memory device NVM1.

In example embodiments, the memory controller A110 may set LSB page data up in the first and second nonvolatile memory devices NVM1 and NVM2 through operations of the eleventh to fourteenth sections T11 to T14.

In the fifteenth section T15, the memory controller A110 may activate the first chip enable signal CEB1 and may sequentially transmit the first command 80$h$, the address ADD, fifth page data PD5, and the second command 11$h$ to the first nonvolatile memory device NVM1 through the data signal DQ. In example embodiments, in the fifteenth section T15, the second ready/busy signal R/B2 may remain at a busy state during the second dummy busy time tDBSY2. An operation of the fifteenth section T15 may be similar to that of the eleventh section T11, and a detailed description thereof is thus omitted.

In the sixteenth section T16, the memory controller A110 may activate the first chip enable signal CEB2 and may sequentially transmit the first command 80$h$, the address ADD, sixth page data PD6, and the second command 11$h$ to the second nonvolatile memory device NVM2 through the data signal DQ. An operation of the sixteenth section T16 may be similar to that of the twelfth section T12, and a detailed description thereof is thus omitted.

In the seventeenth section T17, the memory controller A110 may activate the first chip enable signal CEB1 and may sequentially transmit the third command 81$h$, the address ADD, seventh page data PD7, the fourth command C0$h$, and a sixth command 32$h$ to the first nonvolatile memory device NVM1 through the data signal DQ. An operation of the seventeenth section T17 may be similar to that of the thirteenth section T13, and a detailed description thereof is thus omitted. In example embodiments, the sixth command 32$h$ of the seventeenth section T17 may be a page buffer address indicating CSB pages of the first and second page buffers PB1 and PB2 corresponding to the first and second planes PL1 and PL2 of the first nonvolatile memory device NVM1.

In the eighteenth section T18, the memory controller A110 may activate the second chip enable signal CEB2 and may sequentially transmit the third command 81$h$, the address ADD, eighth page data PD8, the fourth command C0$h$, and the sixth command 32$h$ to the second nonvolatile memory device NVM2 through the data signal DQ. An operation of the eighteenth section T18 may be similar to that of the fourteen section T14, and a detailed description thereof is thus omitted. In example embodiments, the sixth command 32$h$ of the eighteenth section T18 may be a page buffer address indicating CSB pages of the third and fourth page buffers PB3 and PB4 corresponding to the third and fourth planes PL3 and PL4 of the second nonvolatile memory device NVM2.

In example embodiments, the memory controller A110 may set CSB page data up in the first and second nonvolatile memory devices NVM1 and NVM2 through operations of the fifteenth to eighteenth sections T15 to T18.

In the nineteenth section T19, the memory controller A110 may activate the first chip enable signal CEB1 and may sequentially transmit the first command 80$h$, the address ADD, ninth page data PD9, and the second command 11$h$ to the first nonvolatile memory device NVM1 through the data signal DQ. An operation of the fifteenth section T15 may be similar to that of the eleventh section T11, and a detailed description thereof is thus omitted.

In the twentieth section T20, the memory controller A110 may activate the second chip enable signal CEB2 and may sequentially transmit the first command 80$h$, the address ADD, tenth page data PD10, and the second command 11$h$ to the second nonvolatile memory device NVM2 through the data signal DQ. An operation of the twentieth section T20 may be similar to that of the twelfth section T12, and a detailed description thereof is thus omitted.

In the twenty-first section T21, the memory controller A110 may activate the first chip enable signal CEB1 and may sequentially transmit the third command 81$h$, the address ADD, eleventh page data PD11, the fourth command C0$h$, and a seventh command 33$h$ to the first nonvolatile memory device NVM1 through the data signal DQ. An operation of the twenty-first section T21 may be similar to that of the thirteenth section T13, and a detailed description thereof is thus omitted. In example embodiments, the seventh command 33$h$ of the twenty-first section T21 may be a page buffer address indicating MSB pages of the first and second page buffers PB1 and PB2 corresponding to the first and second planes PL1 and PL2 of the first nonvolatile memory device NVM1.

In example embodiments, after the first nonvolatile memory device NVM1 completes a dump operation of the eleventh page data PD11, the first, fifth, and ninth page data PD1, PD5, and PD9 and third, seventh, and eleventh page data PD3, PD7, and PD11 may be set up in the first page buffer PB1 and the second page buffer PB2, respectively.

In a twenty-second section T22, the memory controller A110 may activate the first chip enable signal CEB1 to transmit a program confirm command to the first nonvolatile memory devices NVM1. For example, the memory controller A110 may activate the first chip enable signal CEB1, may transmit a first program confirm command set (8B$h$, 11$h$) and a program order address PO to the first nonvolatile memory device NVM1. Additionally, in the twenty-second section T22, the memory controller A110 may subsequently transmit a second program confirm command set (8B$h$, 10$h$) and the program order address PO to the first nonvolatile memory device NVM1. In example embodiments, after the first program confirm command set (8B$h$, 11$h$) and the program order address PO are transmitted, the first ready/busy signal RIB 1 may remain at a busy state during the first dummy busy time tDBSY. That is, the memory controller A110 may transmit the first program confirm command set (8B$h$, 11$h$) and the program order address PO to the first nonvolatile memory device NVM1 and may transmit the second program confirm command set (8Bh, 10h) and the program order address PO to the first nonvolatile memory device NVM1 after the first dummy busy time tDBSY elapses. In example embodiments, the first nonvolatile memory device NVM1 may program the program thus set up at the first and second planes PL1 and PL2 in response to the program confirm command received in the twenty-second section T22.

In example embodiments, the first nonvolatile memory device NVM1 may perform a program operation during a program time tPROG, and the first ready/busy signal R/B1 may remain at a busy state while the first nonvolatile memory device NVM1 performs the program operation.

During the program operation of the first nonvolatile memory device NVM1 (i.e., while the first ready/busy signal R/B1 remains at a busy state), in a twenty-third section T23, the memory controller A110 may activate the second chip enable signal CEB2 and may sequentially transmit the third command 81h, the address ADD, twelfth page data PD12, the fourth command C0h, and the seventh command 33h to the second nonvolatile memory device NVM2 through the data signal DQ. An operation of the twenty-third section T23 may be similar to that of the eighteenth section T18, and a detailed description thereof is thus omitted. In example embodiments, the seventh command 33h of the twenty-third section T23 may be a page buffer address indicating MSB pages of the third and fourth page buffers PB3 and PB4 corresponding to the third and fourth planes PL3 and PL4 of the second nonvolatile memory device NVM2.

After the second nonvolatile memory device NVM2 completes a dump operation of the twelfth page data PD12, the second, sixth, and tenth page data PD2, PD6, and PD10 and fourth, eighth, and twelfth PD4, PD8, and PD12 may be set up in the third page buffer PB3 and the fourth page buffer PB4, respectively.

In a twenty-fourth section T24, the memory controller A110 may activate the second chip enable signal CEB2 to transmit a program confirm command to the second nonvolatile memory devices NVM2. For example, the memory controller A110 may activate the second chip enable signal CEB2, may transmit the first program confirm command set (8Bh, 11h) and the program order address PO to the second nonvolatile memory device NVM2, and may transmit the second program confirm command set (8Bh, 10h) and the program order address PO to the first nonvolatile memory device NVM2. In example embodiments, after the first program confirm command set (8Bh, 11h) and the program order address PO are transmitted, the second ready/busy signal R/B2 may remain at a busy state during the first dummy busy time tDBSY. That is, the memory controller A110 may transmit the first program confirm command set (8Bh, 11h) and the program order address PO to the second nonvolatile memory device NVM2 and may transmit the second program confirm command set (8Bh, 10h) and the program order address PO to the second nonvolatile memory device NVM1 after the first dummy busy time tDBSY elapses. In example embodiments, the second nonvolatile memory device NVM2 may program the program thus set up at the third and fourth planes PL3 and PL4 in response to the program confirm command received in the twenty-fourth section T24.

After the program operation of the first nonvolatile memory device NVM1 is completed (i.e., after the first ready/busy signal R/B1 is changed from a busy state to a ready state), in a twenty-fifth section T25, the memory controller A110 may activate the first chip enable signal CEB1 to transmit the eighth command 70h to the first nonvolatile memory device NVM1. The first nonvolatile memory device NVM1 may transmit status information SR to the memory controller A110 in response to the eighth command 70h of the twenty-fifth section T25. The eighth command 70h may be a status register read command, and the status information SR may be information about whether or not a program pass indication is stored in a status register.

After the program operation of the second nonvolatile memory device NVM2 is completed (i.e., after the second ready/busy signal R/B2 is changed from a busy state to a ready state), in a twenty-sixth section T26, the memory controller A110 may activate the second chip enable signal CEB2 to transmit the eighth command 70h to the second nonvolatile memory device NVM2. The second nonvolatile memory device NVM2 may transmit status information SR to the memory controller A110 in response to the eighth command 70h of the twenty-sixth T26. The eighth command 70h may be a status register read command, and the status information SR may be information about whether or not a program pass indication is stored in a status register.

As described above, the nonvolatile memory system A110 according to the disclosure may alternately set page data up in a plurality of nonvolatile memory devices, which communicate with the memory controller A110 through one channel, at a program operation. In this case, since a delay of a dummy busy time due to a data dump or plane change may be reduced, the performance of the nonvolatile memory system may be improved.

In example embodiments, the disclosure may be described in the above-described embodiments with respect to use of the TLC program or multi-plane program manner. However, the scope and spirit of the disclosure may not be limited thereto. For example, the technical feature of the disclosure will be applied to various program manners.

Figure 15:
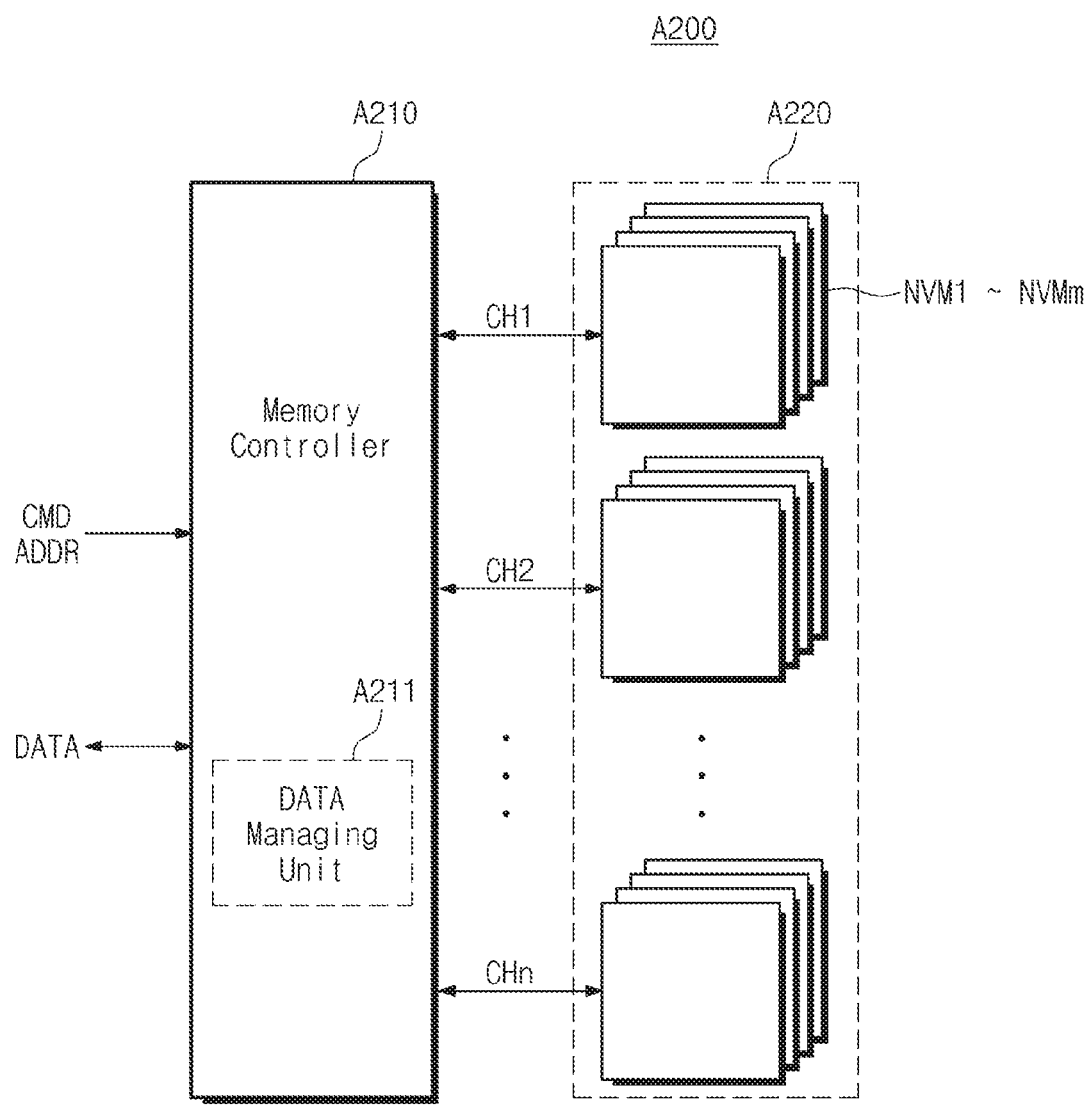
FIG. 15 is a block diagram illustrating a nonvolatile memory system according to another embodiment of the disclosure.

FIG. 15 is a block diagram schematically illustrating a nonvolatile memory system according to another embodiment of the disclosure. Referring to FIG. 15, a nonvolatile memory system A200 may include a memory controller A210 and a plurality of nonvolatile memory devices A220. The memory controller A210 may communicate with the nonvolatile memory devices A220 through a plurality of channels CH1 to CHn. For example, the memory controller A210 may communicate with nonvolatile memory devices NVM1 to NVMm through the first interface CH1.

The memory controller A210 and the nonvolatile memory devices A220 are described with reference to FIGS. 1 to 14, and a detailed description thereof is thus omitted.

The memory controller A210 may include a data managing unit A211. As described with reference to FIGS. 1 to 14, the data managing unit A211 may rearrange page data such that a plurality of page data is alternately set up in the nonvolatile memory devices (e.g., the nonvolatile memory devices NVM1 to NVMm) connected through the same channel. For example, the data managing unit A211 may classify write data, received from an external device (e.g., a host, a processor, or the like), by the page and may manage or rearrange page data such that a plurality of page data is alternately set up in the nonvolatile memory devices (e.g., the nonvolatile memory devices NVM1 to NVMm) connected through the same channel. In example embodiments, the data managing unit A211 may be implemented in the form of software, and the data managing unit A211 may be stored in an SRAM (refer to FIG. 2) or a buffer memory (refer to FIG. 2) of the memory controller A210 and may be driven by a CPU (refer to FIG. 2).

In example embodiments, the data managing unit A211 may manage data based on a read or write unit of each of the nonvolatile memory devices A220. For example, in the case where a write unit of each nonvolatile memory device is a page unit, each nonvolatile memory device includes two planes, the size of each page in a plane is 8 KB, and memory cells included in each nonvolatile memory device are triple level cells, the data managing unit A211 may manage data by a 8*3*4-KB unit. In this case, data of a management unit may include first to twelfth page data, and each of the first to twelfth page data may be alternately set up in the first and second nonvolatile memory devices NVM1 and NVM2 communicating with the memory controller A210 through the first channel CH1.

As described above, the nonvolatile memory system according to the disclosure may alternately set page data up in a plurality of nonvolatile memory devices, which communicate with the memory controller through one channel, at a program operation. This may mean that the performance of the nonvolatile memory system is improved.

Figure 16:
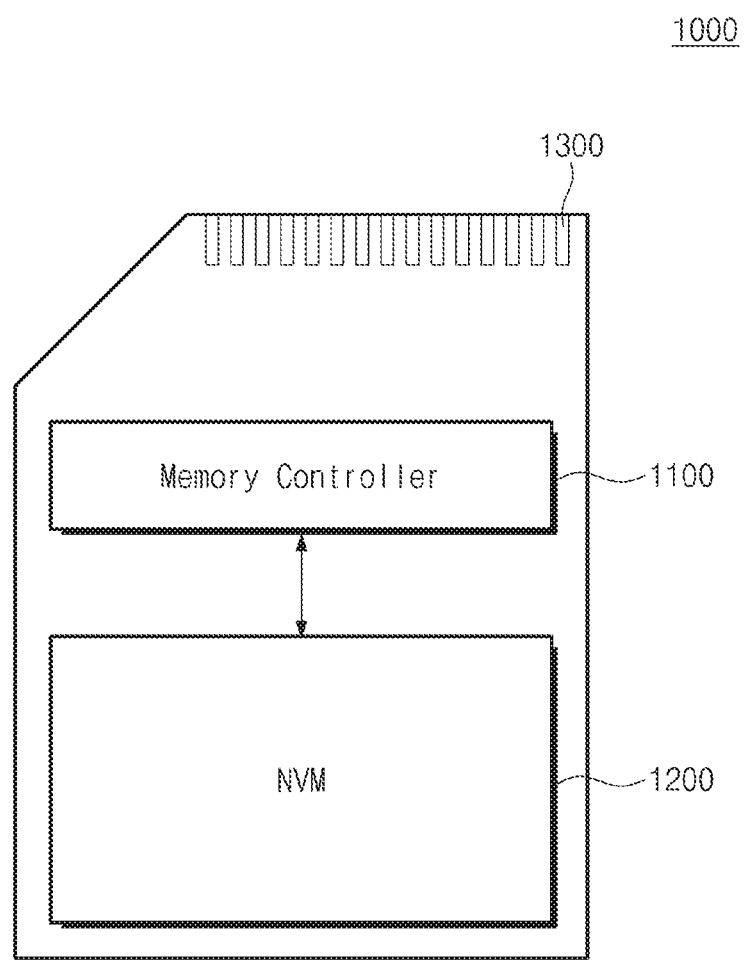
FIG. 16 is a block diagram schematically illustrating a memory card system to which a nonvolatile memory system according to an embodiment of the disclosure is applied.

FIG. 16 is a block diagram illustrating a memory card system including a nonvolatile memory system according to an embodiment of the disclosure. Referring to FIG. 16, a memory card system 1000 may contain a memory controller 1100, a nonvolatile memory 1200, and a connector 1300.

The memory controller 1100 may be connected to the nonvolatile memory 1200. The memory controller 1100 may be configured to access the nonvolatile memory 1200. For example, the memory controller 1100 may be adapted to control an overall operation of the nonvolatile memory 1200 including, but not limited to, a read operation, a write operation, an erase operation, and a background operation. The background operation may include the following operations: wear-leveling management, garbage collection, and the like.

The memory controller 1100 may provide an interface between the nonvolatile memory 1200 and a host. The memory controller 1100 may be configured to drive firmware for controlling the nonvolatile memory 1200.

In example embodiments, the controller 1100 may include components such as, but not limited to, a RAM, a processing unit, a host interface, a memory interface, and an error correction unit.

The memory controller 1100 may communicate with an external device through the connector 1300. The memory controller 1100 may communicate with an external device based on a specific communication protocol. For example, the memory controller 1100 may communicate with the external device through at least one of various interface protocols such as, but not limited to, universal serial bus (USB), multimedia card (MMC), eMMC (embedded MMC), peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), universal flash storage (UFS), Wi-Fi, Bluetooth, NVMe, and Firewire.

The nonvolatile memory 1200 may be implemented with a variety of nonvolatile memory devices, such as, but not limited to, an EPROM, a NAND flash memory, a NOR flash memory, a PRAM, an ReRAM, an FRAM, and an STT-MRAM.

In example embodiments, the memory controller 1100 and the nonvolatile memory 1200 may be integrated in a single semiconductor device. The memory controller 1100 and the nonvolatile memory 1200 may be integrated in a single semiconductor device to form a solid state drive (SSD). The memory controller 1100 and the nonvolatile memory 1200 may be integrated in a single semiconductor device to form a memory card such as, but not limited to, a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), and a universal flash storage (UFS).

The memory controller 1100 or the nonvolatile memory 1200 may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP). Alternatively, the nonvolatile memory 1200 may include a plurality of nonvolatile memory chips, which are implemented in one of the above-described packaging technologies.

In example embodiments, the nonvolatile memory 1200 may include a plurality of nonvolatile memory devices, and the memory controller 1100 may perform a program operation or a data setup operation based on an operating method described with reference to FIGS. 1 to 15.

Figure 17:
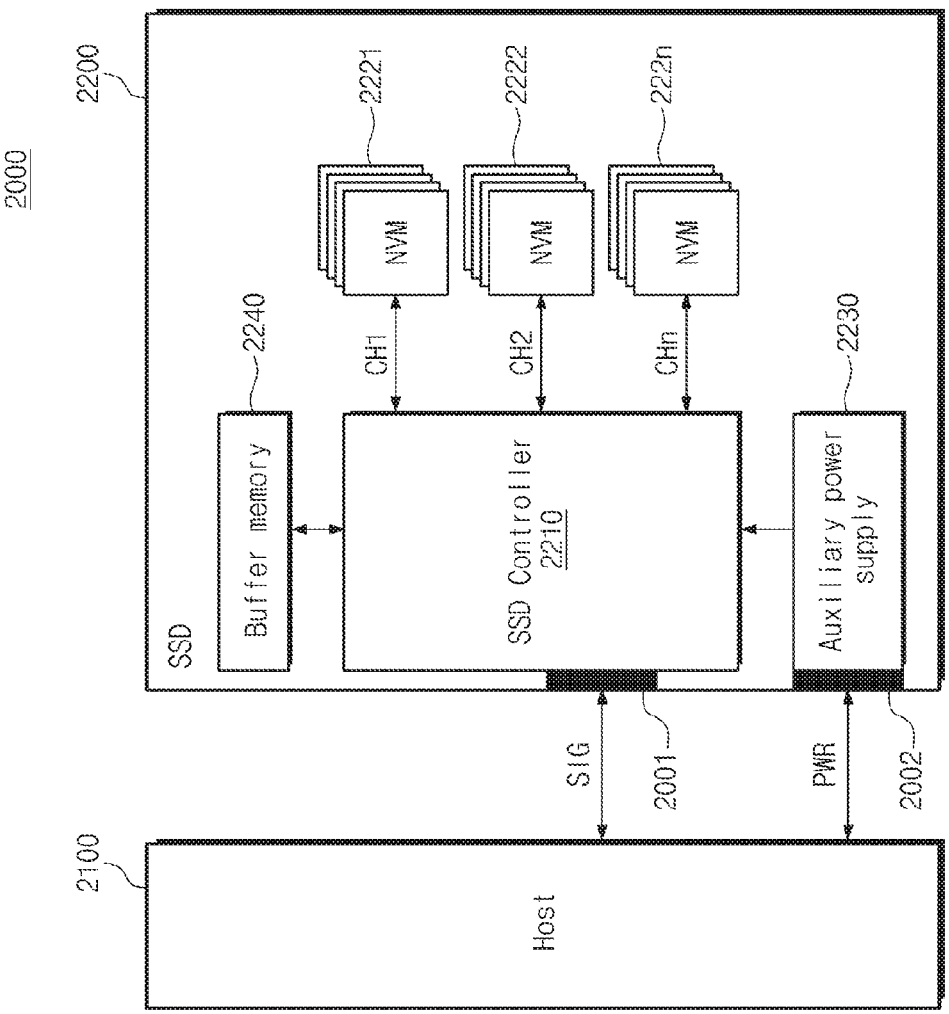
FIG. 17 is a block diagram illustrating a solid state drive including a nonvolatile memory system according to an embodiment of the disclosure.

FIG. 17 is a block diagram illustrating a solid state drive including a nonvolatile memory system according to an embodiment of the disclosure. Referring to FIG. 17, a solid state drive (SSD) system 2000 may include a host 2100 and an SSD 2200. The SSD 2200 may exchange signals SIG with the host 2100 through the host interface 2001 and may be supplied with a power PWR through a power connector 2002. The SSD 2200 may include an SSD controller 2210, a plurality of flash memories 2221 to 222n, an auxiliary power supply 2230, and a buffer memory 2240.

The SSD controller 2210 may control the flash memories 2221 to 222n through a plurality of channels CH1 to CHn in response to a signal SIG from the host 2100. The flash memories 2221 to 222n may perform a program operation in response to control of the SSD controller 2210. In example embodiments, the SSD controller 2210 may control the flash memories 2221 to 222n based on an operating method described with reference to FIGS. 1 to 15.

The auxiliary power supply 2230 may be connected to the host 2100 via the power connector 2002. The auxiliary power supply 2230 may be charged by power PWR from the host 2100. When power is not smoothly supplied from the host 2100, the auxiliary power supply 2230 may power the SSD system 2000. The auxiliary power supply 2230 may be placed inside or outside the SSD 2200. For example, the auxiliary power supply 2230 may be put on a main board to supply an auxiliary power to the SSD 2200.

The buffer memory 2240 may act as a buffer memory of the SSD 2200. For example, the buffer memory 2240 may temporarily store data received from the host 2100 or from the flash memories 2221 to 222n or may temporarily store metadata (e.g., mapping tables) of the flash memories 2221 to 322n. The buffer memory 2240 may include volatile memories such as DRAM, SDRAM, DDR, SDRAM, LPDDR, SDRAM, SRAM, and the like or nonvolatile memories such as FRAM, ReRAM, STT-MRAM, PRAM, and the like.

Figure 18:
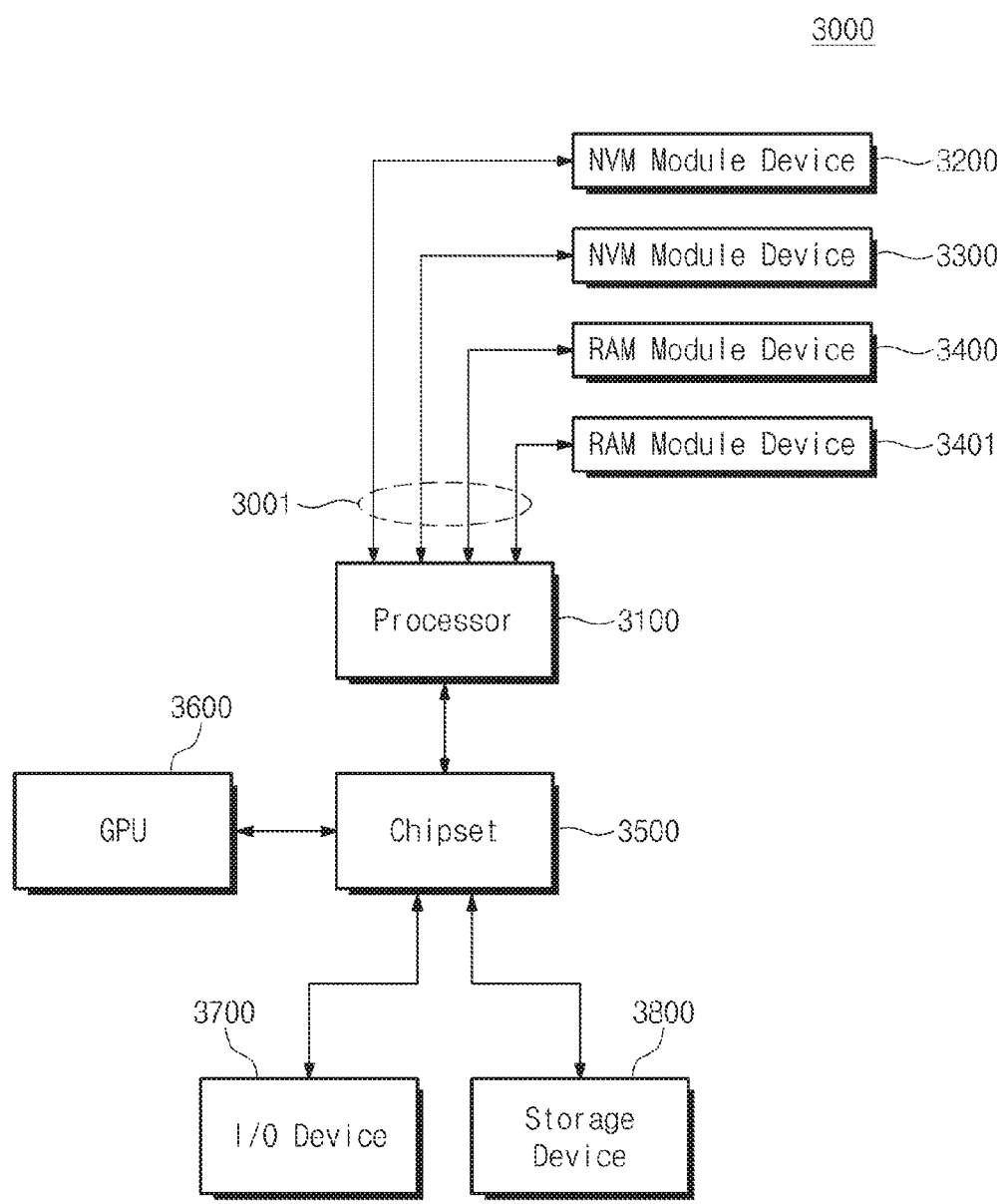
FIG. 18 is a block diagram schematically illustrating a computing system to which a nonvolatile memory system according to an embodiment of the disclosure is applied.

FIG. 18 is a block diagram schematically illustrating a computing system to which a nonvolatile memory system according to an embodiment of the disclosure is applied. Referring to FIG. 18, a computing device 3000 may include a processor 3100, nonvolatile memory modules 3200 and 3300, RAM modules 3400 and 3401, a chip-set 3500, a graphic processing unit (GPU) 3600, an input/output device 3700, and a storage device 3800.

The processor 3100 may perform various operations of the computing system 3000. The processor 3100 may perform various operations to be executed on the computing system 3000.

The nonvolatile memory modules 3200 and 3300 and the RAM modules 3400 and 3401 may be directly connected with the processor 3100. For example, each of the nonvolatile memory modules 3200 and 3300 and the RAM modules 3400 and 3401 may have a form of a dual in-line memory module (DIMM) and may be mounted on a DIMM socket directly connected to the processor 3100 so as to communicate with the processor 3100.

The nonvolatile memory modules 3200 and 3300 and the RAM modules 3400 and 3401 may communicate with the processor 3100 through the same interface 3001. For example, the nonvolatile memory modules 3200 and 3200 and the RAM modules 3400 and 3401 may communicate with each other through a DDR interface 3001. In example embodiments, the nonvolatile memory modules 3200 and 3300 may be used as a storage medium of the computing system 3000 through the processor 3300. The RAM modules 3400 and 3401 may be used as a working memory, a buffer memory, or a cache memory of the computing system 3000.

The chipset 3500 may be electrically connected with the processor 3100 and may control hardware of the computing system 3000 under control of the processor 3100. For example, the chipset 3500 may be connected to each of the GPU 3600, the input/output device 3700, and the storage device 3800 through main buses and may perform a bridge operation with respect to the main buses.

The GPU 3600 may perform a set of arithmetic operations for outputting image data of the computing system 3000. In example embodiments, the GPU 3600 may be embedded in the processor 3100 in the form of a system on chip.

The input/output device 3700 may include various devices which receive data or commands from the computing system 3000 or may output data to an external device. For example, the input/output device 3700 may include user input devices such as a keyboard, a keypad, a button, a touch panel, a touch screen, a touch pad, a touch ball, a microphone, a gyroscope sensor, a vibration sensor, a piezoelectric sensor, and the like and user output devices such as a liquid crystal display (LCD), an organic light emitting diode (OLED) display device, an active matrix OLED (AMOLED) display device, a light emitting diode, a speaker, a motor, and the like.

The storage device 3800 may be used as a storage medium of the computing system 3000. The storage device 3800 may include mass storage media such as a hard disk drive (HDD), a solid state drive (SSD), a memory card, a memory stick, and the like.

In example embodiments, the nonvolatile memory modules 3200 and 3300 may be used as a storage medium of the computing system 3000 through the processor 3100. An interface 3001 between the nonvolatile memory modules 3200 and 3300 and the processor 3100 may be faster in speed than that between the storage device 3800 and the processor 3100. That is, the processor 3100 may use the nonvolatile memory modules 3200 and 3300 as a storage medium, thereby improving the performance of the computing system 3000.

In example embodiments, the nonvolatile memory modules 3200 and 3300 may include a plurality of nonvolatile memory devices and may perform a program operation or a data setup operation based on an operating method described with reference to FIGS. 1 to 15.

Figure 19:
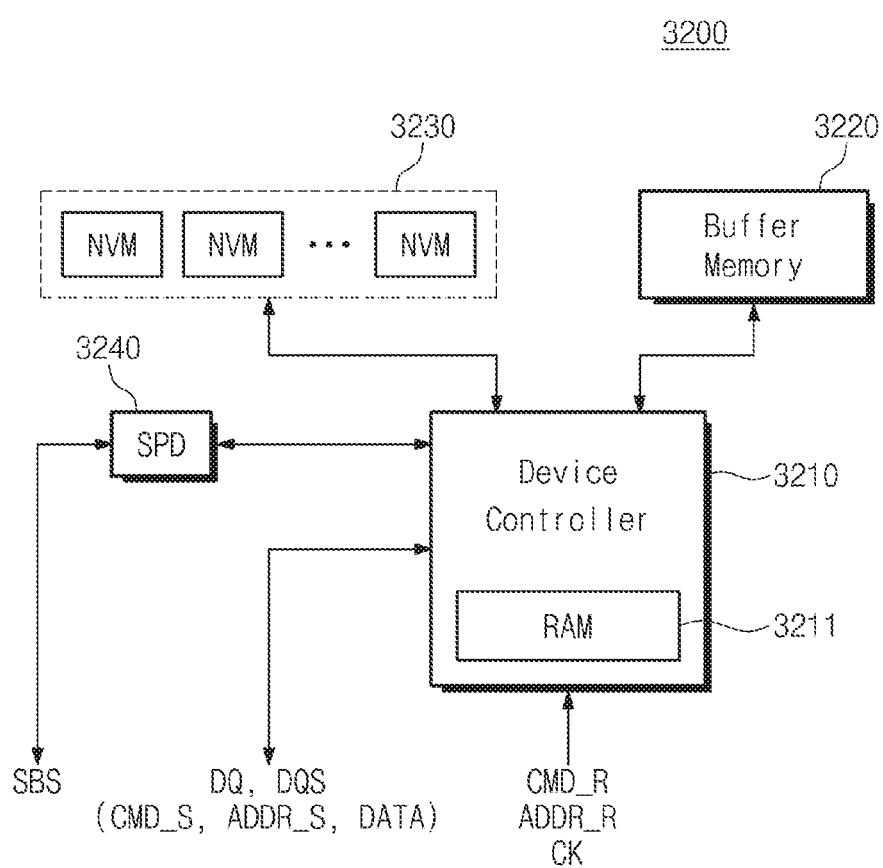
FIG. 19 is a block diagram schematically illustrating one of nonvolatile memory modules of FIG. 18.

FIG. 19 is a block diagram schematically illustrating one of the nonvolatile memory modules of FIG. 18. In example embodiments, FIG. 19 is a block diagram of a nonvolatile memory module 3200 with a load reduced DIMM (LRDIMM) form. In example embodiments, the nonvolatile memory module 3200 illustrated in FIG. 19 may be of the form of a dual in-line memory module (DIMM) and may be mounted on a DIMM socket so as to communicate with the processor 3100.

Referring to FIG. 19, the nonvolatile memory module 3200 may include a device controller 3210, a buffer memory 3220, a nonvolatile memory device 3230, and a serial presence detect chip (SPD) 3240. The device controller 3210 may include a RAM 3211. In example embodiments, the nonvolatile memory device 3230 may include a plurality of nonvolatile memories NVM. Each of the nonvolatile memories included in the nonvolatile memory device 3230 may be implemented with a chip, a package, a device, or a module. Alternatively, the nonvolatile memory device 3230 may be implemented with a chip or a package.

The nonvolatile memories NVM may communicate with the device controller 3210 through a plurality of channels. In example embodiments, the device controller 3210 may control the nonvolatile memories NVM based on an operating method described with reference to FIGS. 1 to 15.

The device controller 3210 may transmit and receive a plurality of data signals DQ and a plurality of data strobe signals DQS to and from the processor 3100 and may receive a RAM command CMD_R, a RAM address ADDR_R, and a clock CK through separate signal lines.

In response to the RAM command CMD_R, the RAM address ADDR_R, and the clock CK received from the processor 3100, the device controller 3210 may store in the RAM 3211 information or data received through a data signal DQ and a data strobe signal DQS or may provide information or data stored in the RAM 3211 to the processor 3100 through the data signal DQ and the data strobe signal DQS. For example, the RAM 3211 may include a multi-port RAM such as dual port SRAM (DPSRAM) or a shared RAM. That is, the processor 3100 or the device controller 3110 may access the RAM 3211 through independent ports, respectively.

In example embodiments, the device controller 3210 and the processor 3100 may transmit and receive a storage command CMD_S and a storage address ADDR_S, which are used to write or read data in or from the nonvolatile memory device 3230, and data DATA through the data signal DQ and the data strobe signal DQS. For example, the device controller 3210 may store in the RAM 3211 the storage command CMD_S received through the data signal DQ and the data strobe signal DQS in response to a RAM command CMD_R, a RAM address ADDR_R, and a clock CK received from the processor 3100. The device controller 3210 may control the nonvolatile memory device 3230 based on the storage command CMD_S stored in the RAM 3211. The device controller 3210 may store information (e.g., write complete information or read data) according to the operation result in the RAM 3211 and may transmit the information written in the RAM 3211 to the processor 3100 through the data signal DQ and the data strobe signal DQS in response to the RAM command CMD_R, the RAM address ADDR_R, and the clock CK from the processor 3100.

The buffer memory 3220 may be used as a working memory, a buffer memory, or a cache memory of the device controller 3210. The buffer memory 3220 may include various information required to operate the nonvolatile memory module 3200. In example embodiments, the buffer memory 3220 may include data for managing the nonvolatile memory device 3230. For example, the buffer memory 3220 may include a mapping table between a physical address of the nonvolatile memory device 3230 and the storage address ADDR_S received from the processor 3100 through the data signal DQ and the data strobe signal DQS. In example embodiments, the buffer memory 3220 may include random access memories such as DRAM, SRAM, PRAM, MRAM, RRAM, FeRAM, and the like.

The SPD 3240 may be a programmable read only memory device (e.g., EEPROM). The SPD 3240 may include initial information or device information of the nonvolatile memory module 3200. In example embodiments, the SPD 3240 may include initial information or device information such as a module type, a module configuration, a storage capacity, a module kind, an execution environment, and the like of the nonvolatile memory module 3200. When a computing system including the nonvolatile memory module 3200 is booted up, the processor 3100 of the computing system may read the SPD 3240 and may recognize the nonvolatile memory module 3200 based on the read result. The processor 3100 may use the nonvolatile memory module 3200 as a storage medium based on the SPD 3240.

In example embodiments, the SPD 3240 may communicate with the processor 3100 through a serial bus SB. The processor 3100 may exchange a signal SBS with the SPD 3240 through the serial bus. In example embodiments, the SPD 3240 may communicate with the device controller 3210 through the serial bus. In example embodiments, the serial bus SB may include at least one of 2-line serial buses such as an inter-integrated circuit (I2C), a system management bus (SMBus), a power management bus (PMBus), an intelligent platform management interface (IPMI), a management component transport protocol (MCTP), or the like.

Figure 20:
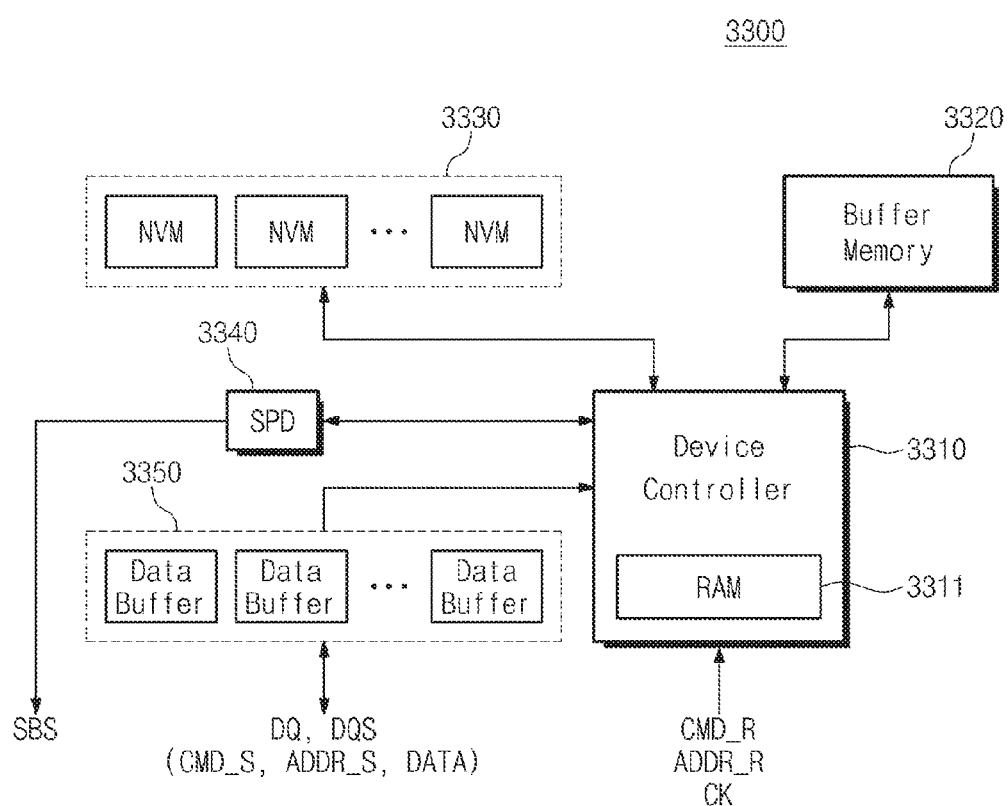
FIG. 20 is a block diagram schematically illustrating one of nonvolatile memory modules of FIG. 18.

FIG. 20 is a block diagram schematically illustrating one of the nonvolatile memory modules of FIG. 18. In example embodiments, FIG. 20 is a block diagram of a nonvolatile memory module 3300 with a registered DIMM (RDIMM) form. In example embodiments, the nonvolatile memory module 3300 illustrated in FIG. 20 may be of the form of a dual in-line memory module (DIMM) and may be mounted on a DIMM socket so as to communicate with the processor 3100.

Referring to FIG. 20, the nonvolatile memory module 3300 may include a device controller 3310, a buffer memory 3320, a nonvolatile memory device 3330, a serial presence detect chip (SPD) 3340, and a data buffer circuit 3350. The device controller 3310 may include a RAM 3311. The device controller 3310, the RAM 3311, the nonvolatile memory device 3330, and the SPD 3340 are described with reference to FIG. 19, and a detailed description thereof is thus omitted.

The data buffer circuit 3350 may receive information or data from the processor 3100 through a data signal DQ and a data strobe signal DQS and may transfer the received information or data to the device controller 3310. Alternatively, the data buffer circuit 3350 may receive information or data from the device controller 3310 and may transfer the received information or data to the processor 3100 through a data signal DQ and a data strobe signal DQS.

In example embodiments, the data buffer circuit 3350 may include a plurality of data buffers. Each of the data buffers may exchange the data signal DQ and the data strobe signal DQS with the processor 3100. Alternatively, each of the data buffers may exchange a signal with the device controller 3310. In example embodiments, each of the data buffers may operate according to control of the device controller 3310.

In example embodiments, the device controller 3310 may set page data up in the nonvolatile memory device 3330 or may perform a program operation, based on an operating method described with reference to FIGS. 1 to 14.

Figure 21:
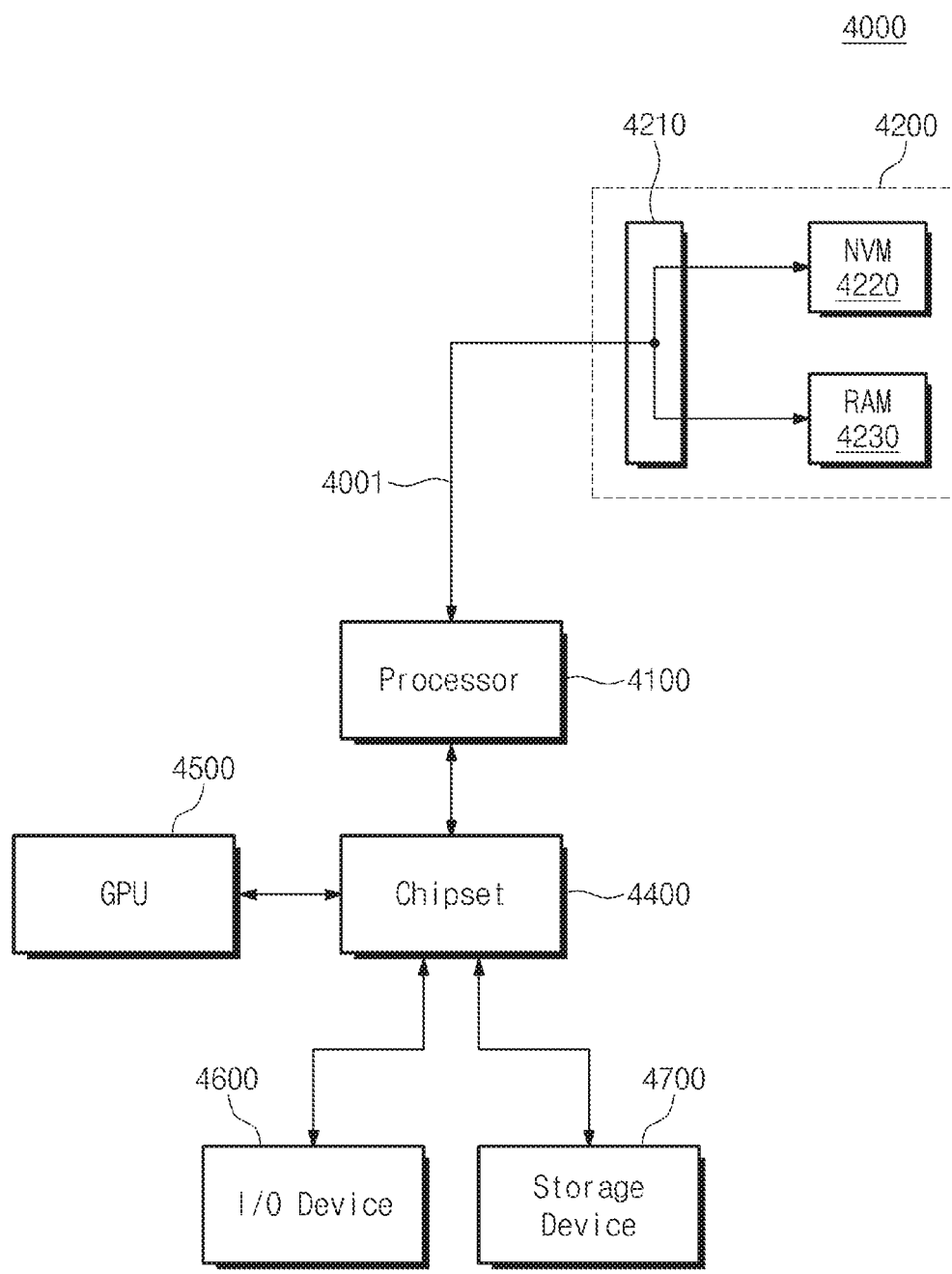
FIG. 21 is a block diagram schematically illustrating a computing system to which a nonvolatile memory module according to the disclosure is applied.

FIG. 21 is a block diagram schematically illustrating a computing system to which a nonvolatile memory module according to the disclosure is applied. For descriptive convenience, a detailed description about above-described components may be omitted. Referring to FIG. 21, a computing system 4000 may include a processor 4100, a nonvolatile memory module 4200, a chipset 4400, a graphic processing unit (GPU) 4500, an input/output device 4600, and a storage device 4700. The processor 4100, the chipset 4400, the GPU 4500, the input/output device 4600, and the storage device 4700 are substantially the same as those of FIG. 18, and a detailed description thereof is thus omitted.

The nonvolatile memory module 4200 may be directly connected to the processor 4100. In example embodiments, the nonvolatile memory module 4200 may be of the form of a dual in-line memory module (DIMM) and may be mounted on a DIMM socket so as to communicate with the processor 4100.

The nonvolatile memory module 4200 may include a control circuit 4210, a nonvolatile memory device 4220, and a RAM device 4230. Unlike the nonvolatile memory modules 3200 and 3300 of FIGS. 18 to 20, the processor 4100 may access the nonvolatile memory device 4220 and the RAM device 4230 of the nonvolatile memory module 4200, respectively. In detail, the control circuit 4210 may store received data in the nonvolatile memory device 4210 or the RAM device 4220 in response to control of the processor 4100. Alternatively, under control of the processor 4100, the control circuit 4210 may transmit data stored in the nonvolatile memory device 4210 to the processor 4100 or data stored in the RAM device 4220 to the processor 4100. That is, the processor 4100 may respectively recognize the nonvolatile memory device 4210 and the RAM device 4220 included in the nonvolatile memory module 4200. The processor 4100 may store data in the nonvolatile memory device 4220 of the nonvolatile memory module 4200 or may read data therefrom. Alternatively, the processor 4100 may store data in the RAM device 4230 or may read data therefrom.

In example embodiments, the processor 4100 may use the nonvolatile memory device 4220 of the nonvolatile memory module 4200 as a storage medium of the computing system 4000 and may use the RAM device 4230 of the nonvolatile memory module 4200 as a main memory of the computing system 4000. That is, the processor 4100 may selectively access the nonvolatile memory device or the RAM device included in a nonvolatile memory module which is mounted on a DIMM socket.

In example embodiments, the processor 4100 may communicate with the nonvolatile memory module 4200 through a DDR interface 4001.

In example embodiments, the nonvolatile memory module 4200 may set page data up in the nonvolatile memory device 4220 or may perform a program operation, based on an operating method described with reference to FIGS. 1 to 15.

Figure 22:
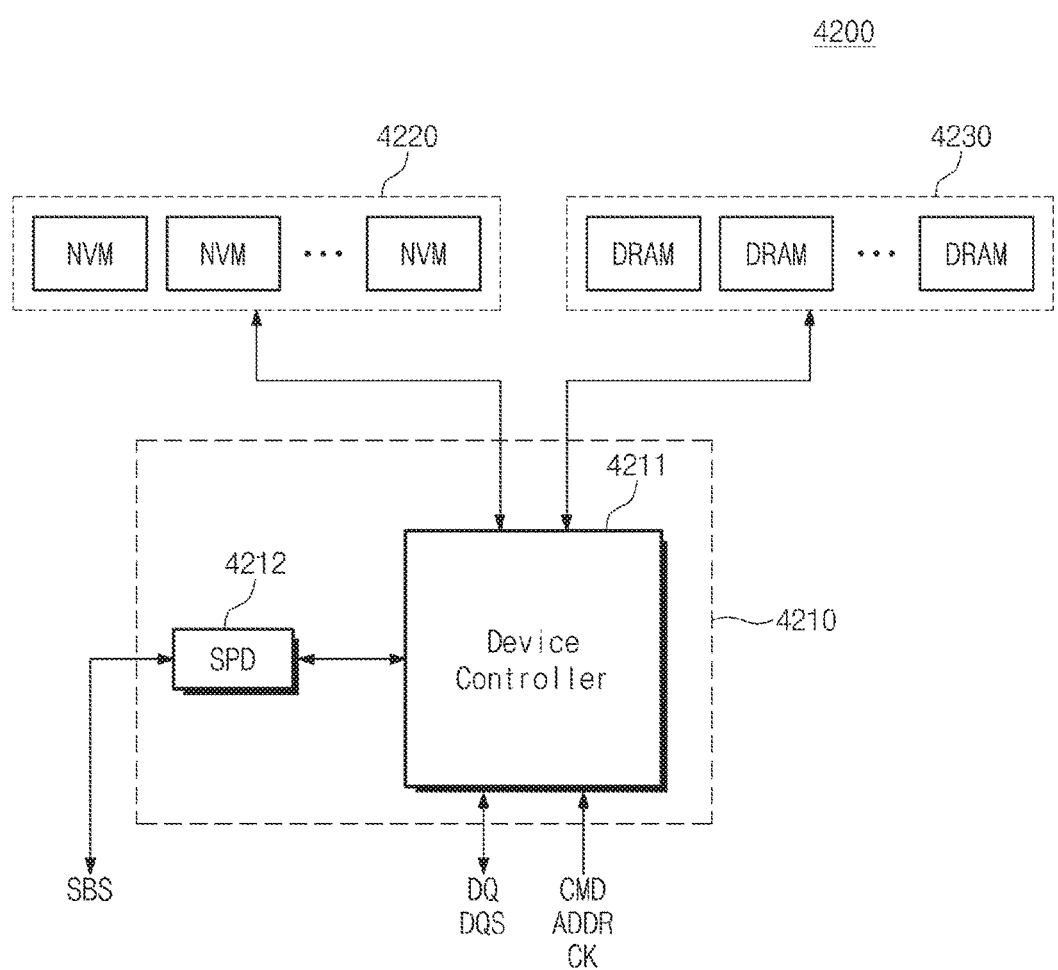
FIG. 22 is a block diagram schematically illustrating a nonvolatile memory module illustrated in FIG. 21.

FIG. 22 is a block diagram schematically illustrating a nonvolatile memory module illustrated in FIG. 21. In example embodiments, the nonvolatile memory module 4200 illustrated in FIG. 22 may be of the form of a dual in-line memory module (DIMM) and may be mounted on a DIMM socket so as to communicate with the processor 4100.

Referring to FIGS. 21 and 22, the nonvolatile memory module 4200 may include a control circuit 4210, a nonvolatile memory device 4220, and a RAM device 4230. In example embodiments, the nonvolatile memory device 4220 may include a plurality of nonvolatile memories, and the RAM device 4230 may include a plurality of DRAMs. In example embodiments, the nonvolatile memories may be used as storage of the computing system 4000 through the processor 4100. In example embodiments, each of the nonvolatile memories may include nonvolatile memory elements such as EEPROM, NAND flash memory, PRAM, resistive RAM (ReRAM), FRAM, STT-MRAM, and the like.

The DRAMs may be used as a main memory of the computing system 4000 through the processor 4100. In example embodiments, the RAM device 4230 may include random access memory elements such as DRAM, SRAM, SDRAM, PRAM, ReRAM, FRAM, MRAM, and the like.

The control circuit 4210 may include a device controller 4211 and an SPD chip 4212. The device controller 4211 may receive a command CMD, an address ADDR, and a clock CK from the processor 4100. The device controller 4211 may selectively store data, received through the data signal DQ and the data strobe signal DQS, in the nonvolatile memory device 4220 or the RAM device 4230 in response to signals received from the processor 4100. Alternatively, the device controller 4211 may selectively transfer data, stored in the nonvolatile memory device 4220 or the RAM device 4230, to the processor 4100 through the data signal DQ and the data strobe signal DQS in response to signals received from the processor 4100.

In example embodiments, the processor 4100 may selectively access the nonvolatile memory device 4220 or the RAM device 4230 through a command CMD, an address ADDR, or a separate signal or separate information. That is, the processor 4100 may selectively access the nonvolatile memory device 4220 or the RAM device 4230 included in the nonvolatile memory module 4200. In example embodiments, the device controller 3211 may set page data up in the nonvolatile memory device 4220 or may perform a program operation, based on an operating method described with reference to FIGS. 1 to 15.

Figure 23:
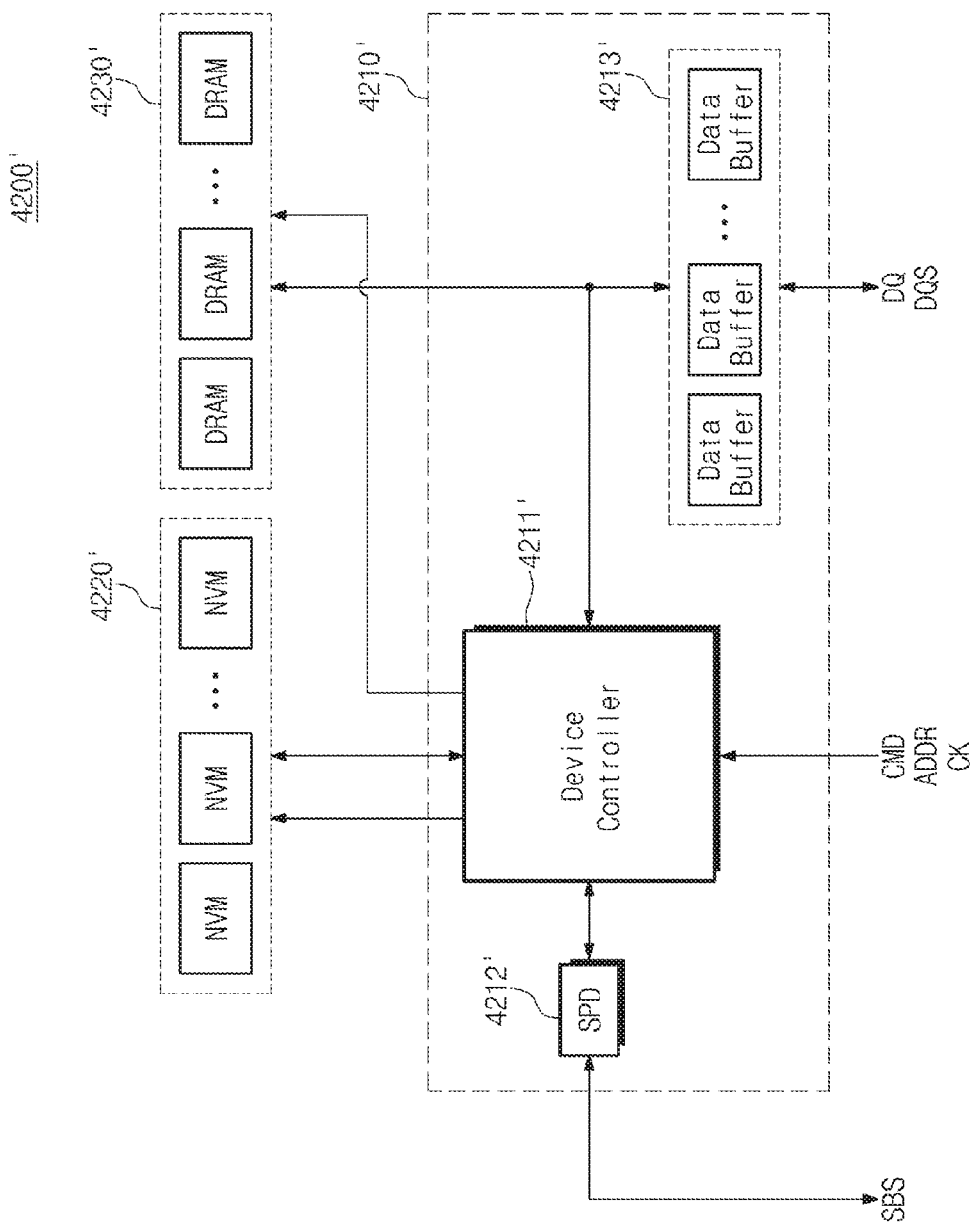
FIG. 23 is a block diagram schematically illustrating a nonvolatile memory module illustrated in FIG. 21.

FIG. 23 is a block diagram schematically illustrating a nonvolatile memory module illustrated in FIG. 21. In example embodiments, a nonvolatile memory module 4200' illustrated in FIG. 23 may be of the form of a dual in-line memory module (DIMM) and may be mounted on a DIMM socket so as to communicate with the processor 4100.

Referring to FIGS. 21 and 23, the nonvolatile memory module 4200' may include a control circuit 4210', a nonvolatile memory device 4220', and a RAM device 4230'. The control circuit 4210' may include a device controller 4211', an SPD 4212', and a data buffer circuit 4213'.

The device controller 4211' may receive a command CMD, an address ADDR, and a clock CK from the processor 4100. The device controller 4211' may control the nonvolatile memory device 4220' or the RAM device 4230' in response to received signals. For example, as described with reference to FIG. 22, the processor 4100 may selectively access the nonvolatile memory device 4220' or the RAM device 4230'. The device controller 4211' may control the nonvolatile memory device 4220' or the RAM device 4230' under control of the processor 4100.

The data buffer circuit 4213' may receive the data signal DQ and the data strobe signal DQS from the processor 4100 and may provide the received signals to the device controller 4211' and the RAM device 4230'. Alternatively, the data buffer circuit 4213' may provide data, received from the device controller 4211' or the RAM device 4230', to the processor 4100 through the data signal DQ and the data strobe signal DQS.

In example embodiments, in the case where the processor 4100 stores data in the nonvolatile memory device 4220', data received through the data signal DQ and the data strobe signal DQS may be provided to the device controller 4211', and the device controller 4211' may process the received data and may provide the processed data to the nonvolatile memory device 4220'. In example embodiments, the device controller 4211' may set page data up in the nonvolatile memory device 4220' or may perform a program operation, based on an operating method described with reference to FIGS. 1 to 15.

Alternatively, in the case where the processor 4100 reads data stored in the nonvolatile memory device 4220', the data buffer circuit 4213' may provide data provided from the device controller 4211' to the processor 4100 through the data signal DQ and the data strobe signal DQS.

In the case where the processor 4100 stores data in the RAM device 4230', data provided to the data buffer circuit 4213' may be provided to the RAM device 4230', and the data buffer circuit 4213' may transfer the received command CMD, addresses ADDR, and clock CK to the RAM device 4230'.

Alternatively, when the processor 4100 reads data stored in the RAM device 4230', the data buffer circuit 4213' may transfer the received command CMD, addresses ADDR, and clock CK to the RAM device 4230', and the RAM device 4230' may provide data to the data buffer circuit 4213' in response to the transferred signals. At this time, the data buffer circuit 4213' may provide data to the processor 4100 through the data signal DQ and the data strobe signal DQS.

Figure 24:
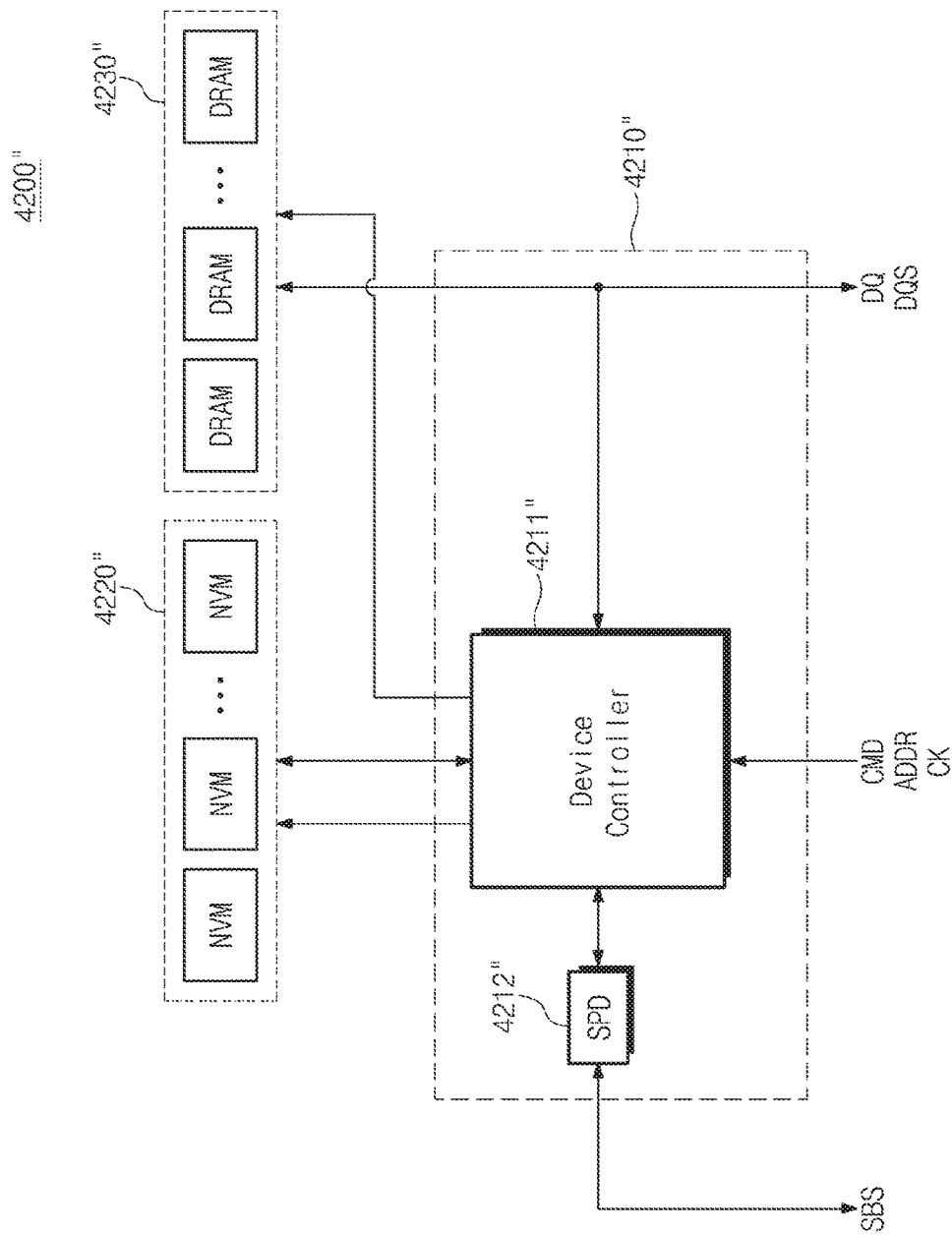
FIG. 24 is a block diagram schematically illustrating a nonvolatile memory module illustrated in FIG. 21.

FIG. 24 is a block diagram schematically illustrating a nonvolatile memory module illustrated in FIG. 21. Referring to FIGS. 21 and 24, the nonvolatile memory module 4200" may include a control circuit 4210", a nonvolatile memory device 4220", and a RAM device 4230". The control circuit 4210" may include a device controller 4211" and an SPD chip 4212".

The nonvolatile memory module 4200" of FIG. 24 may operate to be similar to the nonvolatile memory module 4200' of FIG. 23. However, the nonvolatile memory module 4200" of FIG. 24 may not include the data buffer circuit 4213' unlike the nonvolatile memory module 4200' of FIG. 23. That is, the nonvolatile memory module 4200" of FIG. 24 may directly provide data, received from the processor 4100 through the data signal DQ and the data strobe signal DQS, to the data controller 4211" or the RAM device 4230". Alternatively, data from the device controller 4211" of the nonvolatile memory module 4200" or data from the RAM device 4230" thereof may be directly provided to the processor 4100 through the data signal DQ and the data strobe signal DQS.

In example embodiments, the nonvolatile memory module 4200' of FIG. 23 may be a memory module of an LRDIMM shape, and the nonvolatile memory module 4200″ of FIG. 24 may be a memory module of an RDIMM shape.

In example embodiments, the device controller 4211″ may set page data up in the nonvolatile memory device 4220″ or may perform a program operation, based on an operating method described with reference to FIGS. 1 to 15.

Figure 25:
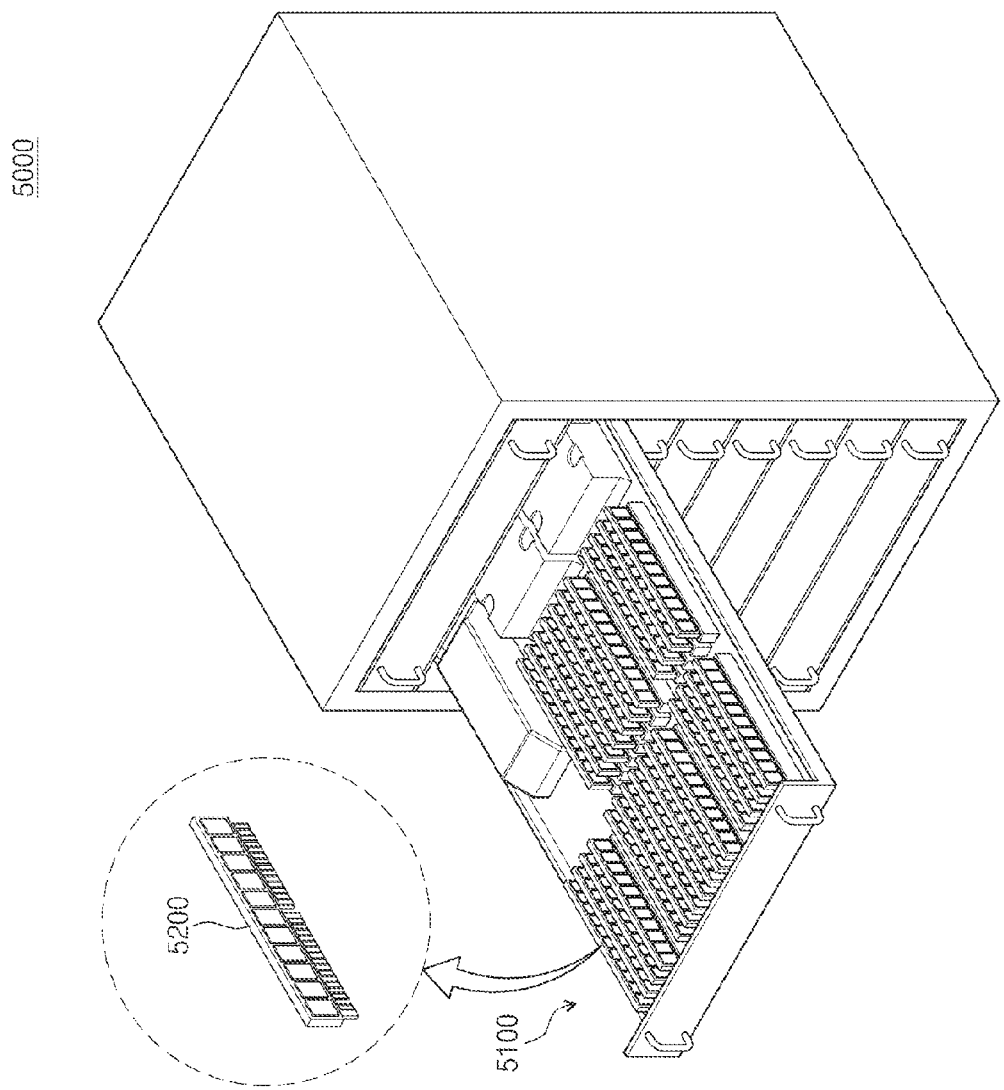
FIG. 25 is a diagram schematically illustrating a server system to which a nonvolatile memory system according to an embodiment of the disclosure is applied.

FIG. 25 is a diagram schematically illustrating a server system to which a nonvolatile memory system according to an embodiment of the disclosure is applied. Referring to FIG. 25, a server system 5000 may include a plurality of server racks 5100. Each of the server racks 5100 may include a plurality of nonvolatile memory modules 5200. The nonvolatile memory modules 5200 may be directly connected with processors respectively included in the server racks 5100. For example, the nonvolatile memory modules 5200 may have the form of a dual in-line memory module and may be mounted on a DIMM socket electrically connected with a processor so as to communicate with the processor. In example embodiments, the nonvolatile memory modules 5200 may be used as storage of the server system 5000. In example embodiments, the nonvolatile memory modules 5200 may be nonvolatile memory modules described with reference to FIGS. 18 to 24, and the nonvolatile memory modules 5200 may perform a page data setup operation or a program operation, based on an operating method described with reference to FIGS. 1 to 15.

As described above, the nonvolatile memory system according to the disclosure may alternately set page data up in a plurality of nonvolatile memory devices, which communicate with a memory controller through one channel, at a program operation. Accordingly, it may be possible to reduce a time delay due to a dummy busy time occurring when page data is dumped or a plane is changed at a multi-plane program operation. This may mean that the performance of the nonvolatile memory system is improved.

Figure 26:
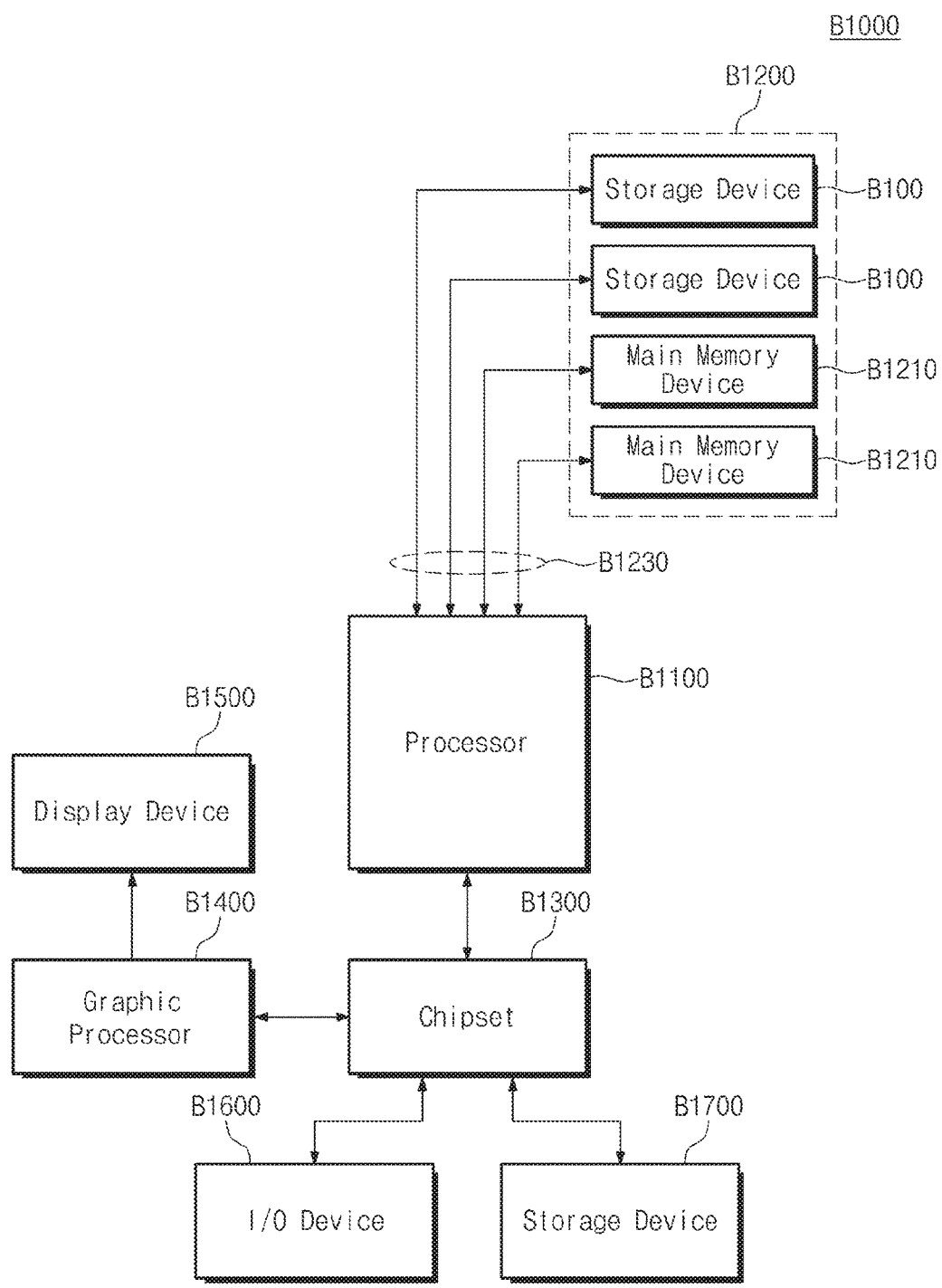
FIG. 26 is a block diagram illustrating a computing system according to an embodiment of the disclosure.

FIG. 26 is a block diagram illustrating a computing system according to an embodiment of the disclosure. Referring to FIG. 26, a computing device B1000 may include a processor B1100, a high-speed storage device B1200, a chipset B1300, a graphic processor B1400, a display device B1500, an input/output device B1600, and a storage device B1700. High-speed storage device B1200 may include storage devices B100 and main memory devices B1210. The computing device B1000 of FIG. 26 is similar to a user system 3000 of FIG. 18, and a description about duplicated components is thus omitted.

The display device B1500 may output an image under control of the graphic processor B1400. For example, the display device B1500 may include a liquid crystal display (LCD) device, a light emitting diode (LED) display device, a beam projector, and the like.

A communication speed of the storage device B1200 (e.g., a communication speed with the processor B1100) directly connected with the processor B1100 through the high-speed interface B1230 may be higher than that of the storage device B1700 (e.g., a communication speed with the chipset B1300) connected to the chipset B1300. Accordingly, the operating performance of the computing device B1000 may be improved if the storage device B1200 connected with the processor B1100 through the high-speed interface 1230 is provided.

Figure 27:
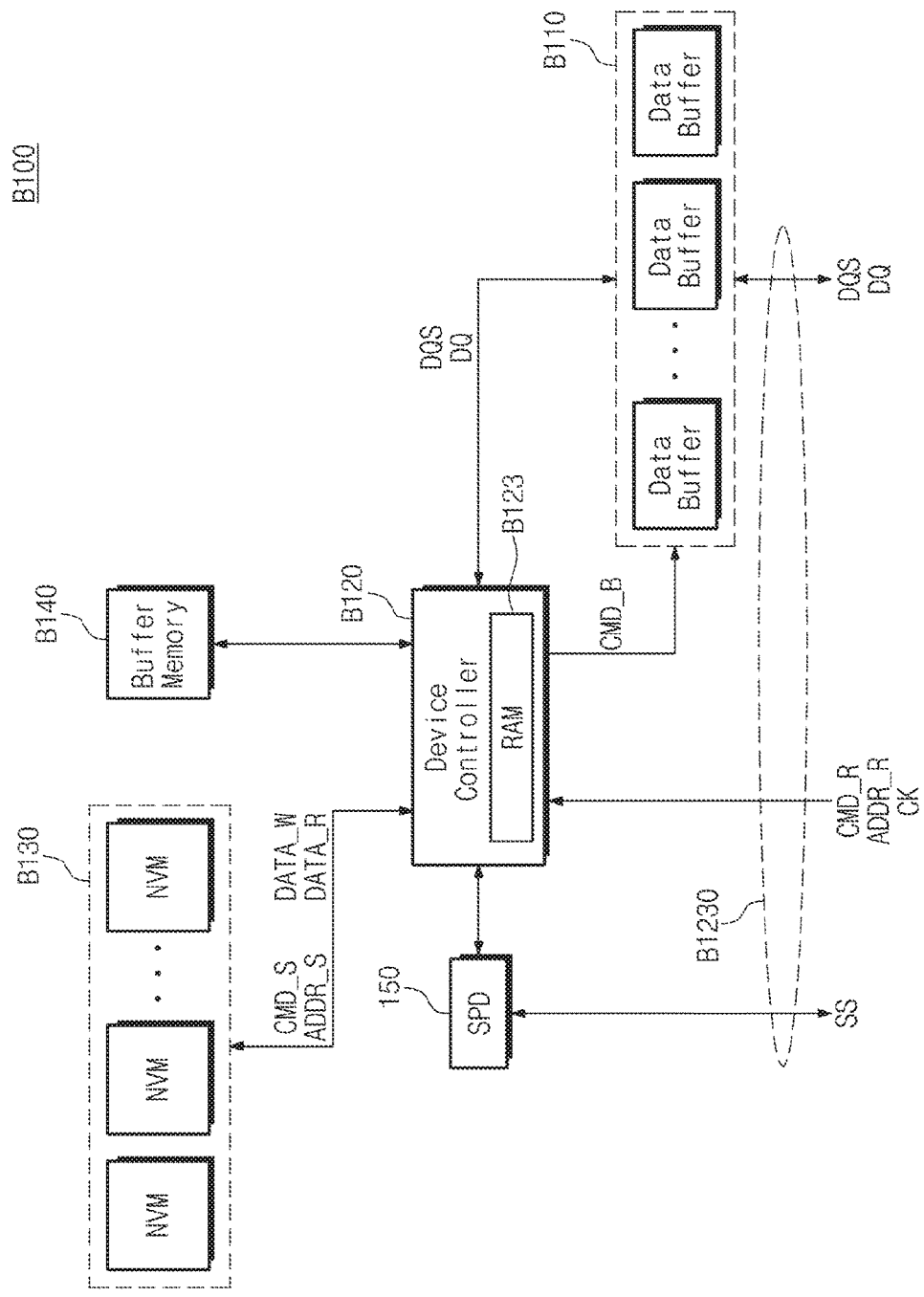
FIG. 27 is a block diagram illustrating a storage device according to an embodiment of the disclosure.

FIG. 27 is a block diagram illustrating a storage device according to an embodiment of the disclosure. Referring to FIGS. 26 and 27, the storage device B100 may include data buffers B110, a device controller B120, nonvolatile memories (NVM) B130, a buffer memory B140, and a serial presence detect (SPD) B150. In example embodiments, the storage device B100 may be similar to a nonvolatile memory system 3300 described with reference to FIG. 20. A detailed description about components, which are described with reference to FIG. 20, from among components of the storage device B100 is thus omitted.

The data buffers B110 may receive data signals DQ and data strobe signals DQS from the processor B1100 through the high-speed interface B1230. The data buffers B110 may be configured according to a manner defined by the DDR4 LRDIMM specification. For example, the storage device B100 may include nine data buffers B110. Each of the data buffers B110 may transmit and receive eight data signals DQ and two data strobe signals DQS to and from an external device, for example, the processor B1100. The data buffers B110 may transact data signals DQ and data strobe signals DQS with the device controller B120.

The device controller B120 may receive the data signals DQ and the data strobe signals DQS from the data buffers B110. The device controller B120 may receive a RAM command CMD_R, a RAM address ADDR_R, a clock CK from the processor B1100 through the high-speed interface B1230.

The RAM command CMD_R may be a command for requesting an access to an internal RAM B123 of the device controller B120. The RAM address ADDR_R may be an address belonging to an address range of the RAM B123. The device controller B120 may write data, which is received through data signals DQ of the high-speed interface B1230, in response to the RAM command CMD_R and RAM address ADDR_R received through the high-speed interface B1230. The device controller B120 may write data, which is stored in the RAM B123, in response to the RAM command CMD_R and the RAM address ADDR_R received through the high-speed interface B123. That is, a physical layer of the processor B1100 may recognize the RAM B123 of the storage device B100 as being connected to the high-speed interface B1230. The physical layer of the processor B1100 may access the RAM B123 using the RAM command CMD_R and the RAM address ADDR_R.

The device controller B120 may detect a storage command CMD_S and a storage address ADDR_S of the nonvolatile memory B130 from data stored in the RAM B123. The device controller B120 may write, in the nonvolatile memories B130, write data DATA_W of data stored in the RAM B123 in response to the storage command CMD_S and the storage address ADDR_S. The device controller B120 may read data from the nonvolatile memories B123 in response to the storage command CMD_S and the storage address ADDR_S and may store the read data DATA_R in the RAM B123. That is, an upper layer of the physical layer of the processor B1100, for example, a device driver of the processor B1100 may recognize the nonvolatile memories B130 as being connected to the high-speed interface B1230 through the RAM B123. The device driver of the processor B1100 may transact the storage command CMD_S, the storage address ADDR_S, and data of the nonvolatile memories B130 with the storage device B100 through the data signals DQ of the high-speed interface B1230.

The device controller B120 may transmit a buffer command CMD_B to the data buffers B110. For example, the device controller B120 may output the buffer command CMD_B in response to the RAM command CMD_R or the RAM address ADDR_R or without the RAM command CMD_R or the RAM address ADDR_R. The buffer command CMD_B may be transmitted in common to the data buffers 110.

The device controller B120 may be configured to control the buffer memory B140 and to communicate with the buffer memory B140. The buffer memory B140 may include random access memories such as DRAM, SRAM, PRAM, MRAM, RRAM, FeRAM, and the like. The device controller B120 may load metadata for managing the nonvolatile memories B130 onto the buffer memory B140. For example, the device controller B120 may load, onto the buffer memory B140, a mapping table including mapping information between logical addresses, allocated to the nonvolatile memories B130 by the processor B1100, and physical addresses of the nonvolatile memories B130. The device controller B120 may read the mapping table from the nonvolatile memories B130 and may load the read mapping table onto the buffer memory B140. In example embodiments, the buffer memory B140 may be included in the device controller B123.

The SPD B150 may be configured to communicate with the processor B1100 through supplemental signals of the high-speed interface B1230. Furthermore, the SPD B150 may be configured to communicate with the device controller B120 through the supplemental signals SS. The supplemental signals may include serial peripheral interface (SPI) signals, inter-integrated circuits (I2C) signals, universal asynchronous receiver/transmitter (UART) signals, and the like. For example, the SPD B150 may store information about physical, logical, and driving characteristics of the storage device B100. When power is supplied to the computing device B1000, information stored in the SPD B150 may be read through the supplemental signals SS of the high-speed interface B1230 by the processor B1100.

Figure 28:
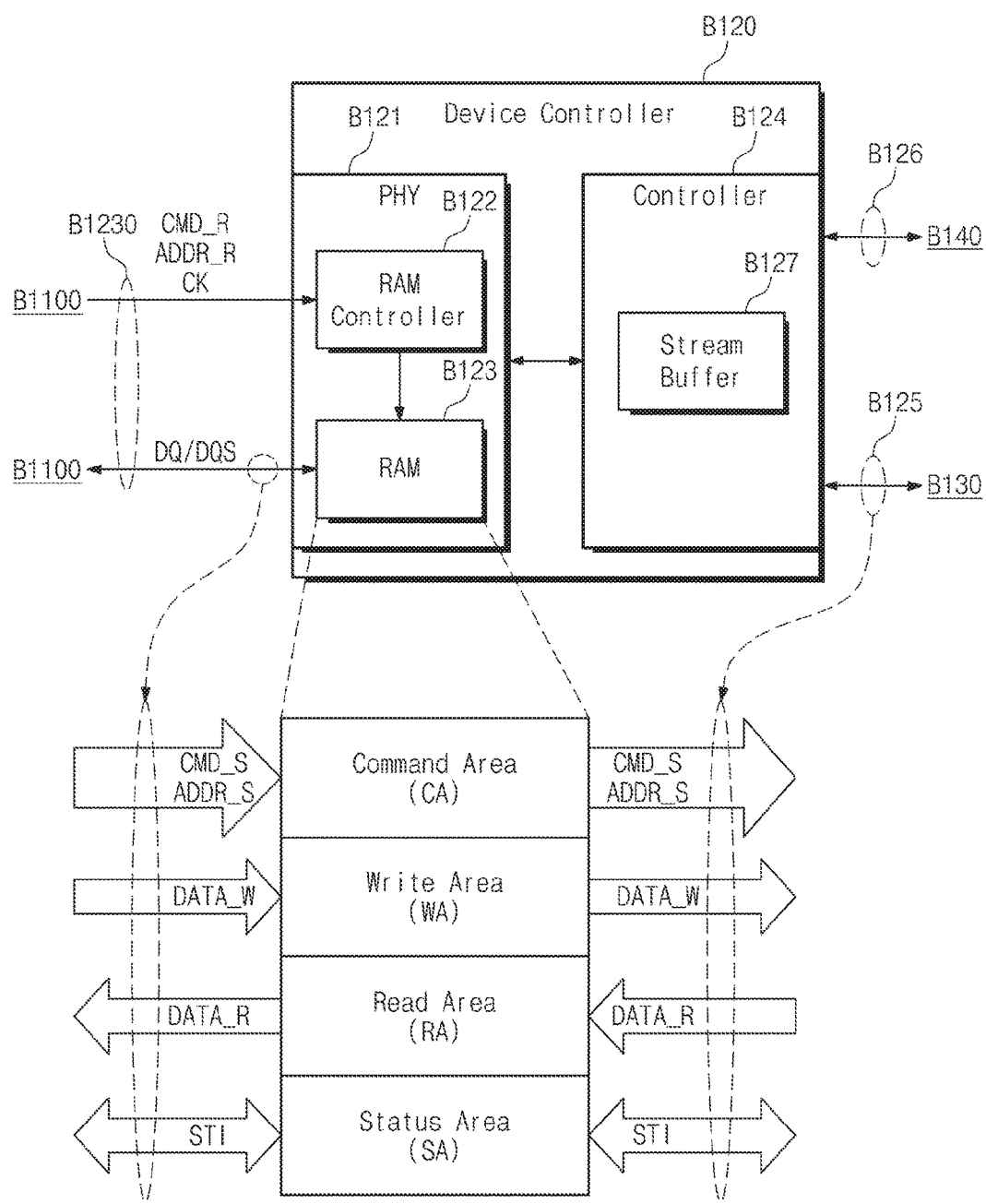
FIG. 28 is a block diagram illustrating a computing system according to an embodiment of the disclosure.

FIG. 28 is a block diagram illustrating a computing system according to an embodiment of the disclosure. Referring to FIGS. 26 to 28, the device controller B120 may include a physical layer circuit (PHY) B121 and a controller B124.

The physical layer circuit B121 may be configured to support a communication method defined by the specification of the high-speed interface B1230. For example, the physical layer circuit B121 may be configured to support a communication method defined by the specification of the DIMM, in detail, the RDIMM or LRDIMM. The physical layer circuit B121 may include a RAM controller B122 and a RAM B123.

The RAM controller B122 may be configured to receive a RAM command CMD_R, a RAM address ADDR_R, and a clock CK through the high-speed interface B1230. The RAM controller B122 may control the RAM B123 based on the RAM command CMD_R, the RAM address ADDR_R, and the clock CK. For example, the RAM controller B122 may parse a request of the processor B1100, based on the RAM command CMD_R and the RAM address ADDR_R. Based on the parsing result, the RAM controller B122 may perform control such that the RAM B123 transacts data signals DQ and data strobe signals DQS with the processor B1100.

The RAM B123 may transact the data signals DQ and the data strobe signals DQS with the processor B1100 through the high-speed interface B1230 under control of the RAM controller B122. In example embodiments, the high-speed interface B1230 may have a signal system which is based on a first type memory, for example, SDRAM. The RAM B123 may have a signal system which is based on a second type memory, for example, SRAM. Accordingly, the RAM B123 may not directly receive the RAM command CMD_R, the RAM address ADDR_R, and the clock CK from the processor B1100 through the high-speed interface B1230, but the RAM B123 may transact the data signals DQ and the data strobe signals DQS with the processor B1100 under control of the RAM controller B122.

In example embodiments, a storage space of the RAM 123 may be divided into a command area CA, a write area WA, a read area RA, and a state area SA.

A storage command CMD_S and a storage address ADDR_S which are stored into the RAM B123 from the processor B1100 using the data signals DQ may be written in the command area CA. Write data DATA_W which is stored into the RAM B123 from the processor B1100 using the data signals DQ may be written in the write area WA. Read data DATA_R which is read by the processor B1100 from the RAM 123 as the data signals DQ may be read from the read area RA. Status information STI which is exchanged with the RAM B123 as the data signals DQ by the processor B1100 may be conveyed in the state area SA. The status information STI may indicate information about an operating state of the processor B1100 or the storage device B100.

A controller B124 may communicate with the nonvolatile memories B130 through a first interface B125 and may communicate with the buffer memory B140 through a second interface B126. For example, the first interface B125 may include a communication interface for NAND flash memory, PRAM, MRAM, RRAM, or FeRAM. The second interface B126 may include a communication interface for SDRAM.

The controller B124 may perform descrambling or error correction decoding of a storage command CMD_S and a storage address ADDR_S which are stored in the command area CA of the RAM B123 and may transmit resultant information to the nonvolatile memories B130 through the first interface B125. The controller B124 may transmit write data DATA_W, which is stored in the write area WA of the RAM B123, to the nonvolatile memories B130 through the first interface B125. The controller B124 may write data DATA_R read from the nonvolatile memories B130 at the read area RA of the RAM 123. The controller B124 may write various information such as processing information of a write or read operation of the nonvolatile memories B130, information of an operating state of the storage device B100, and the like, in the state area SA of the RAM B123 as the status information STI. Furthermore, the controller B124 may read various status information STI written in the state area SA through the high-speed interface B1230.

A physical layer circuit B121 may be configured to output a buffer command CMD_B to the data buffers B110. For example, the physical layer circuit B121 may be configured to output the buffer command CMD_B based on the RAM command CMD_R or the RAM address ADDR_R.

In example embodiments, the controller B124 may transact the storage command CMD_S, the storage address ADDR_S, the write data DATA_W, and the read data DATA_R with the nonvolatile memories B130 as input/output signals of the first interface B125. The storage command CMD_S, the storage address ADDR_S, the write data DATA_W, and the read data DATA_R may be conveyed through common input/output lines. The controller B124 may further transact control signals, which are used to control the nonvolatile memories B130, with the nonvolatile memories B130 through the first interface B125. The control signals may be conveyed through control lines separated from input/output lines.

For example, the controller B124 may transmit, to the nonvolatile memories B130, at least one of a chip enable signal /CE for selecting at least one of at least one chip of the nonvolatile memories B130, a command latch enable signal CLE indicating that a signal transmitted with input/output signals is the storage command CMD_S, an address latch enable signal ALE indicating that a signal transmitted with input/output signals is the storage address ADDR_S, a read enable signal /RE periodically toggled at reading and used to tune timing, a write enable signal /WE activated when a command or an address is transmitted, a write protection signal /WP activated to prevent unintended writing or erasing when power changes, and a data strobe signal DQS used to adjust synchronization of write data DATA_W and periodically toggled at writing. Furthermore, the controller B124 may receive, from the nonvolatile memories B130, a ready/busy signal R/nB indicating whether the nonvolatile memories 130 are performing a program, erase or read operation and a data strobe signal DQS used to adjust synchronization of read data DATA_R and generated from the read enable signal /RE by the nonvolatile memories 130 so as to be periodically toggled. In example embodiments, the controller B124 may control at least one of the nonvolatile memories B130 based on a program operation described with reference to FIGS. 1 to 25.

The controller B124 may include a stream buffer B127. The processor B1100 may assign a stream identifier SID to write data based on a characteristic of the write data to be stored in the nonvolatile memories B130. The processor B1100 may write the write data DATA_W and the stream identifier SID at the write area WA of the RAM B123 through the high-speed interface B1230. The controller B124 may read the write data DATA_W and the stream identifier SID from the write area WA of the RAM B123. The controller B124 may store the write data DATA_W in the stream buffer B127 and may manage the stored write data DATA_W based on the stream identifier SID.

The controller B124 may program the write data DATA_W having the same stream identifier SID at the same memory block of the nonvolatile memories B130. The controller B124 may program the write data DATA_W having different stream identifiers SID at different memory blocks of the nonvolatile memories B130. For example, the nonvolatile memories B130 may include NAND flash memories, and a memory block may be an erase unit of each of the NAND flash memories.

The same stream identifier SID may be assigned to write data DATA_W being similar to each other in characteristic, and different stream identifiers SID may be assigned to write data DATA_W having different characteristics. Accordingly, write data DATA_W being similar to each other in characteristic may be programmed at the same memory block, and write data DATA_W having different characteristics may be programmed at different memory blocks. This may mean that the performance to manage write data DATA_W programmed at the nonvolatile memories B130 is improved.

Figure 29:
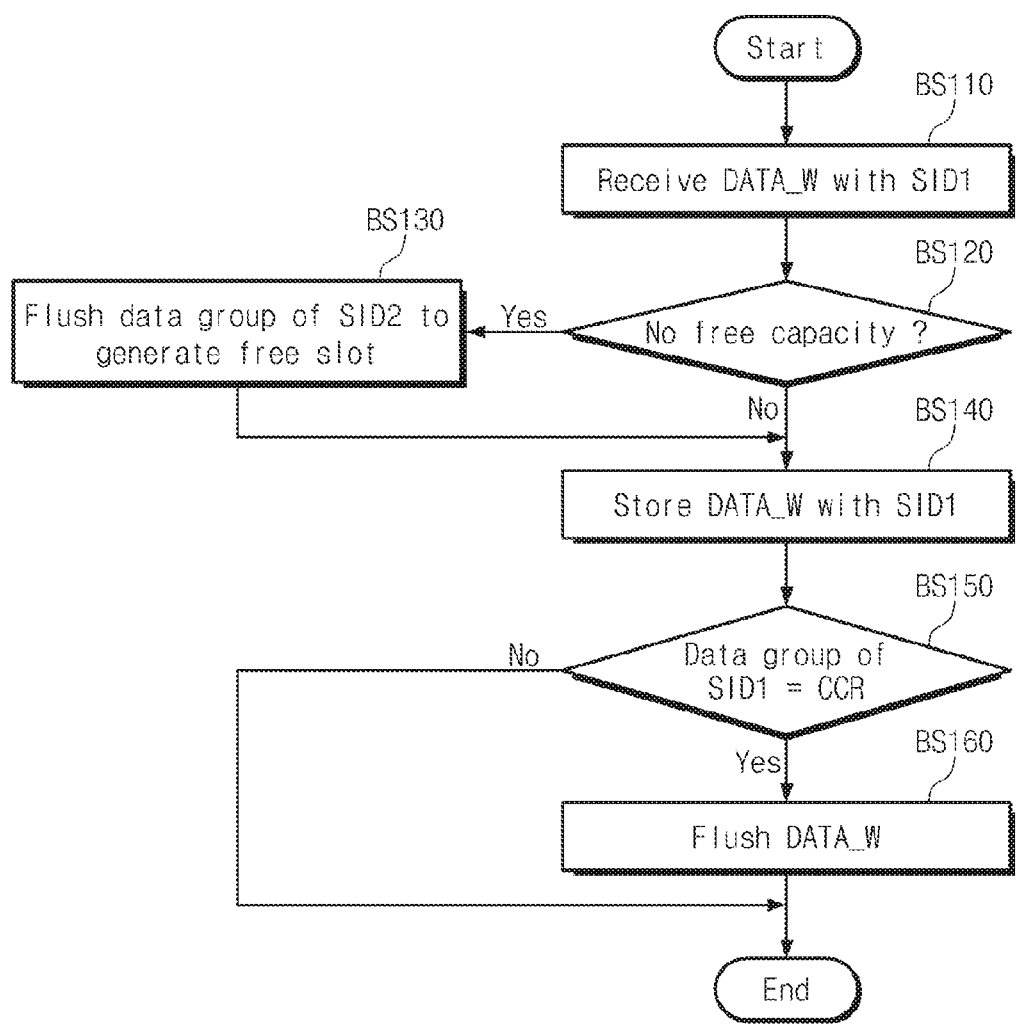
FIG. 29 is a flow chart schematically illustrating a method in which a storage device according to an embodiment of the disclosure manages write data using a stream buffer.

FIG. 29 is a flow chart schematically illustrating a method in which a storage device B100 according to an embodiment of the disclosure manages write data DATA_W using a stream buffer B127. Referring to FIGS. 26 to 29, in step BS110, the storage device B100 may receive write data DATA_W. The write data DATA_W may be received together with a first stream identifier SID1. The write data DATA_W may be received from the processor B1100 through the high-speed interface B1230 as the data signal DQ. The write data DATA_W may be written in a write area WA of the RAM B123.

In step BS120, the controller B124 may determine whether a free capacity (or space) capable of storing the write data DATA_W in the stream buffer B127 exists. If no free capacity exists, in step BS130, the controller B124 may flush a data group, which is corresponding to a second stream identifier SID2 stored in the stream buffer B127, that is, controller B124 may program the data group at the nonvolatile memories B130. For example, the data group may be a group of write data DATA_W, corresponding to a specific stream identifier SID, from among write data DATA_W stored in the stream buffer B127 For example, the second stream identifier SID2 may be different from the first stream identifier SIDE If the free capacity exists in the stream buffer B127 or if the free capacity is obtained by the flush, the method may proceed to step BS140.

In step BS140, the write data DATA_W may be stored in the stream buffer B127 together with the first stream identifier SIDE For example, if a data group corresponding to the first stream identifier SID1 exists in the stream buffer B127, the controller B124 may merge the write data DATA_W with the data group. If the data group corresponding to the first stream identifier SID1 does not exist in the stream buffer B127, the controller B124 may generate a data group corresponding to the first stream identifier SID1 in the stream buffer B127 and may register the write data DATA_W at the generated data group.

In step BS150, the controller B124 may determine whether a capacity of a data group corresponding to the first stream identifier SID1 reaches a threshold capacity CCR. If the capacity of the data group corresponding to the first stream identifier SID1 reaches the threshold capacity CCR, the controller B124 may flush BS160 the data group corresponding to the first stream identifier SID1, that is, may program it at the nonvolatile memories B130. If the capacity of the data group corresponding to the first stream identifier SID1 is smaller than the threshold capacity CCR, processing of the write data DATA_W may be completed as storing the write data DATA_W in the stream buffer B127.

As described above, the controller B124 may accumulate the write data DATA_W in the stream buffer B127 until the capacity of the data group corresponding to the first stream identifier SID1 reaches the threshold capacity CCR. If the capacity of the data group reaches the threshold capacity CCR, the controller B124 may program BS160 the data group at the nonvolatile memories B130. For example, the threshold capacity may be determined in the light of operating characteristics, operating speeds, and the like of the nonvolatile memories B130 and the controller B124. For example, the write data DATA_W may be received by a unit of 4 KB, and the threshold capacity may be 64 KB.

The processor B1100 may assign a stream identifier SID to the write data DATA_W and may write the stream identifier SID and the write data DATA_W at the storage device B100. Typically, some of stream identifiers SID may be focused on write data DATA_W. For example, the processor B1100 may assign first to fifth stream identifiers SID1 to SID5 to write data DATA_W. In this case, one or two of the five stream identifiers SID1 to SID5 may be intensively assigned. For this reason, even though the capacity of the stream buffer B127 is set to be smaller than the product of five stream identifiers and the threshold capacity CCR, the probability that no free capacity of the stream buffer B127 exists may be very low. Accordingly, a speed of an operation for managing write data DATA_W using the stream identifier SID and the stream buffer B127 may not be reduced.

Furthermore, even though no free capacity of the stream buffer B127 exists, a data group, of which the capacity is smaller than the threshold capacity CCR, from among data groups stored in the stream buffer B127 may be flushed onto the nonvolatile memories B130 (BS130), and thus the free capacity of the stream buffer B127 may be obtained. This may mean that the operating performance and reliability of the storage device B100 are maintained and a manufacturing cost of the storage device B100 is reduced due to a decrease in a capacity of the stream buffer B127.

FIGS. 30 to 35 show methods in which write data DATA_W is managed on a stream buffer B127. Data flows from the RAM B123 to the stream buffer B127 and from the stream buffer B127 to the first interface B125 are respectively illustrated in FIGS. 30 to 35. FIGS. 30 to 35 may be examples for describing, but not limiting, the scope and spirit of the disclosure.

Figure 30:
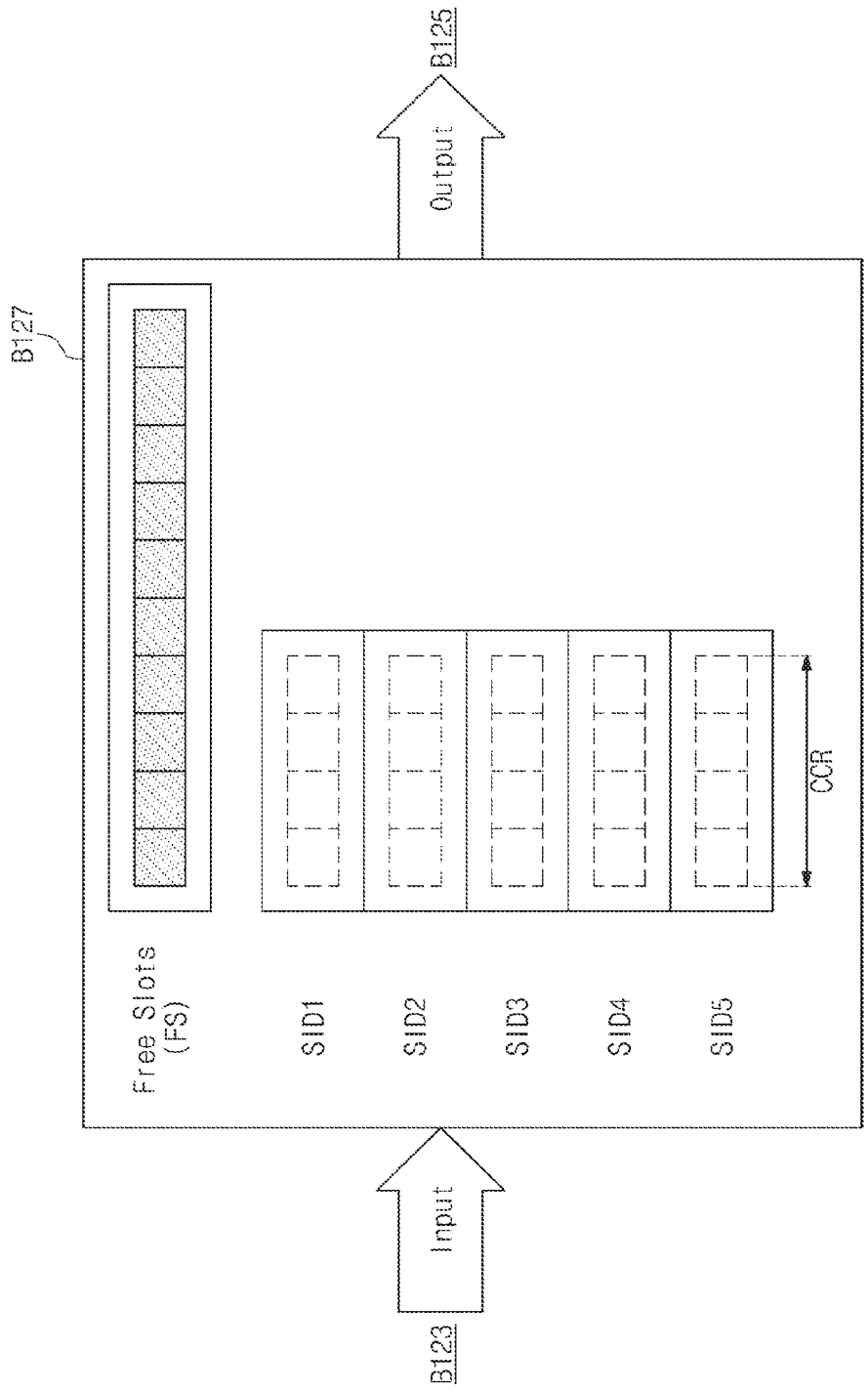
FIGS. 30 to 35 show methods in which write data is managed on a stream buffer.

Referring to FIG. 30, a capacity of the stream buffer B127 may be managed by the slot. For example, a slot capacity may correspond to a unit capacity of write data DATA_W. For example, a slot capacity may be 4 KB.

The write data DATA_W may be received together with one of the first to fifth stream identifiers SID1 to SID5. In example embodiments, a threshold capacity of a data group of each stream identifier SID may correspond to four slots. For example, if four slots are registered at a data group of each stream identifier SID, a corresponding data group may be outputted through the first interface B125.

In FIG. 30, it may be assumed that a slot is not registered at the first to fifth stream identifiers SID1 to SID5 and ten free slots FS exist.

Figure 31:
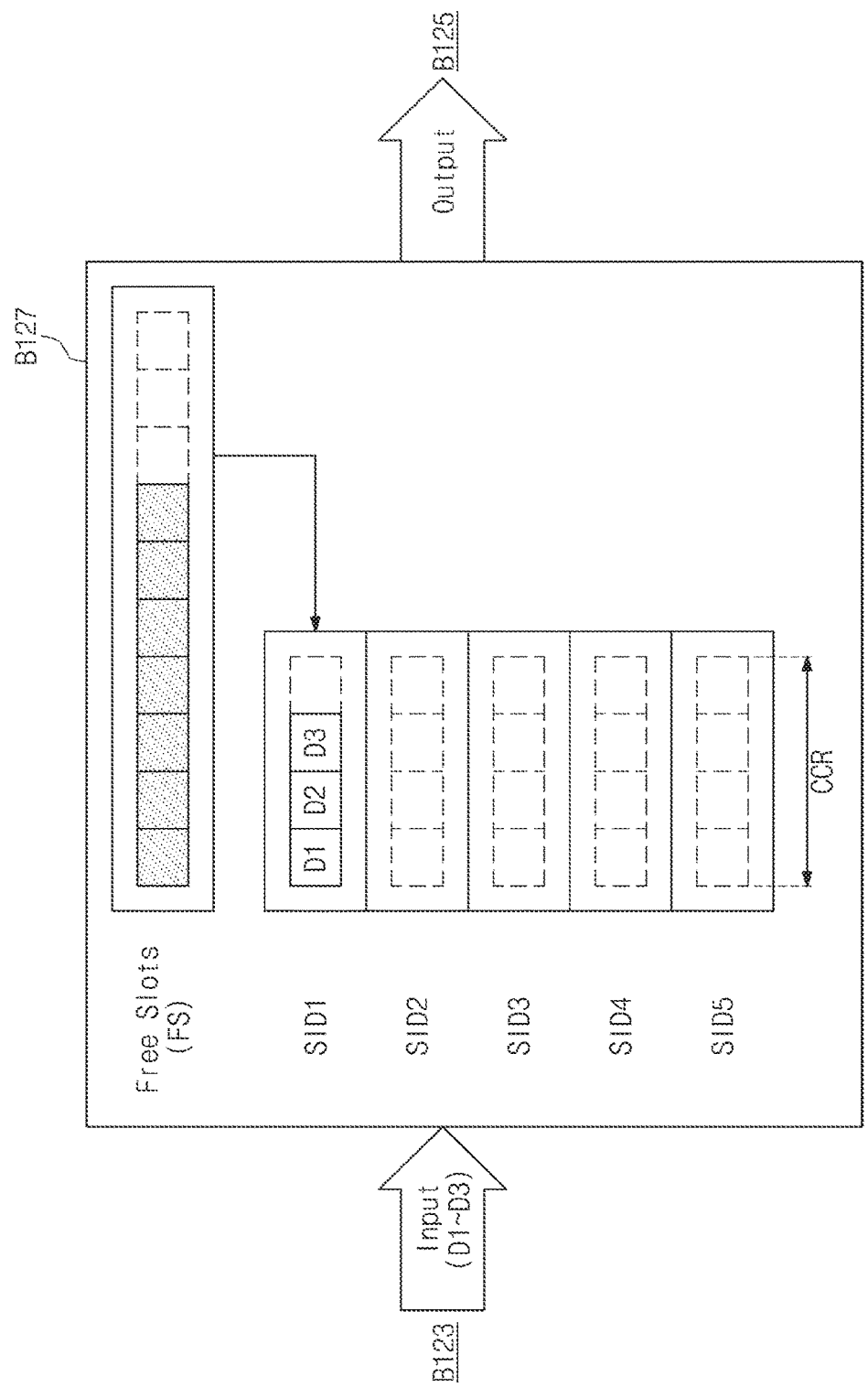

Referring to FIG. 31, first to third data D1 to D3 may be received from the RAM B123 as write data DATA_W. The first to third data D1 to D3 may have the first stream identifier SIDE As the first to third data D1 to D3 are received, the first to third data D1 to D3 may be stored in three free slots FS. The slots where the first to third data D1 to D3 are stored may be registered at a data group of the first stream identifier SID1.

Figure 32:
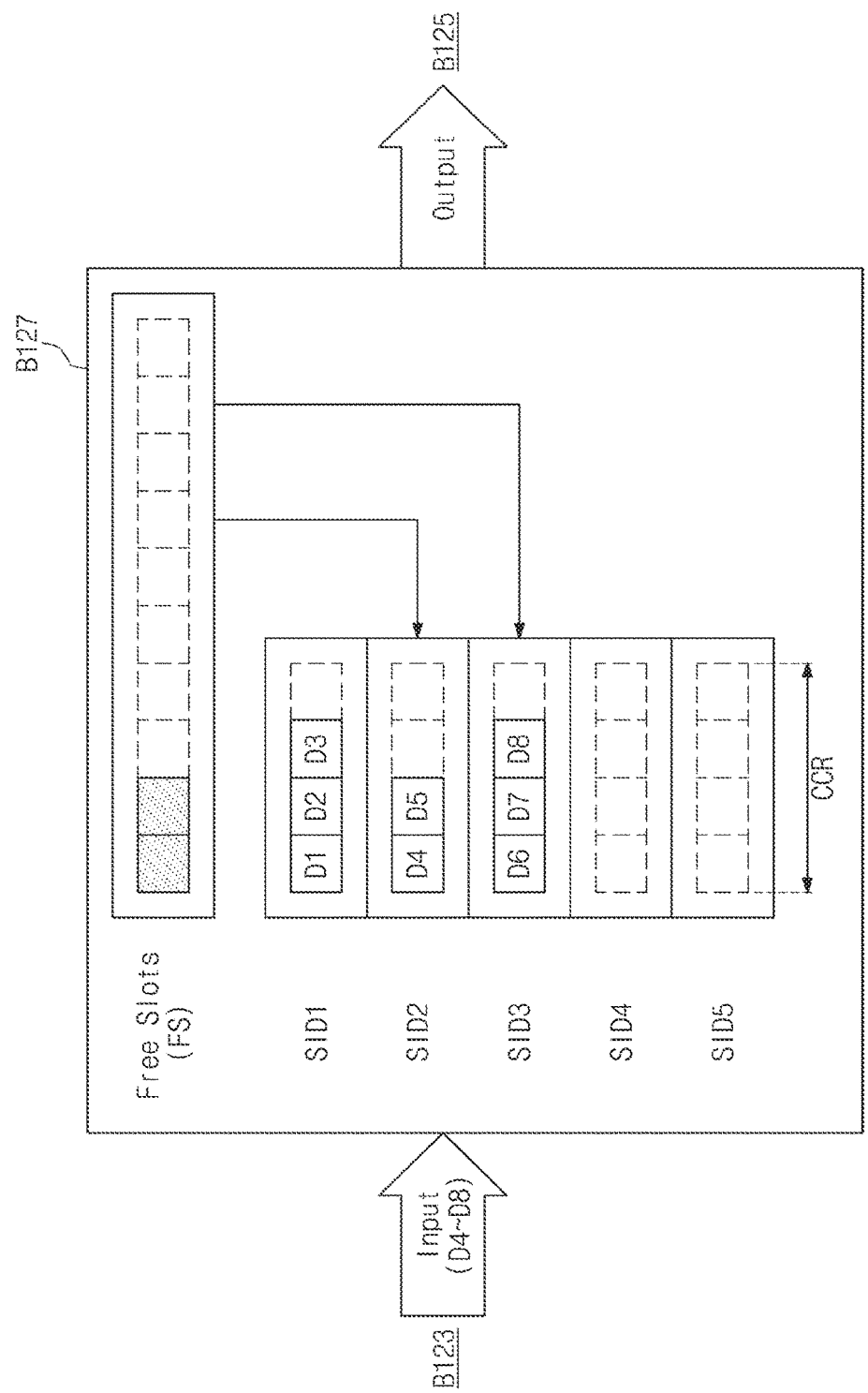

Referring to FIG. 32, fourth to eighth data D4 to D8 may be received from the RAM B123 as write data DATA_W. The fourth and fifth data D4 and D5 may have the second stream identifier SID2. The sixth to eighth data D6 to D8 may have the third stream identifier SID3. The fourth and fifth data D4 and D5 may be stored at two free slots FS and may be registered at a data group of the second stream identifier SID2. The sixth to eighth data D6 to D8 may be stored at three free slots FS and may be registered at a data group of the third stream identifier SID3.

Figure 33:
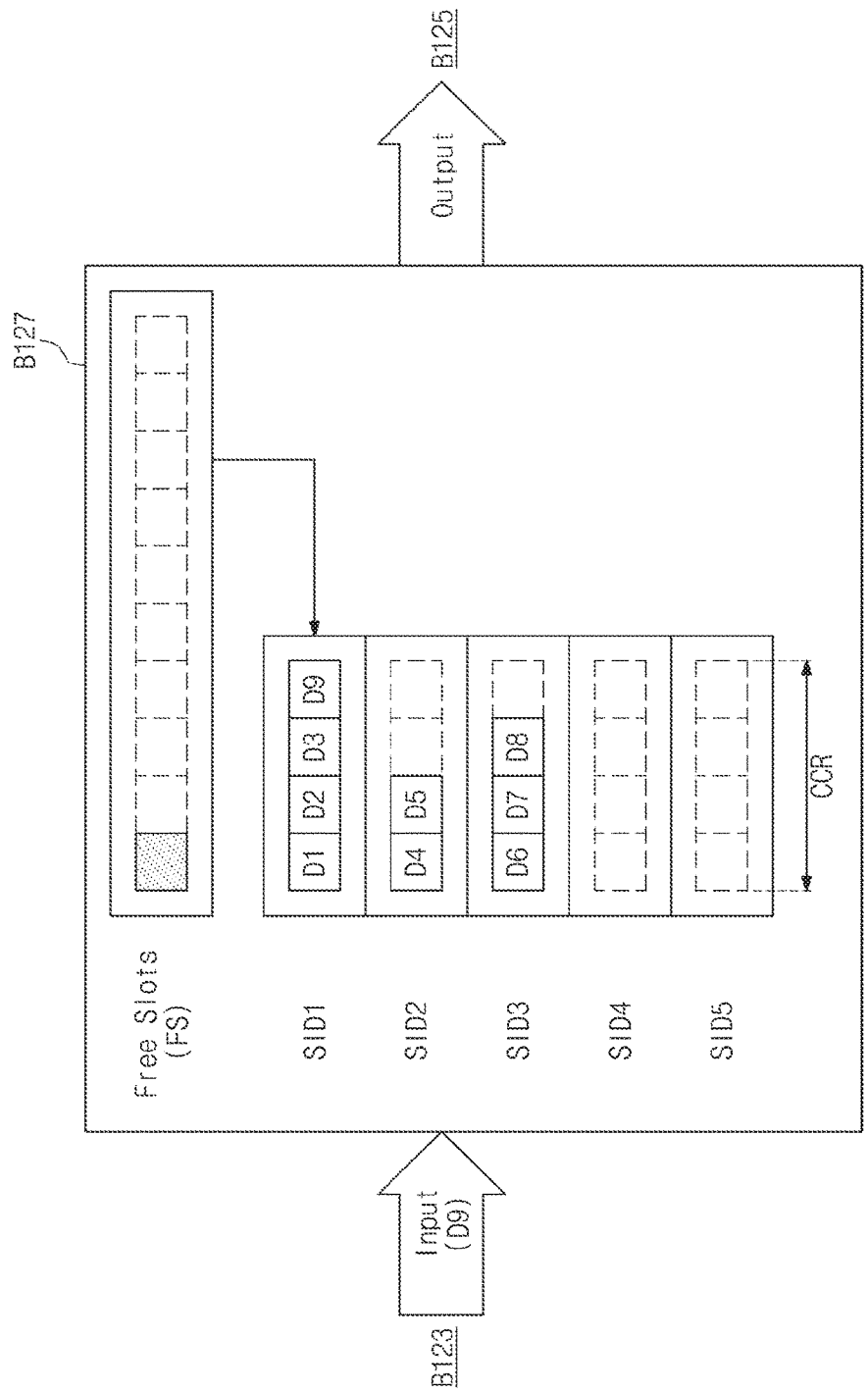
Figure 34:
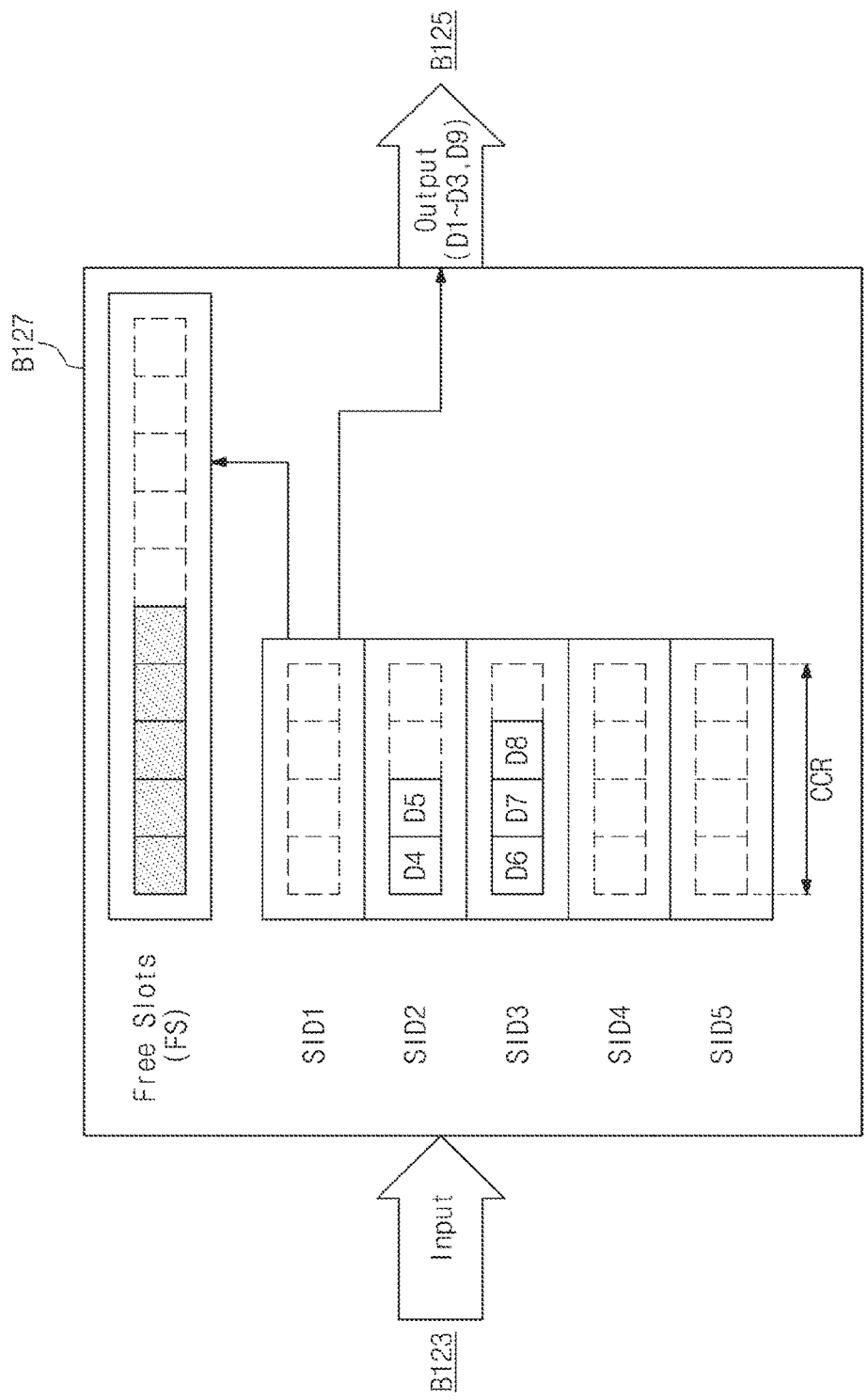

Referring to FIG. 33, ninth data D9 may be received from the RAM B123 as write data DATA_W. The ninth data D9 may have the first stream identifier SID1. The ninth data D9 may be stored in one free slot FS and may be merged with the data group of the first stream identifier SIDE As the ninth data D9 is merged with the data group of the first stream identifier SID1, a capacity of the data group of the first stream identifier SID1 may reach a threshold capacity CCR. Accordingly, the first to third data D1 to D3 and the ninth data D9 may be outputted through the first interface B125. The slots where the first to third data D1 to D3 and the ninth data D9 are stored may be returned to free slots FS, as illustrated in FIG. 34.

Figure 35:
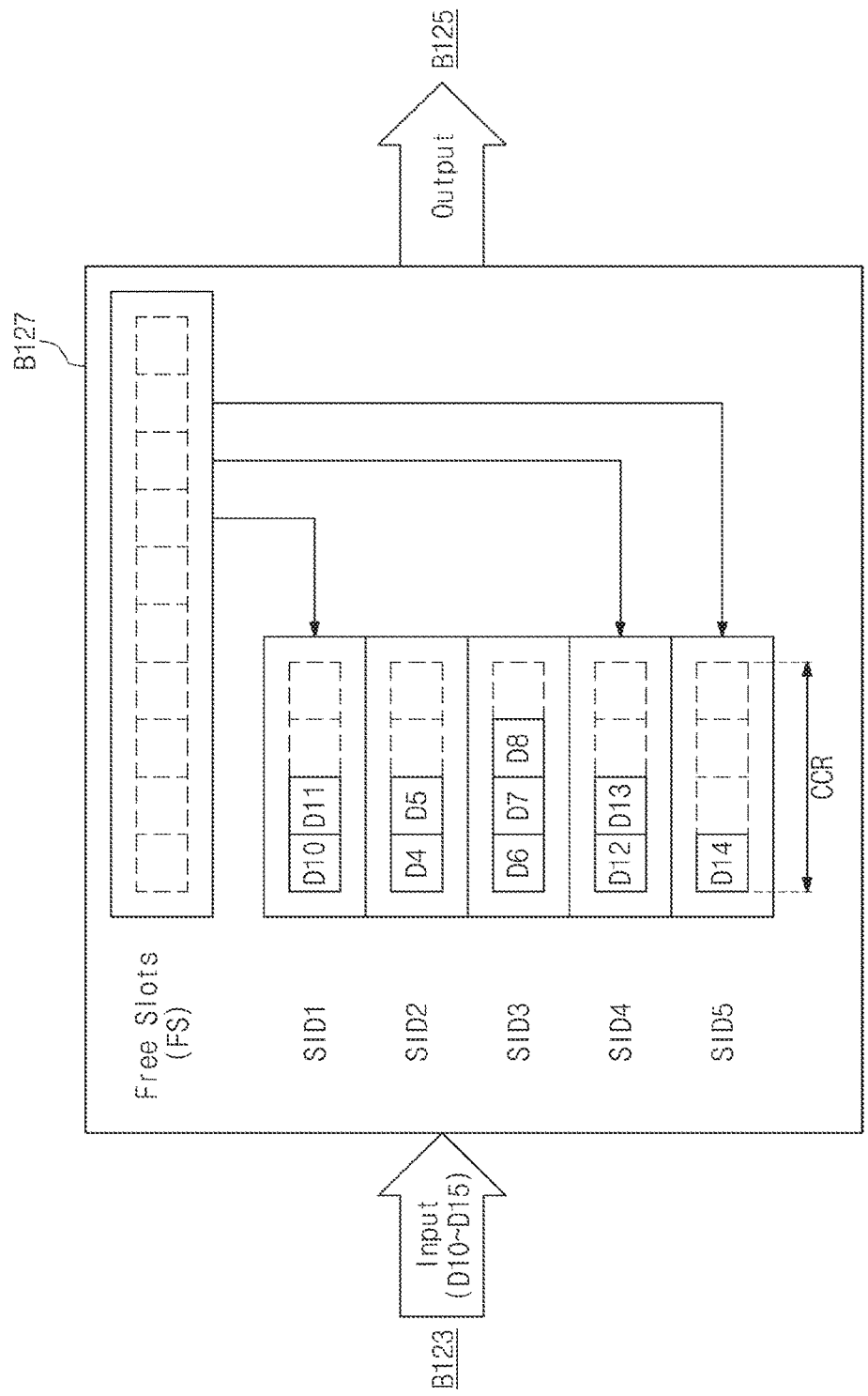

Referring to FIG. 35, tenth to fourteenth data D10 to D14 may be received from the RAM B123 as write data DATA_W. The tenth and eleventh data D10 and D11 may have the first stream identifier SID1. The tenth and eleventh data D10 and D11 may be stored at two free slots FS and may be registered at the data group of the first stream identifier SIDE The twelfth and thirteenth data D12 and D13 may have the fourth stream identifier SID4. The twelfth and thirteenth data D12 and D13 may be stored at two free slots FS and may be registered at a data group of the fourth stream identifier SID4. The fourteenth data D14 may have the fifth stream identifier SID5. The fourteenth data D14 may be stored in one free slot FS and may be registered at a data group of the fifth stream identifier SID5.

If the tenth to fourteenth data D10 to D14 are stored in the stream buffer B127, no free slot FS may exist in the stream buffer B127. If write data DATA_W is additionally received, data groups stored in the stream buffer B127 may be flushed.

Figure 36:
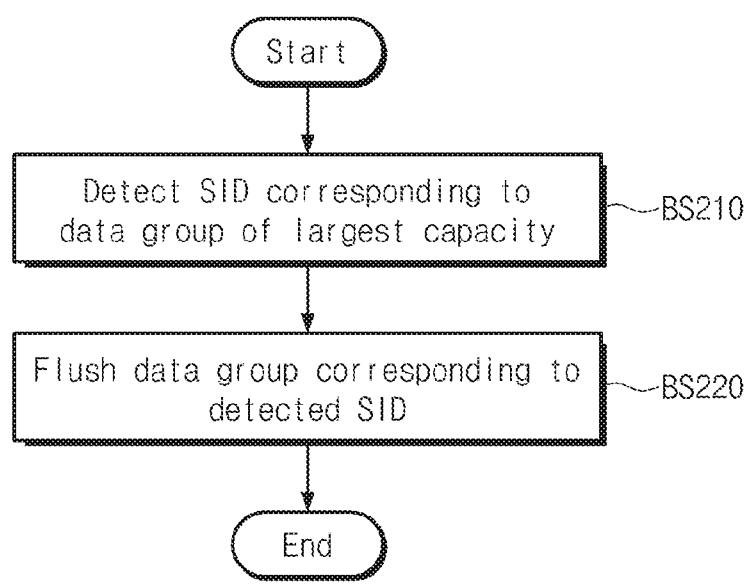
FIG. 36 is a flow chart schematically illustrating an embodiment in which a data group stored in a stream buffer is flushed.

FIG. 36 is a flow chart schematically illustrating an embodiment in which a data group stored in a stream buffer is flushed. Referring to FIGS. 28 and 36, in step BS210, there may be detected a stream identifier SID, which corresponds to a data group having the largest capacity, from among stream identifiers SID1 to SID5. In step BS220, a data group corresponding to the detected stream identifier SID may be flushed. That is, data of a data group, having the largest capacity, from among data groups stored in the stream buffer B127 may be programmed at the nonvolatile memories B130.

Figure 37:
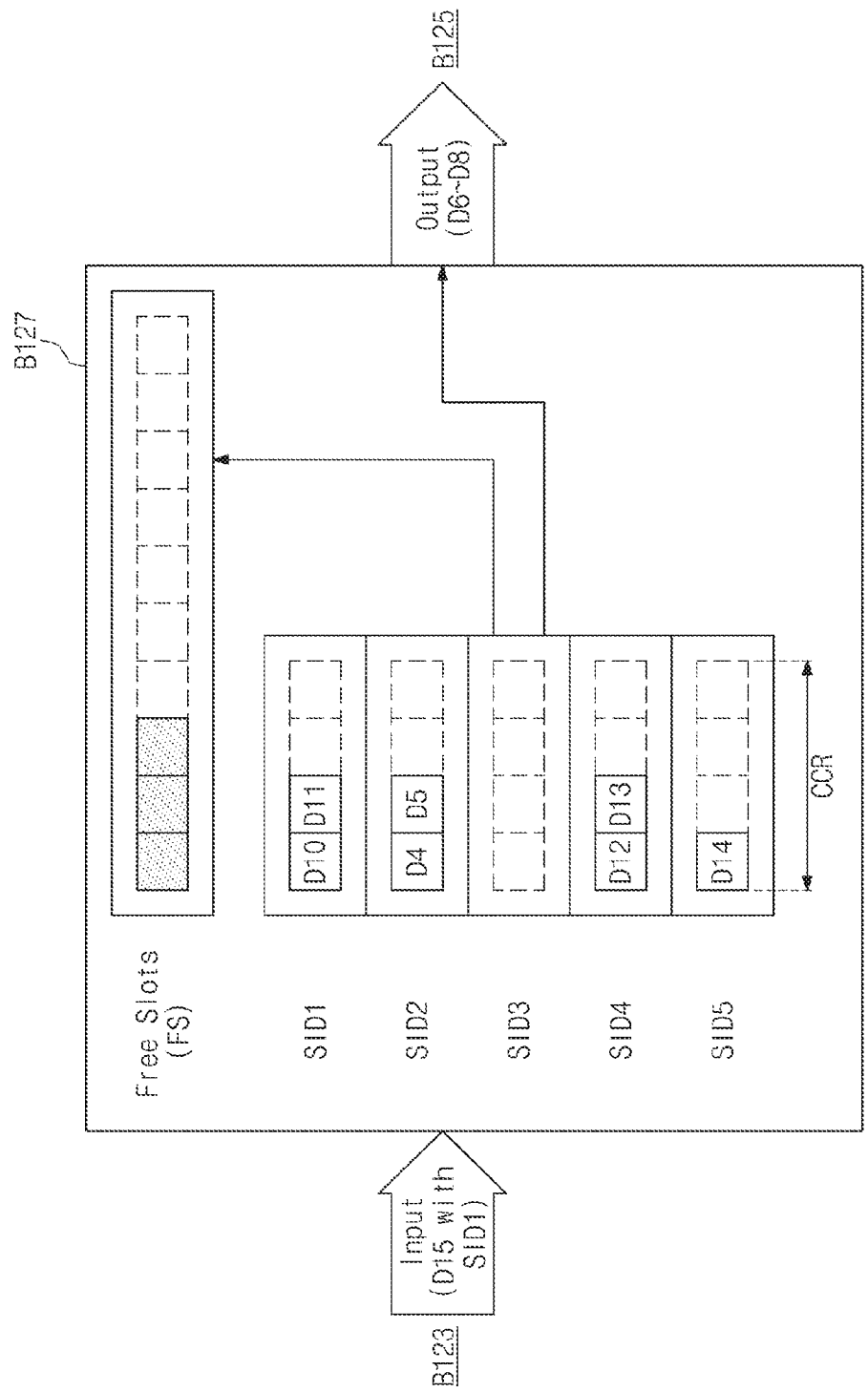
FIG. 37 shows the procedure for flushing a data group according to an example of FIG. 36.

How a data group is flushed according to FIG. 36 is illustrated in FIG. 37. Referring to FIGS. 36 and 37, fifteenth data D15 having the first stream identifier SID1 may be received from the RAM B123 as write data DATA_W. Since no free slot FS exists in the stream buffer B127, the controller B124 may detect a stream identifier SID, corresponding to a data group having the largest capacity, from among stream identifiers SID1 to SID5. For example, the controller B127 may detect a target stream identifier of remaining stream identifiers SID2 to SID5 other than the first stream identifier SID1 corresponding to the fifteenth data D15.

In example embodiments, a data group corresponding to the third stream identifier SID3 may have three data slots. Accordingly, sixth and eighth data D6 to D8 in the data group corresponding to the third stream identifier SID3 may be programmed at the nonvolatile memories B130. Data slots corresponding to the sixth and eighth data D6 to D8 may be returned to free slots FS. The fifteenth data D15 may be stored in one free slot FS and may be merged with the data group of the first stream identifier SID1 (not illustrated).

In example embodiments, data groups with the largest capacity may exist in plurality. In this case, a target data group to be flushed may be determined according to a specific rule. For example, a data group including the oldest data, a data group including the latest data, a data group including the greatest access frequency, or a data group including the smallest access frequency may be selected from candidate data groups.

As another example, the controller B124 may detect a stream identifier SID corresponding to a data group having the smallest capacity, instead of a data group having the largest capacity. In in this case, the fifth stream identifier SID5 may be detected, and a data group corresponding to the fifth stream identifier SID5 may be flushed.

In example embodiments, when the capacity of a data group reaches a threshold capacity CCR due to an input of fifteenth data D15, flushing may be not performed, but the fifteenth data D15 and a data group corresponding to the fifteenth data D15 may be normally programmed at the nonvolatile memories B130. For example, the fifteenth data D15 may correspond to the third stream identifier SID5. In this case, the fifteenth data D15 may be normally programmed at the nonvolatile memories B130 together with the sixth to eighth data D6 to D8.

Figure 38:
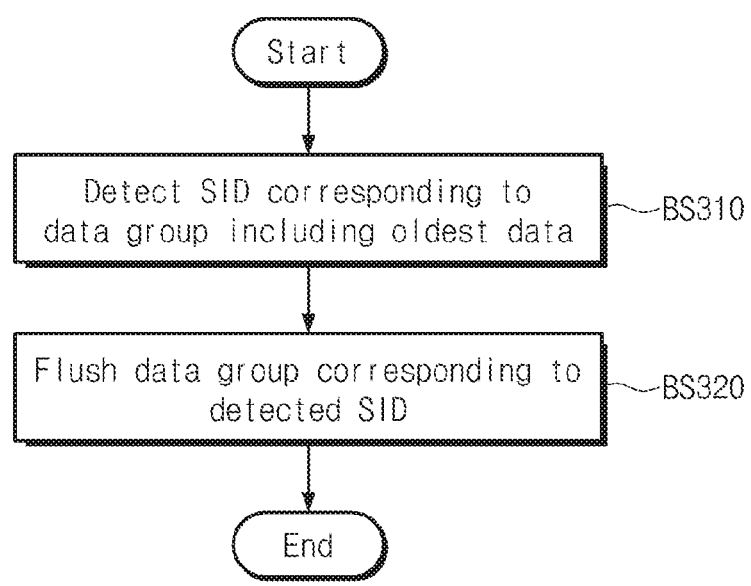
FIG. 38 is a flow chart schematically illustrating an embodiment in which a data group stored in a stream buffer is flushed.

FIG. 38 is a flow chart schematically illustrating an embodiment in which a data group stored in a stream buffer is flushed. Referring to FIGS. 28 and 38, in step BS310, there may be detected a stream identifier SID, which corresponds to a data group including the oldest data, from among stream identifiers SID1 to SID5. In step BS320, a data group corresponding to the detected stream identifier SID may be flushed. That is, data of a data group, having the oldest data, from among data groups stored in the stream buffer B127 may be programmed at the nonvolatile memories B130.

Figure 39:
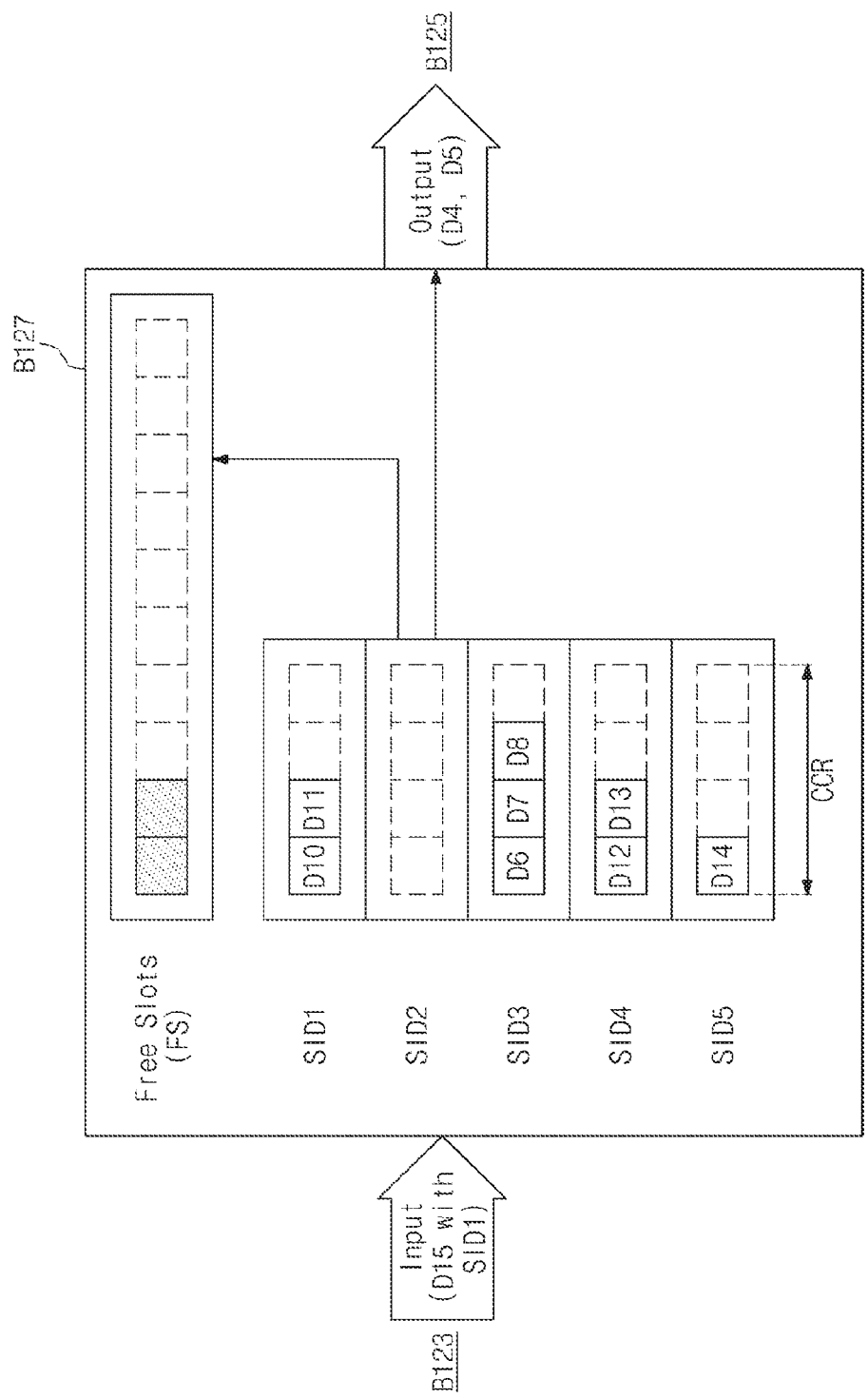
FIG. 39 shows the procedure for flushing a data group according to an example of FIG. 38.

How a data group is flushed according to FIG. 38 is illustrated in FIG. 39. Referring to FIGS. 38 and 39, fifteenth data D15 having the first stream identifier SID1 may be received from the RAM B123 as write data DATA_W. Since no free slot FS exists in the stream buffer B127, the controller B124 may detect a stream identifier SID, corresponding to a data group having the oldest data, from among stream identifiers SID1 to SID5. For example, the controller B127 may detect a target stream identifier of remaining stream identifiers SID2 to SID5 other than the first stream identifier SID1 corresponding to the fifteenth data D15.

In example embodiments, fourth data D4, corresponding to the second stream identifier SID2, from among data stored in the stream buffer B127 may be the oldest data. Accordingly, fourth and fifth data D4 to D5 in the data group corresponding to the second stream identifier SID2 may be programmed at the nonvolatile memories B130.

As another example, the controller B124 may detect a stream identifier SID corresponding to a data group having the latest data, instead of a data group having the oldest data. In in this case, the fifth stream identifier SID5 including the fourteenth data D14 may be detected, and a data group corresponding to the fifth stream identifier SID5 may be flushed.

Figure 40:
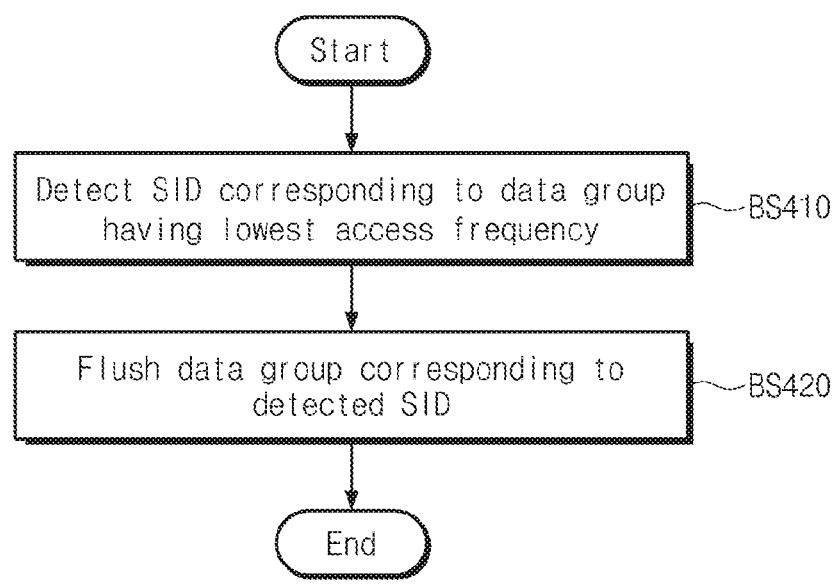
FIG. 40 is a flow chart schematically illustrating an embodiment in which a data group stored in a stream buffer is flushed.

FIG. 40 is a flow chart schematically illustrating an embodiment in which a data group stored in a stream buffer B127 is flushed. Referring to FIGS. 28 and 40, in step BS410, there may be detected a stream identifier SID, which corresponds to a data group having the lowest access frequency, from among stream identifiers SID1 to SID5. In step BS420, a data group corresponding to the detected stream identifier SID may be flushed. That is, data of a data group, having the lowest access frequency, from among data groups stored in the stream buffer B127 may be programmed at the nonvolatile memories B130.

As another example, the controller B124 may be variously modified or changed to flush data of a data group having the highest access frequency onto the nonvolatile memories B130.

Figure 41:
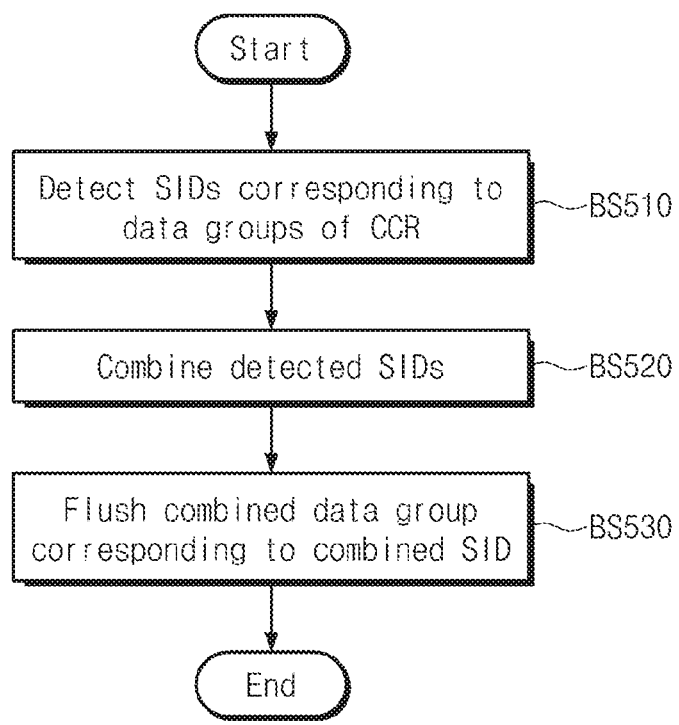
FIG. 41 is a flow chart schematically illustrating an embodiment in which a data group stored in a stream buffer is flushed.

FIG. 41 is a flow chart schematically illustrating an embodiment in which a data group stored in a stream buffer B127 is flushed. Referring to FIGS. 28 and 41, in step BS510, there may be detected stream identifiers SID, among which a total capacity corresponds to a threshold capacity CCR, from among stream identifiers SID1 to SID5. In step BS520, the detected stream identifiers SID may be combined. Data groups corresponding to the detected stream identifiers SID may be also combined such that a combined data group corresponding to the threshold capacity CCR is formed. In step BS530, a data group corresponding to the combined stream identifier SID may be flushed. That is, data of the combined data group may be programmed at the nonvolatile memories B130.

Figure 42:
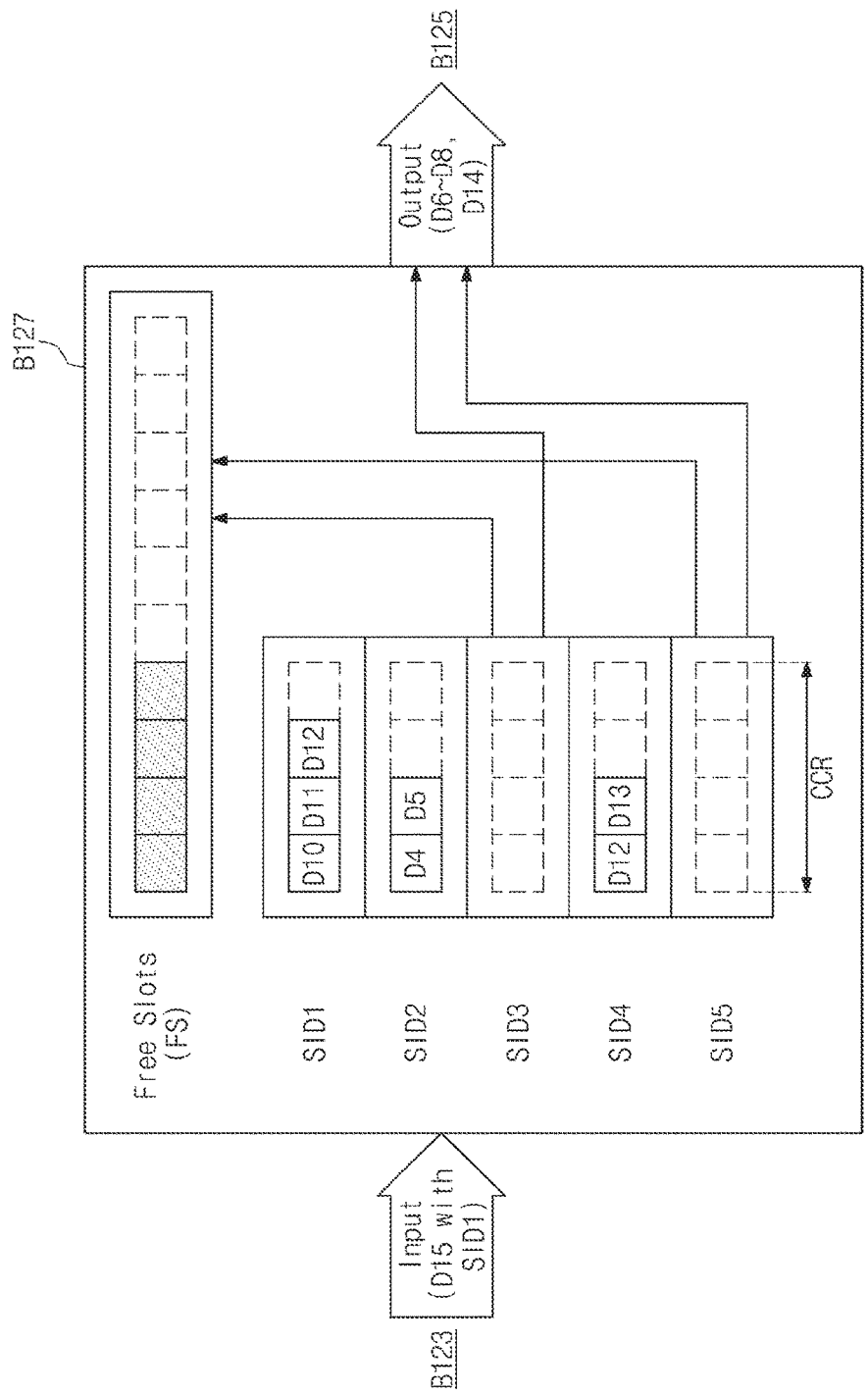
FIG. 42 shows the procedure for flushing a data group according to an example of FIG. 41.

How a data group is flushed according to FIG. 41 is illustrated in FIG. 42. Referring to FIGS. 41 and 42, fifteenth data D15 having the first stream identifier SID1 may be received from the RAM B123 as write data DATA_W. Since no free slot FS exists in the stream buffer B127, the controller B124 may detect stream identifiers SID, corresponding to data groups the whole capacity of which corresponds to a threshold capacity CCR, from among stream identifiers SID1 to SID5. For example, the controller B127 may detect target stream identifiers of remaining stream identifiers SID2 to SID5 other than the first stream identifier SID1 corresponding to the fifteenth data D15.

In example embodiments, the whole capacity of a data group corresponding to the third stream identifier SID3 and a data group corresponding to the fifth stream identifier SID5 may correspond to the threshold capacitor CCR. Accordingly, the controller B124 may detect the third and fifth stream identifiers SID3 and SID5. The controller B124 may combine the third and fifth stream identifiers SID3 and SID5 to generate a combined stream identifier.

For example, the controller B124 may select as a combined stream identifier a stream identifier corresponding to a data group having a larger capacity, corresponding to a data group having a smaller capacity, corresponding to a data group having the oldest data, corresponding to a data group having the latest data, corresponding to a data group having the greatest access frequency, or corresponding to a data group having the lowest access frequency, from among the third and fifth stream identifiers SID3 and SID5.

The sixth to eighth data D6 to D8 and the fourteenth data D14 corresponding respectively to the third stream identifier SID3 and the fifth stream identifier SID5 may compose a combined data group and may be programmed at the nonvolatile memories B130.

In example embodiments, combinations of data groups corresponding to the threshold capacity CCR may exist in plurality. In this case, data groups to be combined may be determined according to a separate rule. For example, a combination of data groups including the oldest data, a combination of data groups including the latest data, a combination of data groups including the greatest access frequency, or a combination of data groups including the smallest access frequency may be selected from candidate data groups.

Figure 43:
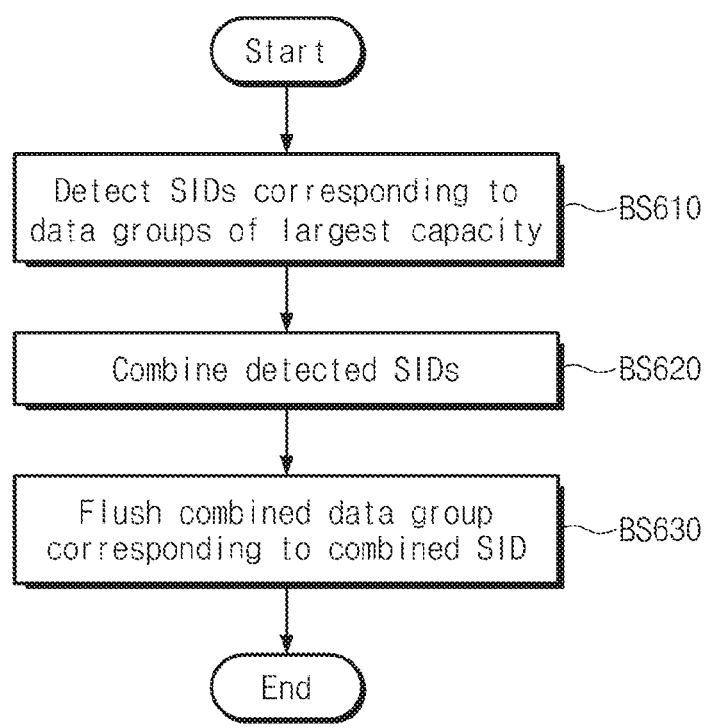
FIG. 43 is a flow chart schematically illustrating an embodiment in which a data group stored in a stream buffer is flushed.

FIG. 43 is a flow chart schematically illustrating an embodiment in which a data group stored in a stream buffer is flushed. Referring to FIGS. 28 and 43, in step BS610, there may be sequentially detected stream identifiers SID, which correspond to a data group having the largest capacity, from among stream identifiers SID1 to SID5. For example, stream identifiers SID of two data groups having the largest capacity or two or more data groups having the largest capacity may be detected. For example, two or more stream identifiers SID may be detected until the whole capacity of detected stream identifiers SID reaches the threshold capacity CCR.

In step BS620, the detected stream identifiers SID may be combined. For example, the controller B124 may select, as a combined stream identifier, a stream identifier corresponding to a data group having a larger capacity, corresponding to a data group having a smaller capacity, corresponding to a data group having the oldest data, corresponding to a data group having the latest data, corresponding to a data group having the greatest access frequency, or corresponding to a data group having the lowest access frequency, from among the detected stream identifiers.

Data groups corresponding to the detected stream identifiers SID may be also combined such that a combined data group corresponding to the threshold capacity CCR is formed. For example, in the case where the whole capacity of data groups corresponding to the detected stream identifiers SID is greater than the threshold capacity CCR, at least one of data groups of the detected stream identifiers SID may be included in the combined data group, and the other data group may have remaining data. For example, data in a data group, having a larger capacity, having a smaller capacity, having the oldest data, having the latest data, having the greatest access frequency, or having the lowest access frequency, from among the detected stream identifiers may be all included in the combined data group. A part of data of the other data group not corresponding to the above-described condition may be included in the combined data group, and the remaining data thereof may be maintained in a remaining data group. In example embodiments, in the other data group, the oldest data or the latest data may be included in the combined data group. Data which does not correspond to the above-described condition may be maintained as remaining data.

In step BS630, the combined data group corresponding to the combined stream identifier SID may be flushed. That is, data of the combined data group may be programmed at the nonvolatile memories B130.

As another example, the controller B124 may be variously modified or changed to detect stream identifiers SID corresponding to data groups having the smallest capacity.

Figure 44:
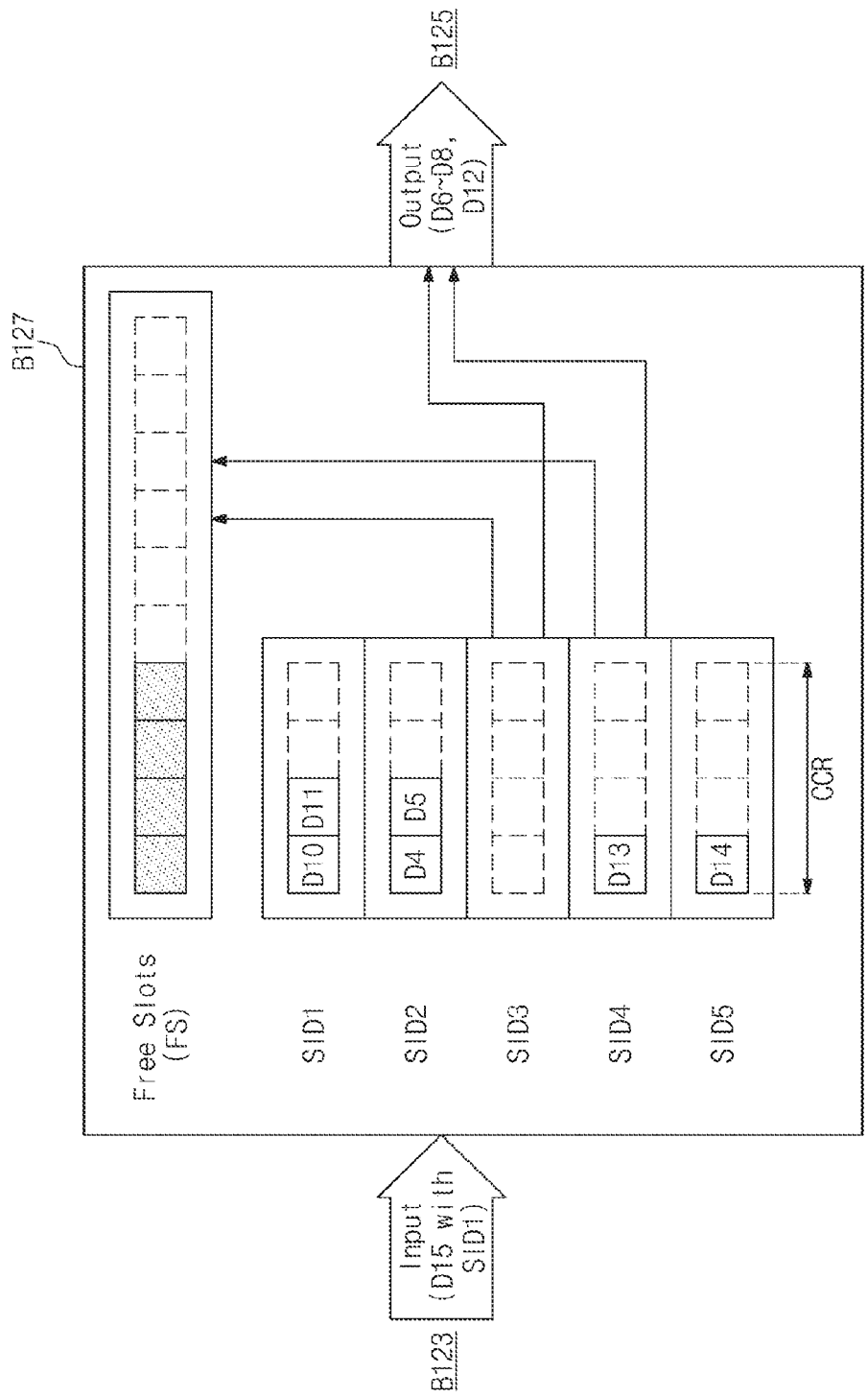
FIG. 44 shows the procedure for flushing a data group according to an example of FIG. 38.

How a data group is flushed according to FIG. 43 is illustrated in FIG. 44. Referring to FIGS. 43 and 44, fifteenth data D15 having the first stream identifier SID1 may be received from the RAM B123 as write data DATA_W. Since no free slot FS exists in the stream buffer B127, the controller B124 may detect stream identifiers SID corresponding to data groups the whole capacity of which corresponds to a threshold capacity CCR, from among stream identifiers SID1 to SID5. For example, the controller B127 may detect target stream identifiers of remaining stream identifiers SID2 to SID5 other than the first stream identifier SID1 corresponding to the fifteenth data D15.

In example embodiments, the third and fourth stream identifiers SID3 and SID4 may be detected. The sixth to eighth data D6 to D8 of the third stream identifier SID3 and the twelfth data D12 of the fourth stream identifier SID4 may compose a combined data group and may be programmed at the nonvolatile memories B130. The thirteenth data D13 of the fourth stream identifier SID4 may be remaining data.

Figure 45:
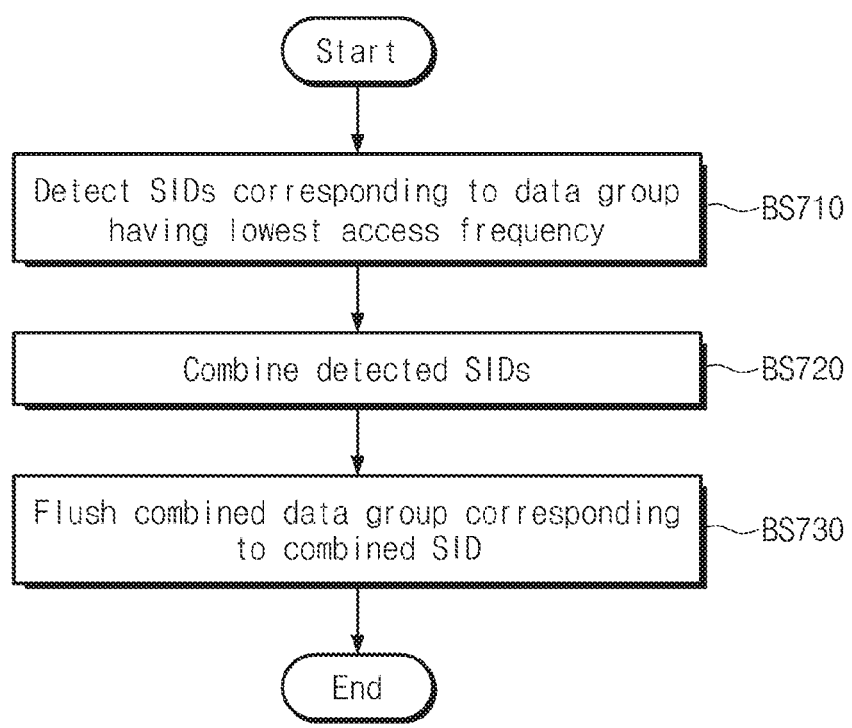
FIG. 45 is a flow chart schematically illustrating an embodiment in which a data group stored in a stream buffer is flushed.

FIG. 45 is a flow chart schematically illustrating an embodiment in which a data group stored in a stream buffer is flushed. Referring to FIGS. 28 and 45, in step BS710, there may be sequentially detected stream identifiers SID, which correspond to data group having the lowest access frequency, from among stream identifiers SID1 to SID5. For example, stream identifiers SID of two data groups having a lower access frequency or two or more data groups having a lower access frequency may be detected. For example, two or more stream identifiers SID may be detected until the whole capacity of detected stream identifiers SID reaches the threshold capacity CCR.

In step BS720, the detected stream identifiers SID may be combined. Data groups corresponding to the detected stream identifiers SID may be also combined such that a combined data group corresponding to the threshold capacity CCR is formed. The stream identifiers SID and the data groups may be combined according to a manner described with reference to FIG. 43.

In step BS730, the combined data group corresponding to the combined stream identifier SID may be flushed. That is, data of the combined data group may be programmed at the nonvolatile memories B130.

As another example, the controller B124 may be variously modified or changed to detect stream identifiers SID having the highest access frequency.

Figure 46:
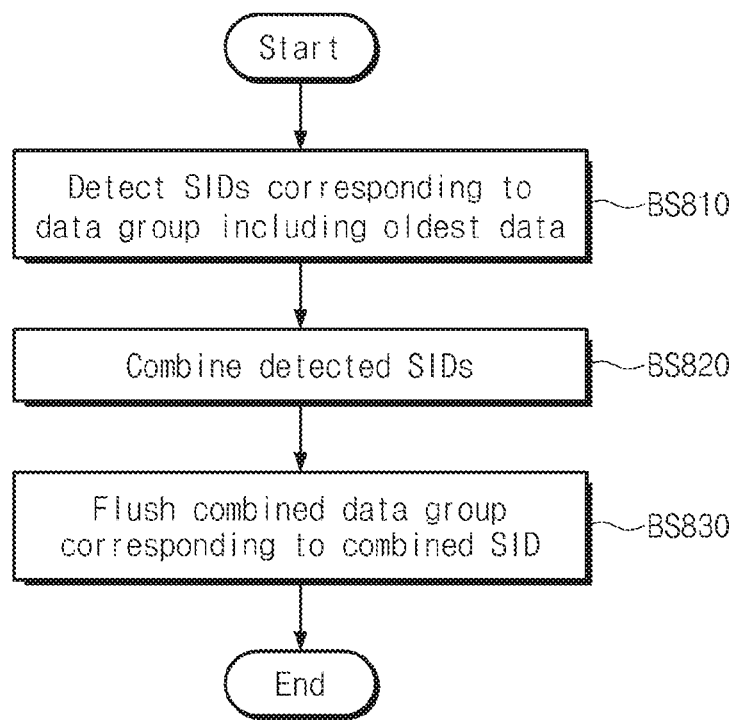
FIG. 46 is a flow chart schematically illustrating an embodiment in which a data group stored in a stream buffer is flushed.

FIG. 46 is a flow chart schematically illustrating an embodiment in which a data group stored in a stream buffer B127 is flushed. Referring to FIGS. 28 and 46, in step BS810, stream identifiers SID corresponding to data groups including the oldest data, from among stream identifiers SID1 to SID5, may be sequentially detected. For example, there may be detected stream identifiers SID of two data groups including older data or two or more data groups including older data. For example, two or more stream identifiers SID may be detected until the whole capacity of detected stream identifiers SID reaches the threshold capacity CCR.

In step BS820, the detected stream identifiers SID may be combined. Data groups corresponding to the detected stream identifiers SID may be also combined such that a combined data group corresponding to the threshold capacity CCR is formed. The stream identifiers SID and the data groups may be combined according to a manner described with reference to FIG. 43.

In step BS830, the combined data group corresponding to the combined stream identifier SID may be flushed. That is, data of the combined data group may be programmed at the nonvolatile memories B130.

As another example, the controller B124 may be variously modified or changed to detect stream identifiers SID corresponding to a data group having the latest data.

Figure 47:
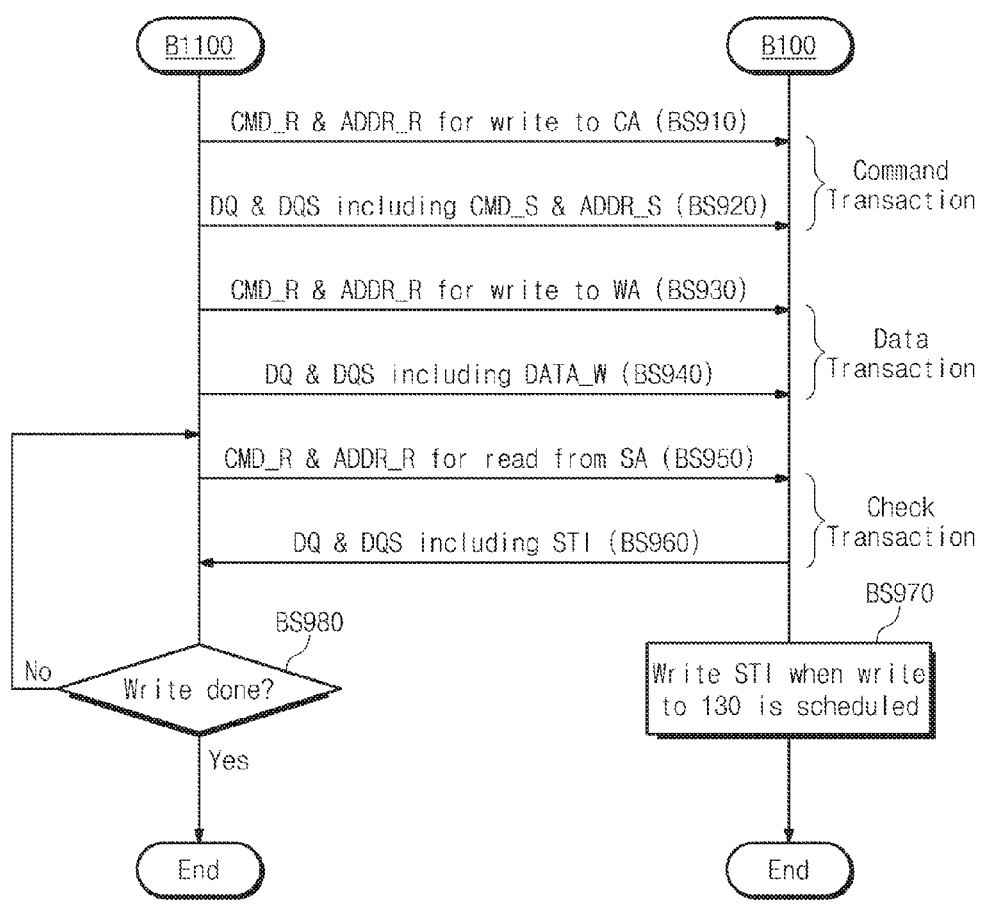
FIG. 47 is a flow chart schematically illustrating a method in which a processor according to an embodiment of the disclosure writes data at a storage device.

FIG. 47 is a flow chart illustrating a method in which a processor writes data in a storage device, according to an embodiment of the disclosure. In example embodiments, a method in which the processor B1100 writes data in the nonvolatile memories B130 is illustrated in FIG. 47.

Referring to FIGS. 26, 27, 28, and 47, in step BS910, the processor B1100 may transmit a RAM command CMD_R requesting a write operation and the RAM address ADDR_R selecting a command area CA of the RAM B123, to the storage device B100. In step BS920, the processor B1100 may transmit the storage command CMD_S requesting a write operation and the storage address ADDR_S selecting a write target of a storage space of the nonvolatile memories B130, to the storage device B100 through the data signals DQ and the data strobe signals DQS.

Steps BS910 and BS920 may compose a command transaction transmitting a write command of the nonvolatile memories B130 to the storage device B100. If steps BS910 and BS920 are performed, the storage command CMD_S and the storage address ADDR_S may be written in the command area CA of the RAM B123.

In step BS930, the processor B1100 may transmit the RAM command CMD_R requesting a write operation and the RAM address ADDR_R selecting a write area WA of the RAM B123, to the storage device B100. In step S940, the processor B1100 may transmit the write data DATA_W to the storage device B100 through data signals DQ and the data strobe signals DQS.

Steps BS930 and S940 may compose a data transaction transmitting the write data DATA_W of the nonvolatile memories B130 to the storage device B100. If steps BS930 and BS940 are performed, the write data DATA_W may be written in the write area WA of the RAM B123.

As the storage command CMD_S, the storage address ADDR_S, and the write data DATA_W are stored in the RAM B123, the controller B124 may start writing the write data DATA_W in the nonvolatile memories B130 in response to the storage command CMD_S and the storage address ADDR_S.

The storage command CMD_S, the storage address ADDR_S, and the write data DATA_W may be written in the command area CA of the RAM B123 as one or more phase groups PG. The controller B124 may check phase bits PB of the phase groups PG written in the command area CA and may descramble the phase groups PG if the phase bits PB are valid.

In step BS950, the processor B1100 may transmit the RAM command CMD_R requesting a read operation and the RAM address ADDR_R selecting a state area SA, to the storage device B100. In step BS960, the processor B1100 may read the status information from the storage device B100 as the data signals DQ and the data strobe signals DQS. Steps BS450 and BS460 may form a check transaction checking whether writing is processed.

If writing of the nonvolatile memories B130 is completed in the storage device B100 or if writing is scheduled (or enqueued), the storage device B100 may write BS970 the status information STI informing that writing is processed, in the state area SA. The processor B1100 may repeat steps BS950 and BS960 periodically until the status information STI informing that writing is processed is read from the state area SA. If the status information STI is read from the storage device B100 (B S980), the processor B1100 may recognize that the write operation to the storage device B100 is processed and may perform a next access of the storage device B100.

Figure 48:
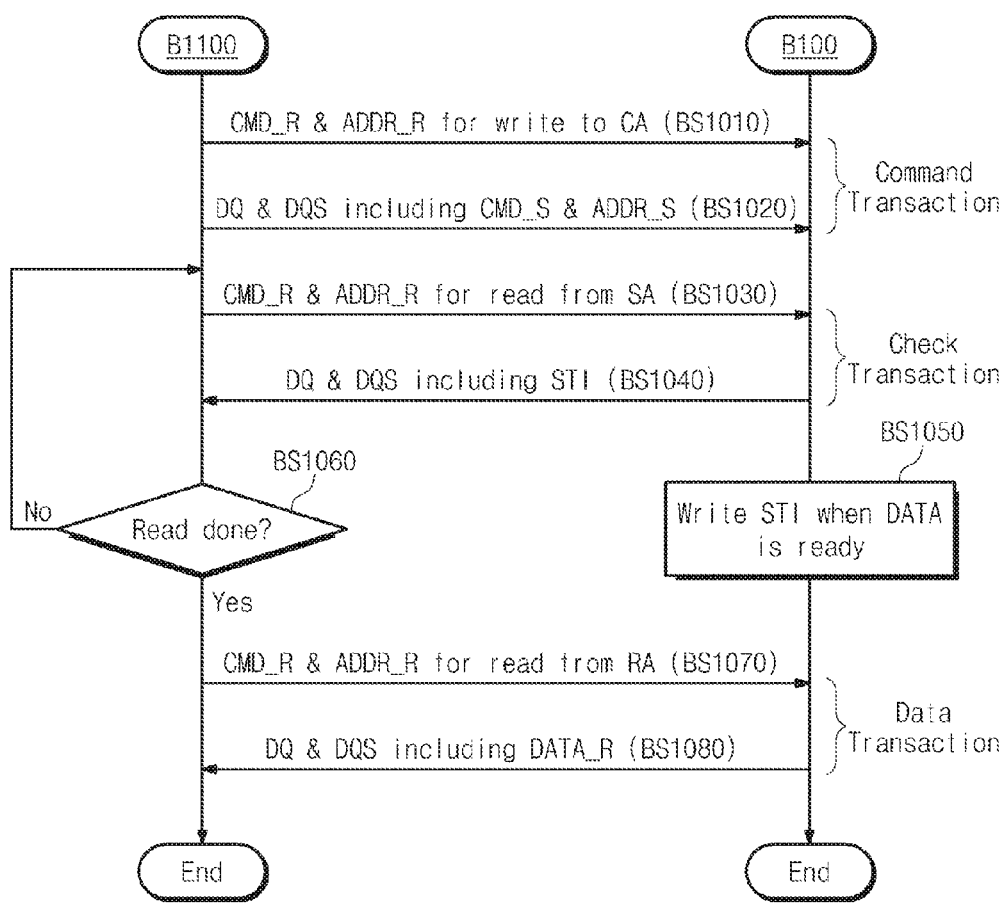
FIG. 48 is a flow chart schematically illustrating a method in which a processor according to an embodiment of the disclosure reads data from a storage device.

FIG. 48 is a flow chart illustrating a method in which a processor reads data from a storage device, according to an embodiment of the disclosure. In example embodiments, a method in which the processor B1100 reads data from the nonvolatile memories B130 is illustrated in FIG. 48.

Referring to FIGS. 26, 27, 28, and 48, in step BS1010, the processor B1100 may transmit the RAM command CMD_R requesting a write operation and the RAM address ADDR_R selecting a command area CA of the RAM B123, to the storage device B100. In step BS1020, the processor B1100 may transmit the storage command CMD_S requesting a read operation and the storage address ADDR_S selecting a read target of a storage space of the nonvolatile memories B130, to the storage device B100 through the data signals DQ and the data strobe signals DQS.

Steps BS1010 and BS1020 may compose a command transaction transmitting a read command of the nonvolatile memories B130 to the storage device B100. If steps BS1010 and BS1020 are performed, the storage command CMD_S and the storage address ADDR_S may be written in the command area CA of the RAM B123.

The storage command CMD_S and the storage address ADDR_S may be written in the command area CA of the RAM B123 as one or more phase groups PG. The controller B124 may check phase bits PB of the phase groups PG written in the command area CA and may descramble the phase groups PG if the phase bits PB are valid.

As the storage command CMD_S is descrambled, the controller B124 may start reading the read data DATA_R from the nonvolatile memories B130 in response to the storage command CMD_S and the storage address ADDR_S. For example, the controller B124 may store the read data DATA_R in a read area RA of the RAM B123.

In step BS1030, the processor B1100 may transmit the RAM command CMD_R requesting a read operation and the RAM address ADDR_R selecting a state area SA, to the storage device B100. In step BS1040, the processor B1100 may read the status information from the storage device B100 as the data signals DQ and the data strobe signals DQS. Steps S1030 and S1040 may form a check transaction checking whether reading is processed.

If reading of the nonvolatile memories 130 is completed in the storage device B100, the storage device B100 may write the status information STI informing that reading is completed, in the state area SA (BS1050). The processor B1100 may repeat steps BS1030 and BS1040 periodically until the status information STI informing that reading is completed is read from the state area SA.

If the status information STI is read from the storage device B100, the processor B1100 may recognize a write operation of the storage device B100 as being completed (BS1060). In step BS1070, the processor B1100 may transmit the RAM command CMD_R requesting a read operation and the RAM address ADDR_R selecting a read area RA of the RAM B123, to the storage device B100. In step BS1080, the processor B1100 may receive the read data DATA_R from the storage device B100 as the data signals DQ and the data strobe signals DQS. Steps S1070 and S1080 may form a data transaction transmitting the data DATA_R read from the nonvolatile memories B130.

As described above, the processor B1100 may recognize the RAM B123 as a memory connected to the high-speed interface B1230 and may perform read and write operations of the RAM B123 based on the specification of the high-speed interface B1230. Data written in or read from the RAM B123 may include the storage command CMD_S requesting an access of the nonvolatile memories B130, the storage address ADDR_S, and the write data DATA_W and the read data DATA_R transacted with the nonvolatile memories B130.

The storage device B100 may support transaction between the RAM B123 and the processor B1100 based on the specification of the high-speed interface B1230. The storage device B100 may extract the storage command CMD_S and the storage address ADDR_S from data stored in the RAM B123. Furthermore, the storage device B100 may write the write data DATA_W stored in the RAM B123 in the nonvolatile memories B130 and may store data DATA_R read from the nonvolatile memories B130 in the RAM B123.

Transaction between the processor B1100 and the storage device B100 may be performed according to the specification of the high-speed interface B1230, and data transacted according to the specification of the high-speed interface B1230 may be organized according to a protocol for accessing the nonvolatile memories B130.

In example embodiments, a storage device and an operating method described with reference to FIGS. 26 to 48 may be applied a nonvolatile memory system, a user system, or a server system described with reference to FIGS. 16 to 25.

Figure 49:
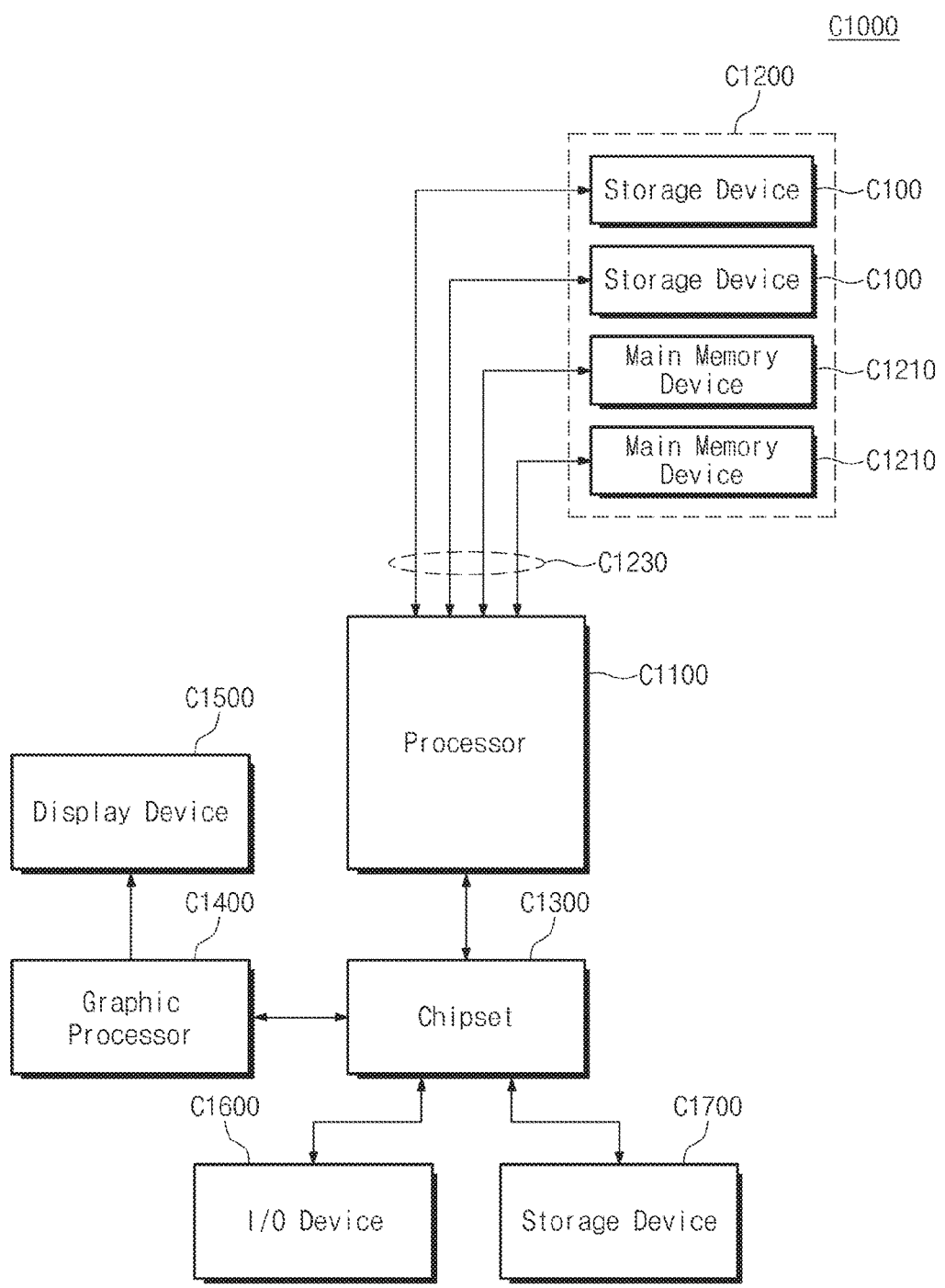
FIG. 49 is a block diagram illustrating a computing device according to an embodiment of the disclosure.
Figure 50:
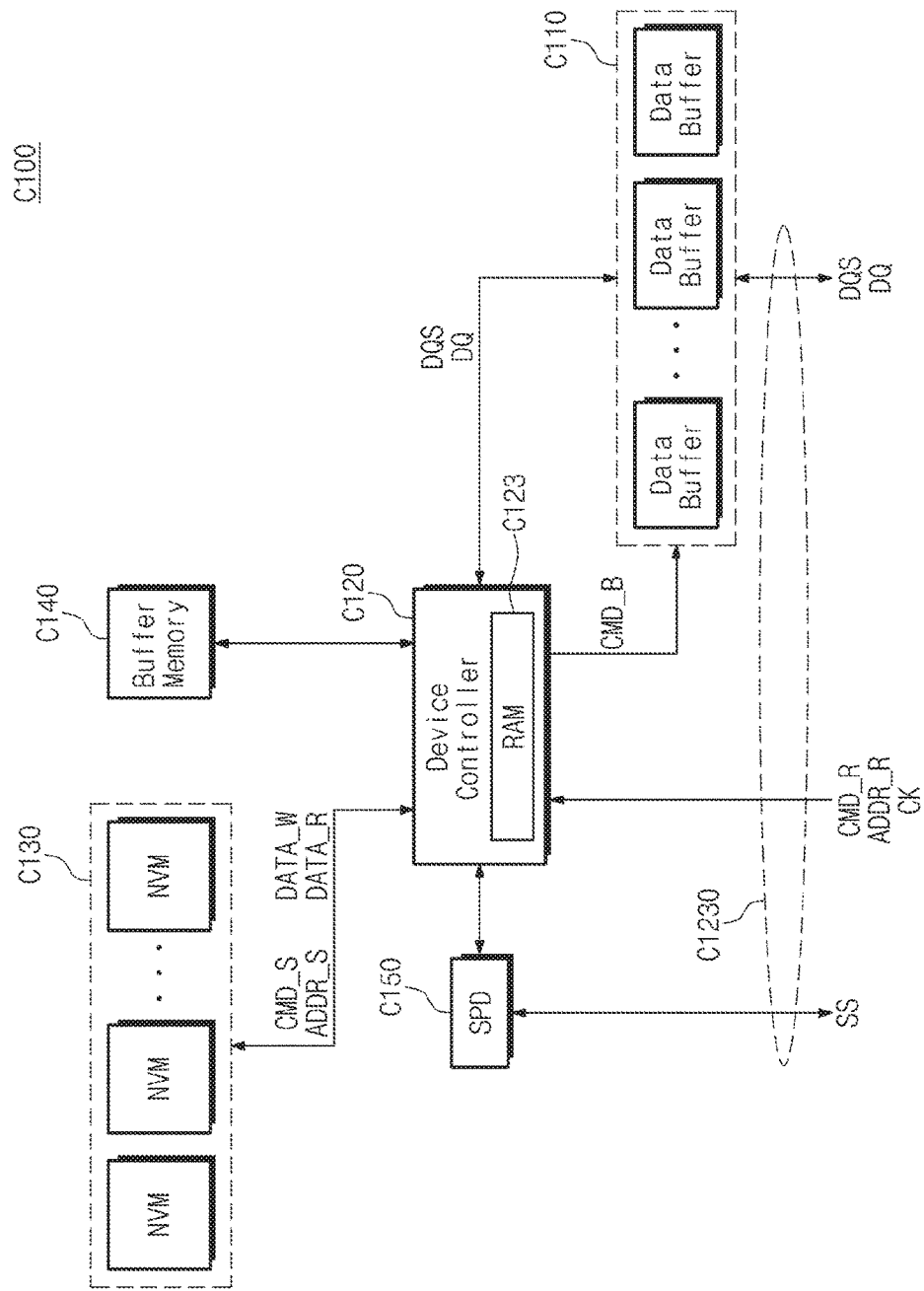
FIG. 50 is a block diagram illustrating a computing device according to an embodiment of the disclosure.
Figure 51:
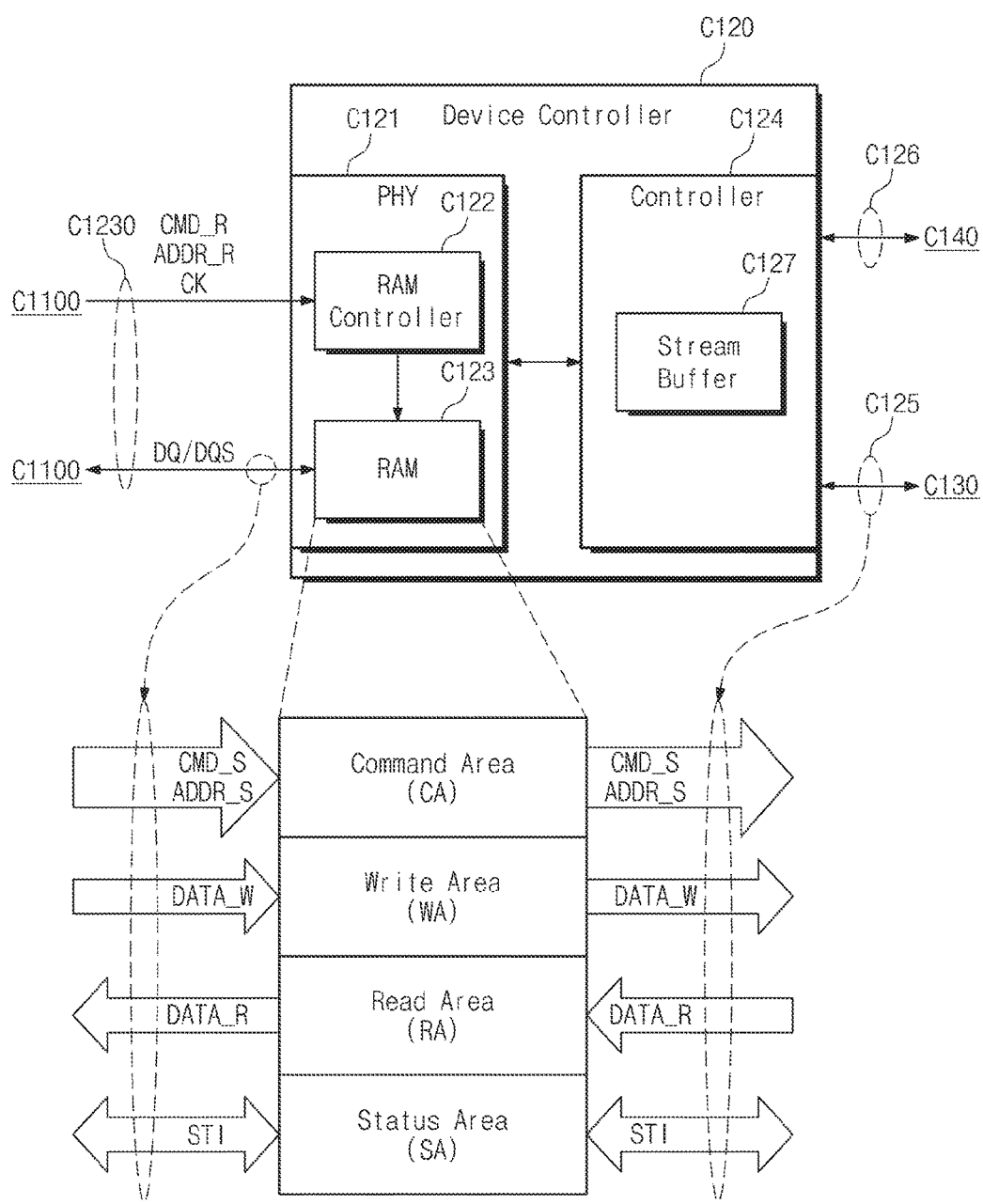
FIG. 51 is a block diagram illustrating a storage device according to an embodiment of the disclosure.

FIG. 49 is a block diagram illustrating a computing device according to an embodiment of the disclosure. FIG. 50 is a block diagram illustrating a storage device according to an embodiment of the disclosure. FIG. 51 is a block diagram illustrating a device controller 120 according to an embodiment of the disclosure. Referring to FIGS. 49 to 51, a computing device C1000 may include a processor C1100, a high-speed storage device C1200, a chipset C1300, a graphic processor C1400, a display device C1500, an input/output device C1600, and a storage device C1700. The storage device C1200 may include storage devices C100 and main memory devices C1210. Storage device C100 may include data buffers C110, a device controller C120, nonvolatile memories (NVM) C130, a buffer memory C140, and a serial presence detect (SPD) C150. The device controller C120 may include a physical layer circuit (PHY) C121 and a controller C124. Components of FIGS. 49 to 51 are similar to those of FIGS. 26 to 28, though a reference character C precedes the reference numerals in FIGS. 49 through 51, whereas a reference character B precedes the reference numerals in FIGS. 26 through 28, and a detailed description thereof is thus omitted.

Figure 52:
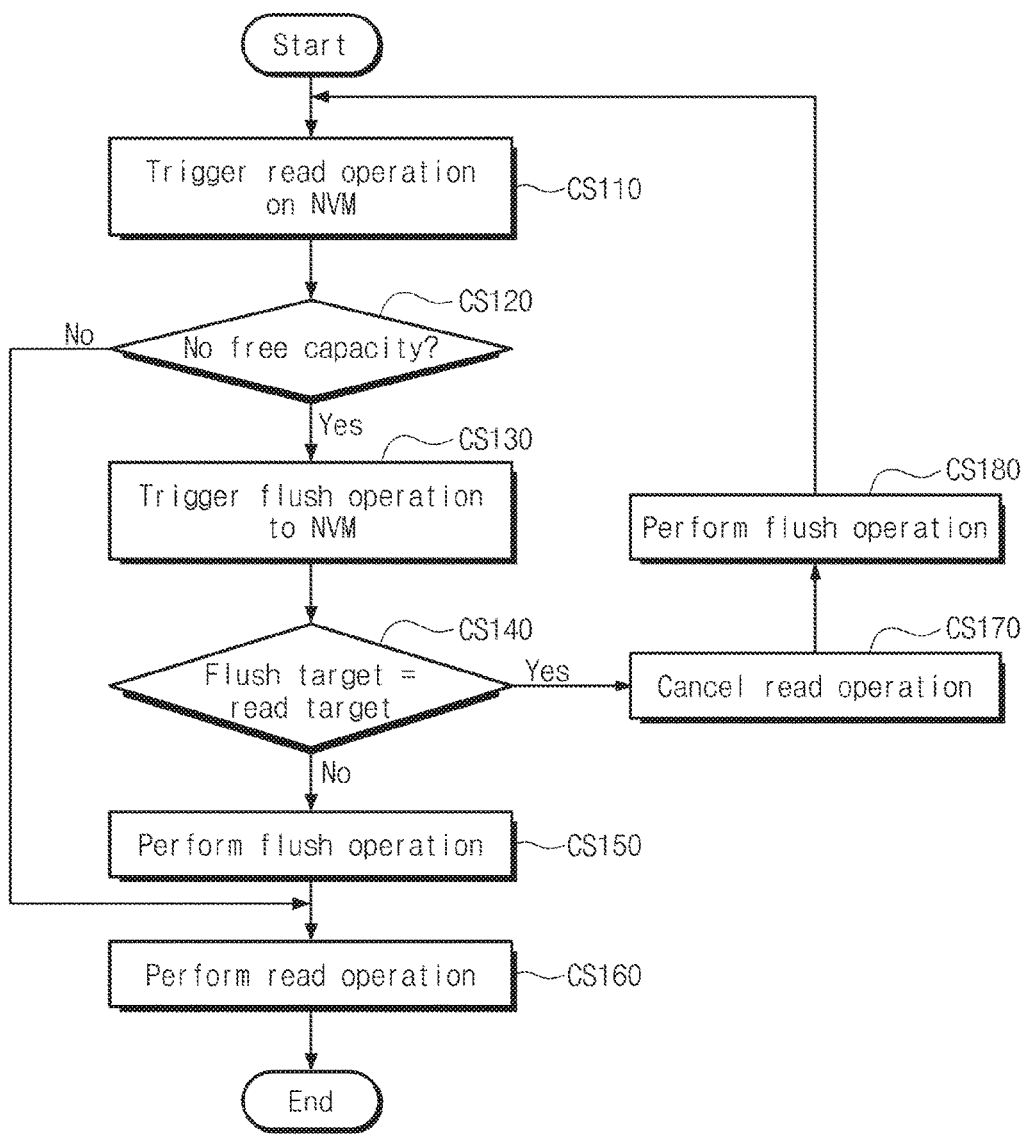
FIG. 52 is a block diagram illustrating a device controller according to an embodiment of the disclosure.

FIG. 52 is a flow chart schematically illustrating a method in which a storage device according to an embodiment of the disclosure accesses nonvolatile memories using a stream buffer. Referring to FIGS. 49 to 52, in step CS110, the storage device C100 may trigger a read operation of a nonvolatile memory C130. For example, the device controller C120 may trigger the read operation based on a request from the processor C1100 or an internally generated schedule. For example, the controller C124 may trigger the read operation as a part of garbage collection, read reclaim, bad block management, or wear leveling of the nonvolatile memories C130.

For example, the garbage collection may occur in the case where valid data and invalid data are distributed on memory blocks of each of the nonvolatile memories C130. If the garbage collection is performed, valid data of a source memory block may be migrated or copied into a target memory block and the source memory block may be erased or invalidated. That is, the garbage collection may include a read operation of the source memory block and a write operation of the target memory block. The target memory block may be a free block in which data is not stored and which has an erase state.

The read reclaim may occur in the case where a read error is detected from memory blocks of each of the nonvolatile memories C130. When the number of error bits included in data read at a read operation exceeds a threshold value, a memory block where the read operation is performed may be selected as a source memory block. If the read reclaim is performed, data or valid data of the source memory block may be migrated or copied into a target memory block and the source memory block may be erased or invalidated. That is, the read reclaim may include a read operation of the source memory block and a write operation of the target memory block. The target memory block may be a free block in which data is not stored and which has an erase state.

The bad block management may occur in the case where a bad block is detected from memory blocks of the nonvolatile memories C130. If an error occurs at a write operation, a memory block where the error occurs may be selected as a source memory block. Data or valid data of the source memory block may be migrated or copied into a target memory block, and the source memory block may be set as a bad block. That is, the bad block management may include a read operation of the source memory block. The target memory block may be a free block in which data is not stored and which has an erase state.

The wear leveling may occur when a difference between program/erase cycles of memory blocks in the nonvolatile memories C130 exists. If a difference between program/erase cycles of first and second memory blocks is greater than (or greater than or equal to) a threshold value, data or valid data of the first memory block and data or valid data of the second memory block may be swapped. That is, the wear leveling may include read operations of first and second memory blocks and write operations of the first and second memory blocks.

In step CS120, the controller C124 may determine whether a free capacity (or space) exists in the stream buffer C127. If the free capacity (or space) exists in the stream buffer C127 or if the free capacity is greater than (or greater than or equal to) the size of data to be read through a read operation, step S160 may be performed. If the free capacity (or space) does not exist in the stream buffer C127 or if the free capacity is smaller than or equal to (or smaller than) the size of data to be read through a read operation, step CS130 may be performed.

In step CS130, the device controller C124 may trigger a flush operation. For example, the flush operation may include an operation of writing data stored in the stream buffer C127 at the nonvolatile memories C130. That is, if the flush operation is performed, data of a data group, not reaching a threshold capacity, from among data groups stored in the stream buffer C127 may be programmed at the nonvolatile memories C130.

In step CS140, the controller C124 may determine whether a target of the flush operation is the same as that of a read operation. For example, there may be determined whether a first nonvolatile memory, at which a flush operation is to be performed, from among the nonvolatile memories C130 is the same as a second nonvolatile memory. Step CS150 may be performed if a target of the flush operation is not the same as that of the read operation. In step CS150, the controller C124 may perform the flush operation. In step CS160, the read operation may be performed.

If a target of the flush operation is the same as that of the read operation, the read operation may be canceled in step CS170. The flush operation may be performed in step CS180. Afterwards, step CS110 may be again performed.

That is, the controller C124 may trigger a read operation of the first nonvolatile memory among the nonvolatile memories C130 (CS110). The read operation may be triggered according to a request of the processor C1100 or according to an internal schedule such as garbage collection, read reclaim, bad block management, and wear leveling.

If the free capacity of the stream buffer C127 is sufficient, the read operation may be performed (CS120 and CS160). If the free capacity of the stream buffer C127 is insufficient, the flush operation may be triggered (CS120 and CS130).

If a target of the flush operation is not the same as that of the read operation, the controller C124 may perform the flush operation to secure the free capacity of the stream buffer C127 and may perform the read operation (CS140 and CS160).

If a target of the flush operation is the same as that of the read operation, deadlock may occur. For example, if the controller C124 performs a read operation of a nonvolatile memory, it has to perform the flush operation of the nonvolatile memory. However, the flush operation may be impossible because the read operation of the nonvolatile memory is triggered. In the case where a target of the flush operation is the same as that of the read operation, the storage device C100 according to an embodiment of the disclosure may cancel the read operation and may perform the flush operation (CS140 and CS170). Afterwards, the read operation may be again triggered (CS110). Accordingly, it may be possible to prevent the deadlock from arising from the storage device C100. Even though the free capacity of the stream buffer C127 does not exist, it may be possible to prevent the deadlock from arising from the storage device C100, thereby reducing the size of the stream buffer C127 while maintaining the operating performance and reliability of the storage device C100. This may mean that the manufacturing cost of the storage device C100 is reduced.

FIGS. 53 to 56 are diagrams for describing the procedure in which a storage device performs a read operation and a flush operation. A part of the controller C124 may be illustrated in FIGS. 53 to 56. In example embodiments, a part of the controller C124 associated with the nonvolatile memories C130 is illustrated in FIGS. 53 to 56.

Figure 53:
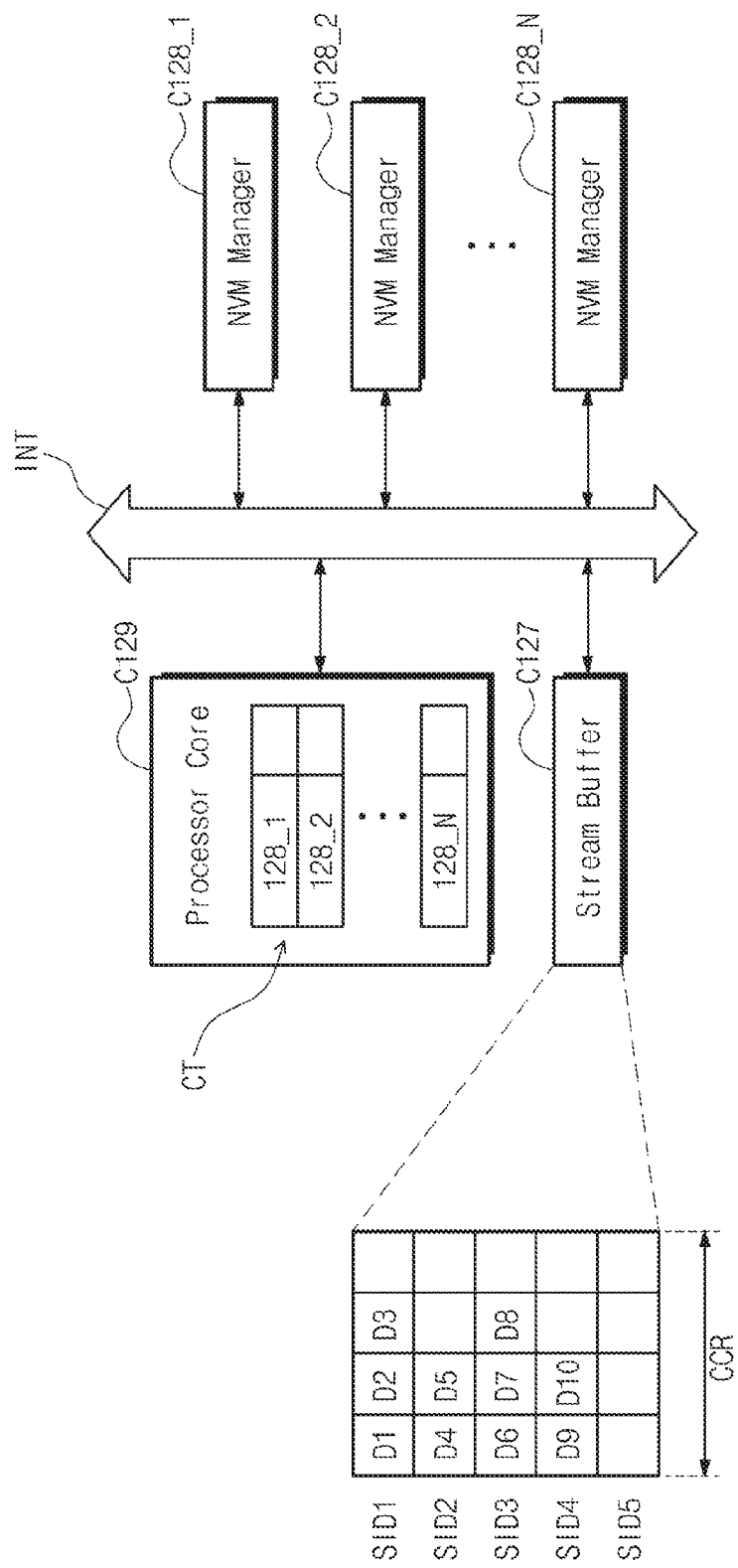
FIG. 53 is a flow chart schematically illustrating a method in which a storage device according to an embodiment of the disclosure accesses nonvolatile memories using a stream buffer.

Referring to FIG. 53, the controller C124 may include an interconnector INT, a stream buffer C127, nonvolatile memory managers C128_1 to C128_N, and a processor core C129.

The interconnector INT may provide a channel between components of the controller C124.

The stream buffer C127 may manage write data DATA_W received from the processor C1100 (refer to FIG. 49), based on stream identifiers SID. In example embodiments, it may be assumed that the stream buffer C127 manages the write data DATA_W based on first to fifth stream identifiers SID1 to SID5.

The nonvolatile memory managers C128_1 to C128_N may correspond to the nonvolatile memory C130, respectively. One nonvolatile memory manager C128 may control one nonvolatile memory C130 through a first interface C125. One nonvolatile memory C130 may include nonvolatile memory chips. One nonvolatile memory manager C128 may provide the following signals in common to nonvolatile memory chips of the nonvolatile memory C130 through the first interface C125: a command latch enable signal CLE, an address latch enable signal ALE, a read enable signal /RE, a write enable signal /WE, and a write protect signal /WP. The nonvolatile memory manager C128 may transact data signals DQ and data strobe signals DQS with nonvolatile memory chips of the nonvolatile memory C130 through the first interface C125. The nonvolatile memory manager C128 may transmit the chip enable signals /CE to nonvolatile memory chips of the nonvolatile memory C130 through the first interface C125, respectively. The nonvolatile memory manager C128 may receive ready/busy signals R/nB from nonvolatile memory chips of the nonvolatile memory C130 through the first interface C125, respectively.

The processor core C129 may control the stream buffer C127 and the nonvolatile memory managers C128_1 to C128_N through the interconnector INT. The processor core C129 may control the nonvolatile memory managers C128_1 to C128_N using a control table CT.

In example embodiments, it may be assumed that first to third data D1 to D3 corresponding to the first stream identifier SID1, fourth and fifth data D4 and D5 corresponding to the second stream identifier SID2, sixth to eighth data D6 to D8 corresponding to the third stream identifier SID3, and ninth and tenth data D9 and D10 corresponding to the fourth stream identifier SID4 are stored in a stream buffer as write data DATA_W. Furthermore, it may be assumed that a free capacity does not exist in the stream buffer C127.

Figure 54:
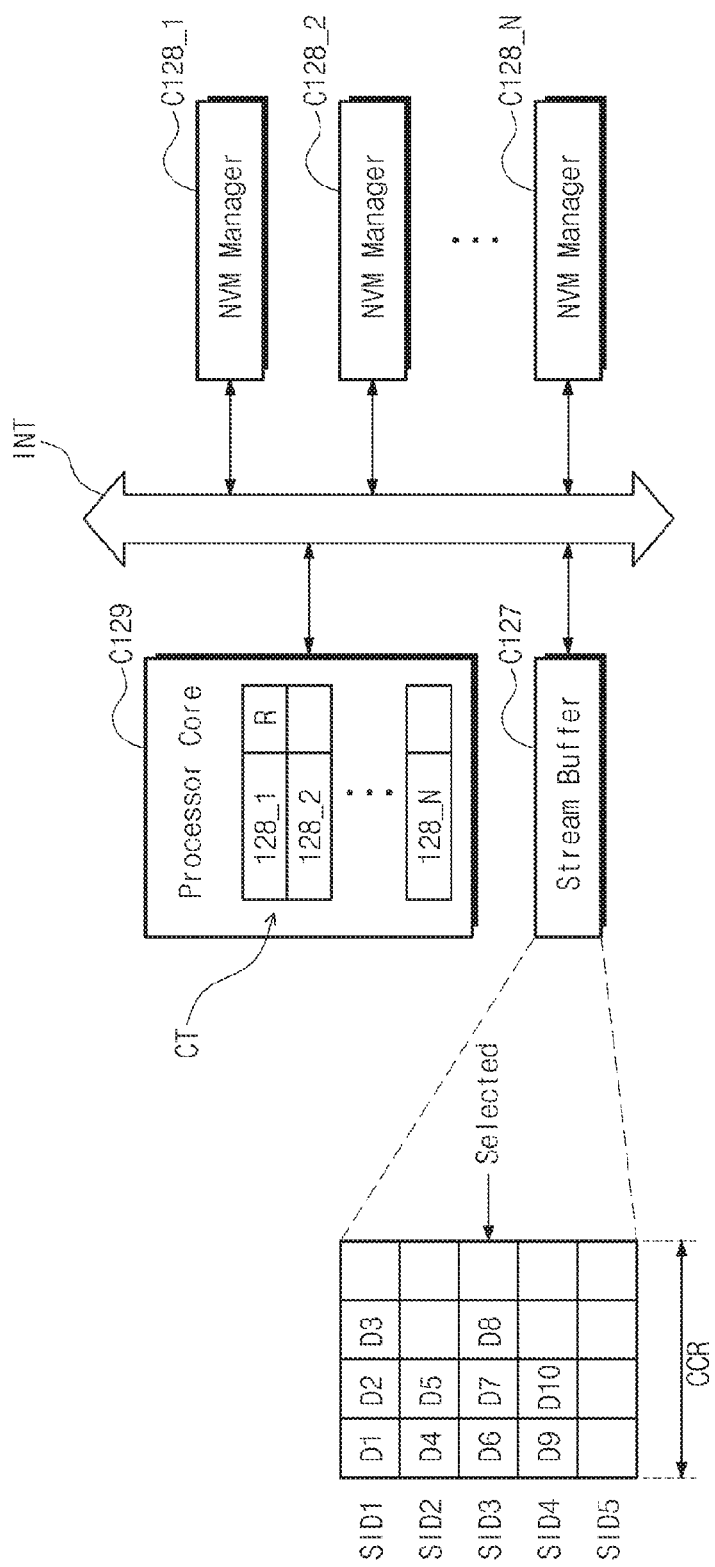
FIGS. 54 to 56 are diagrams for describing the procedure in which a storage device performs a read operation and a flush operation.

Referring to FIG. 54, the processor core C129 may allow the first nonvolatile memory manager C128_1 to trigger a read operation. For example, a read operation R may be marked at the control table CT corresponding to the first nonvolatile memory manager C128_1.

Since no free capacity of the stream buffer C127 exists, the processor core C129 may trigger the flush operation. At this time, sixth and eighth data D6 to D8 corresponding to the third stream identifier SID3 may be selected as a target of the flush operation. In example embodiments, the sixth and eighth data D6 to D8 corresponding to the third stream identifier SID3 may correspond to the first nonvolatile memory manager C128_1. For example, the sixth and eighth data D6 to D8 may be written at the nonvolatile memory C130 through the first nonvolatile memory manager C128_1. That is, a target of the read operation may be the same as that of the flush operation.

Figure 55:
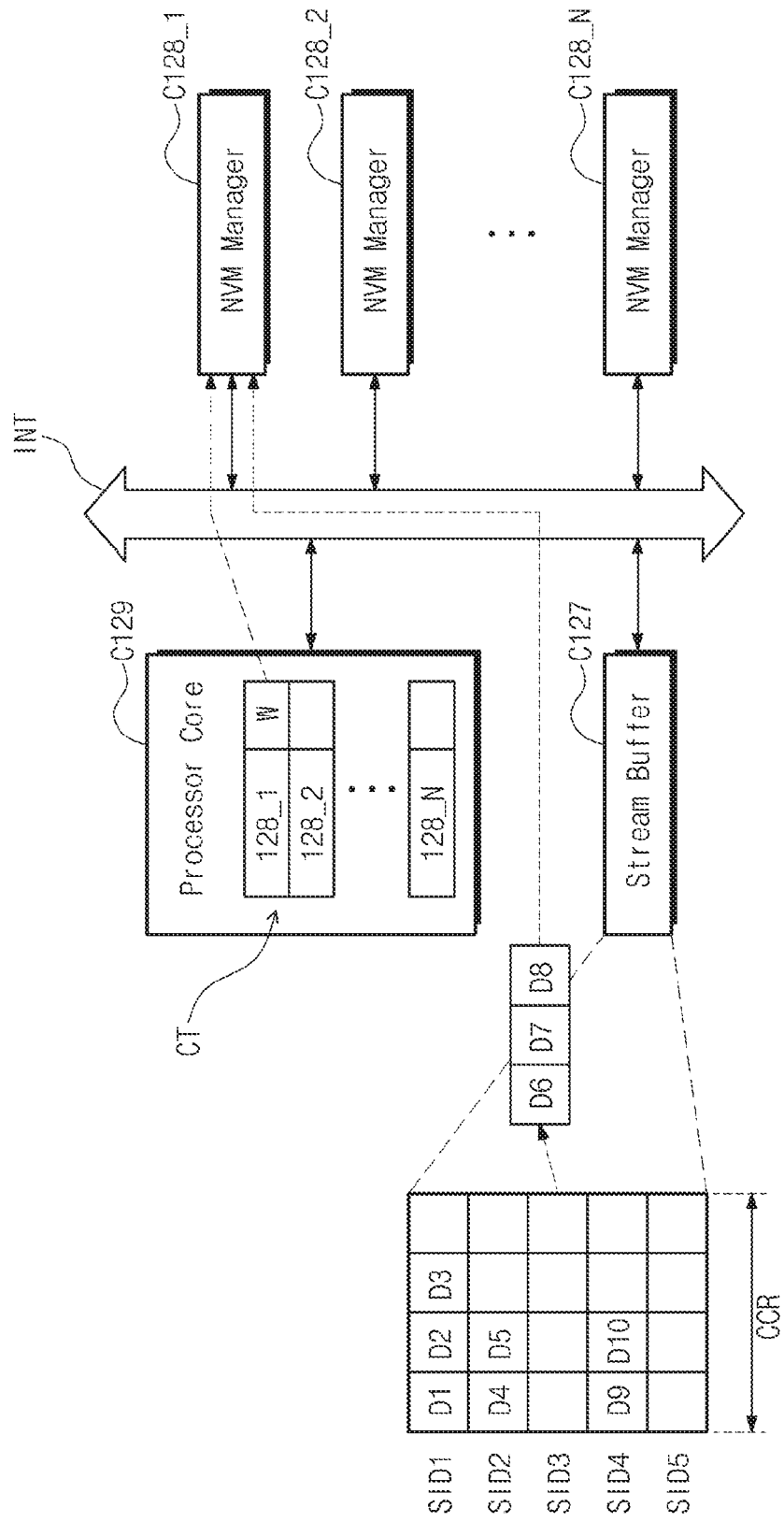

Referring to FIG. 55, the processor core C129 may cancel the read operation and may perform the flush operation. For example, a write operation W may be marked at the control table CT corresponding to the first nonvolatile memory manager C128_1. The sixth to eighth data D6 to D8 corresponding to the third stream identifier SID5 may be written at a nonvolatile memory selected from the nonvolatile memories C130 under control of the first nonvolatile memory manager C128_1. The free capacity of the stream buffer C127 may be secured as the sixth and eighth data D6 to D8 are flushed.

Figure 56:
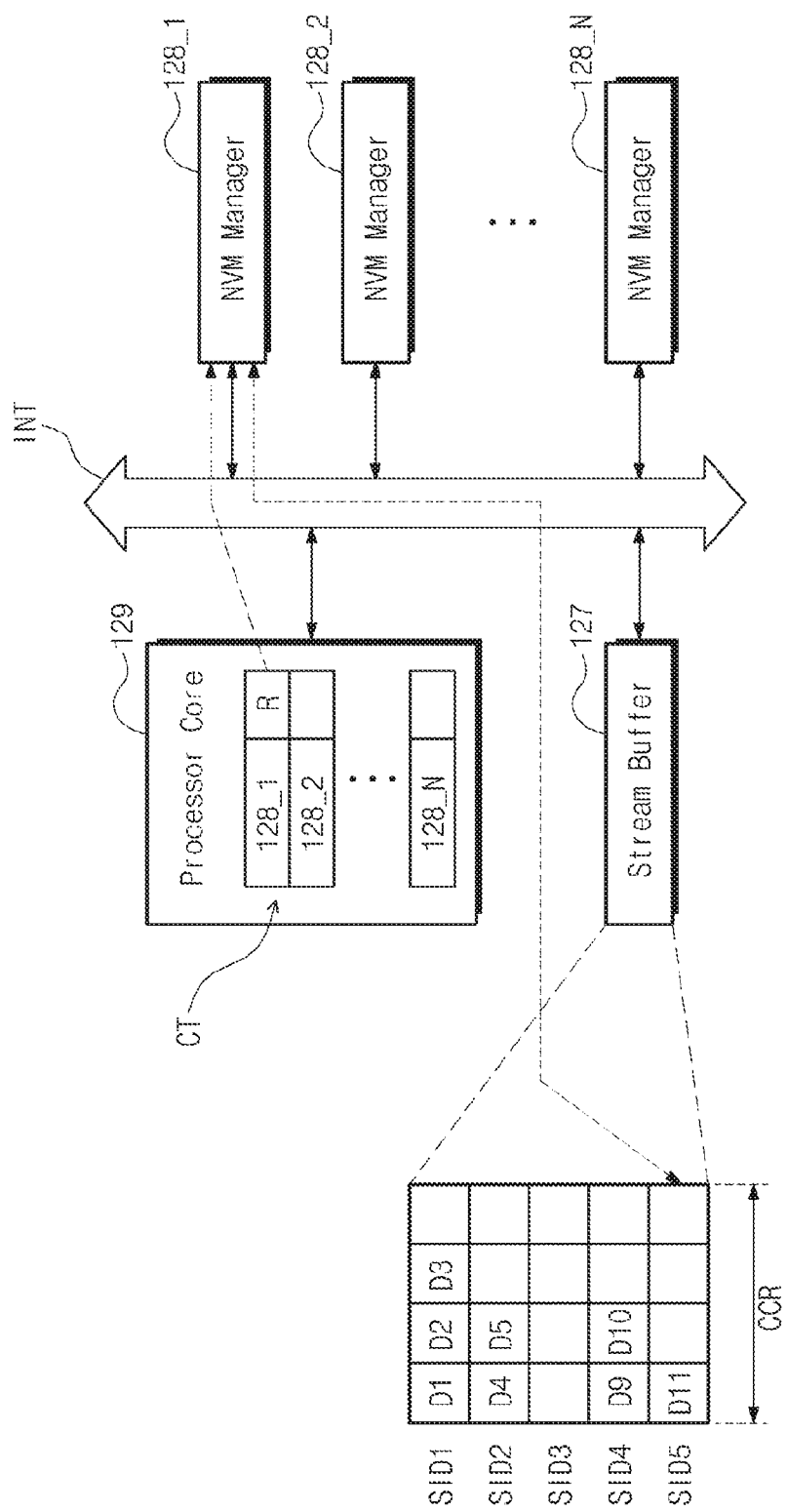

Referring to FIG. 56, as the free capacity of the stream buffer C127 is secured, the processor core C129 may again trigger the read operation. For example, a read operation R may be marked at the control table CT corresponding to the first nonvolatile memory manager C128_1. The first nonvolatile memory manager C128_1 may read eleventh data D11 from a nonvolatile memory selected from the nonvolatile memories C130. In example embodiments, the eleventh data D11 is illustrated as being included in a data group corresponding to the fifth stream identifier SID5. However, the eleventh data D11 is not limited as being included in a data group corresponding to the stream identifiers SID1 to SID5.

For example, the eleventh data D11 may be included in a read data group (not shown) of the stream buffer C127 as read data DATA_R to be outputted to the processor C1100 (refer to FIG. 49). In this case, the fifth stream identifier SID5 of FIG. 56 may be replaced with a pointer, an address, or an identifier indicating a read data group.

For example, the eleventh data D11 may be included in a temporary data group to be used when performing a background operation such as garbage collection, read reclaim, bad block management, or wear leveling. In this case, the fifth stream identifier SID5 of FIG. 56 may be replaced with a pointer, an address, or an identifier indicating a read data group.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to example embodiments, it will be apparent to those skilled in the art that various changes and modifications may be made without departing from the spirit and scope of the disclosure.

Therefore, it should be understood that the above embodiments are not limiting, but illustrative.

What is claimed is:

1. A nonvolatile memory system comprising:
   first and second nonvolatile memory devices; and
   a memory controller configured to control the first and second nonvolatile memory devices through one channel, wherein:
   during a program operation, the memory controller transmits first signals, for setting first page data up in the first nonvolatile memory device, to the first nonvolatile memory device through the channel,
   while the first nonvolatile memory device sets up the first page data in response to the first signals, the memory controller transmits second signals, for setting second page data up in the second nonvolatile memory device, to the second nonvolatile memory device,
   while the second nonvolatile memory device sets up the second page data in response to the second signals, the memory controller transmits third signals, for setting third page data up in the first nonvolatile memory device, to the first nonvolatile memory device,
   while the first nonvolatile memory device sets up the third page data in response to the third signals, the memory controller transmits fourth signals, for setting fourth page data up in the second nonvolatile memory device, to the second nonvolatile memory device, and
   while the second nonvolatile memory device sets up the fourth page data in response to the fourth signals, the memory controller transmits fifth signals, for setting fifth page data up in the first nonvolatile memory device, to the first nonvolatile memory device.

2. The nonvolatile memory system of claim 1, wherein:
   the memory controller transmits a first chip enable signal to the first nonvolatile memory device, a second chip enable signal to the second nonvolatile memory device, and data signals and control signals to the first and second nonvolatile memory devices,
   the first nonvolatile memory device transmits a first ready/busy signal to the memory controller, and
   the second nonvolatile memory device transmits a second ready/busy signal to the memory controller.

3. The nonvolatile memory system of claim 2, wherein the memory controller transmits the first signals to the first nonvolatile memory device by activating the first chip enable signal and transmits the second signals to the second nonvolatile memory device by activating the second chip enable signal.

4. The nonvolatile memory system of claim 2, wherein the first ready/busy signal remains at a busy state while the first nonvolatile memory device sets up the first page data in response to the first signals.

5. The nonvolatile memory system of claim 1, wherein the first signals comprise a first command set, a first address, and the first page data and the second signals comprises a second command set, a second address, and the second page data.

6. The nonvolatile memory system of claim 5, wherein:
   each of the first and second command sets comprises a program start command, a dump command, and a dump appointment command, and
   the first address and the second address indicate a physical location where the first page data is to be written and a physical location where the second page data is to be written, respectively.

7. The nonvolatile memory system of claim 1, wherein: after the first nonvolatile memory device sets up the fifth page data in response to the fifth signals, the memory controller transmits a program confirm command to the first nonvolatile memory device, and
   the first nonvolatile memory device performs a program operation of the first, third, and fifth page data in response to the program confirm command.

8. The nonvolatile memory system of claim 1, wherein:
   each of the first and second nonvolatile memory devices comprises a page buffer circuit, and
   each of the first and second nonvolatile memory devices sets the first and second page data up in the page buffer circuit.

9. The nonvolatile memory system of claim 1, wherein each of the first and second nonvolatile memory devices comprises a three-dimensional cell array.

10. A program method of a nonvolatile memory system which comprises first and second nonvolatile memory devices and a memory controller controlling the first and second nonvolatile memory devices through a channel, the method comprising:
    setting first page data up in the first nonvolatile memory device;
    setting second page data up in the second nonvolatile memory device;
    setting third page data up in the first nonvolatile memory device;
    setting fourth page data up in the second nonvolatile memory device;
    setting fifth page data up in the first nonvolatile memory device;
    performing a program operation of the first nonvolatile memory device after the fifth page data is set up in the first nonvolatile memory device;
    setting sixth page data up in the second nonvolatile memory device; and
    performing a program operation of the second nonvolatile memory device after the sixth page data is set up in the second nonvolatile memory device.

11. The method of claim 10, further comprising:
    transmitting a program confirm command to the first nonvolatile memory device after the setting of the fifth page data, wherein
    a first chip enable signal of the first nonvolatile memory device remains at an active state while the setting of the first page data, the setting of the third page data, the setting of the fifth page data, and the transmitting of the program confirm command are performed.

12. The method of claim 10, further comprising:
    transmitting a program confirm command to the second nonvolatile memory device after the setting of the sixth page data, wherein
    a second chip enable signal of the second nonvolatile memory device remains at an active state while the setting of the second page data, the setting of the fourth page data, the setting of the sixth page data, and the transmitting of the program confirm command are performed.

13. The method of claim 10, wherein a first ready/busy signal from the first nonvolatile memory device remains at a busy state during a time, when the setting of the first page data is performed.

14. The method of claim 10, wherein:
    the performing of the program operation of the first nonvolatile memory device comprises programming the first, third, and fifth page data at the first nonvolatile memory device, and the performing of the program operation of the second nonvolatile memory device comprises programming the second, fourth, and sixth data at the second nonvolatile memory device.

15. A nonvolatile memory system comprising:

first and second nonvolatile memory devices, the first nonvolatile memory device comprising a first memory cell array, a first control circuit, and a first page buffer and the second nonvolatile memory device comprising a second memory cell array, a second control circuit, and a second page buffer; and a memory controller that communicates through a communication channel:

first page data, a first address where the first page data is to be stored, and a first program command to the first control circuit of the first nonvolatile memory device, and second page data, a second address where the second page data is to be stored, and a second program command to the second control circuit of the second nonvolatile memory device while the first control circuit of the first nonvolatile memory device stores the first page data in the first page buffer, wherein the first nonvolatile memory device communicates a busy signal to the memory controller, while storing the first page data in the first page buffer, that precludes the memory controller from communicating additional page data to the first nonvolatile memory device, wherein the memory controller further communicates through the communication channel third page data, a third address where the third page data is to be stored, and a third program command to the first control circuit of the first nonvolatile memory device while the second control circuit of the second nonvolatile memory device stores the second page data in the second page buffer, and wherein the memory controller further communicates through the communication channel fourth page data, a fourth address where the fourth page data is to be stored, and a fourth program command to the second control circuit of the second nonvolatile memory device while the first control circuit of the first nonvolatile memory device programs the first and third page data, which are stored in the first page buffer, into the first memory cell array of the first nonvolatile memory device.

* * * * *